United States Patent
Saito et al.

(10) Patent No.: US 11,610,614 B2
(45) Date of Patent: Mar. 21, 2023

(54) MAGNETORESISTIVE ELEMENT, MAGNETIC MEMORY DEVICE, AND WRITING AND READING METHOD FOR MAGNETIC MEMORY DEVICE

(71) Applicant: TOHOKU UNIVERSITY, Miyagi (JP)

(72) Inventors: Yoshiaki Saito, Miyagi (JP); Shoji Ikeda, Miyagi (JP); Hideo Sato, Miyagi (JP); Tetsuo Endoh, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 6 days.

(21) Appl. No.: 17/047,316

(22) PCT Filed: Apr. 11, 2019

(86) PCT No.: PCT/JP2019/015858
§ 371 (c)(1),
(2) Date: Oct. 13, 2020

(87) PCT Pub. No.: WO2019/203132
PCT Pub. Date: Oct. 24, 2019

(65) Prior Publication Data
US 2021/0158849 A1    May 27, 2021

(30) Foreign Application Priority Data

Apr. 18, 2018  (JP) .............................. JP2018-080252

(51) Int. Cl.
*G11C 11/16* (2006.01)
*G11C 11/15* (2006.01)
(Continued)

(52) U.S. Cl.
CPC ............ *G11C 11/161* (2013.01); *G11C 11/15* (2013.01); *G11C 11/1673* (2013.01);
(Continued)

(58) Field of Classification Search
CPC ... G11C 11/161; G11C 11/15; G11C 11/1673; G11C 11/1675; G11C 11/18;
(Continued)

(56) References Cited

U.S. PATENT DOCUMENTS

2005/0219767 A1* 10/2005 Nakamura ............. H01L 43/08
2012/0154081 A1*  6/2012 Suzuki .................... H01F 41/34
                                                              427/131
(Continued)

FOREIGN PATENT DOCUMENTS

JP    2005520271 A    7/2005
JP    2014045196 A    3/2014
(Continued)

OTHER PUBLICATIONS

International Search Report issued in PCT/JP2019/015858 dated Jul. 2, 2019.

*Primary Examiner* — Tri M Hoang
(74) *Attorney, Agent, or Firm* — Fox Rothschild LLP; Robert J. Sacco; Carol E. Thorstadt-Forsyth

(57) ABSTRACT

Provided are a magnetoresistive element, a magnetic memory device, and a writing and reading method for a magnetic memory device, in which an aspect ratio of a junction portion can be decreased. A magnetoresistive element 1 of the invention, includes: a heavy metal layer 2 that is an epitaxial layer; and a junction portion 3 including a recording layer 31 that is provided on the heavy metal layer 2 and includes a ferromagnetic layer of an epitaxial layer magnetized in an in-plane direction, which is an epitaxial layer, a barrier layer 32 that is provided on the recording layer 31 and includes an insulating body, and a reference layer 33 that is provided on the barrier layer 32 and has magnetization fixed in the in-plane direction, in which the
(Continued)

recording layer 31 is subjected to magnetization reversal by applying a write current to the heavy metal layer 2.

21 Claims, 18 Drawing Sheets

(51) Int. Cl.
| | | |
|---|---|---|
| *G11C 11/18* | (2006.01) | |
| *H01L 43/04* | (2006.01) | |
| *H01L 43/08* | (2006.01) | |
| *H01L 43/10* | (2006.01) | |
| *H01L 27/22* | (2006.01) | |
| *H01F 10/32* | (2006.01) | |

(52) U.S. Cl.
CPC .......... *G11C 11/1675* (2013.01); *G11C 11/18* (2013.01); *H01F 10/3272* (2013.01); *H01F 10/3286* (2013.01); *H01L 27/228* (2013.01); *H01L 43/04* (2013.01); *H01L 43/08* (2013.01); *H01L 43/10* (2013.01)

(58) Field of Classification Search
CPC ............. H01F 10/3272; H01F 10/3286; H01L 27/228; H01L 43/04; H01L 43/08; H01L 43/10

See application file for complete search history.

(56) References Cited

U.S. PATENT DOCUMENTS

| | | | |
|---|---|---|---|
| 2014/0056060 A1* | 2/2014 | Khvalkovskiy | G11C 11/1675 365/158 |
| 2017/0077177 A1* | 3/2017 | Shimomura | H01L 27/11582 |
| 2018/0040358 A1* | 2/2018 | Noguchi | H01L 27/228 |
| 2018/0308535 A1* | 10/2018 | Shiokawa | H01L 43/02 |
| 2019/0147929 A1* | 5/2019 | Sasaki | H01L 27/222 365/158 |

FOREIGN PATENT DOCUMENTS

| | | |
|---|---|---|
| JP | 2017059679 A | 3/2017 |
| JP | 2018022545 A | 2/2018 |
| WO | 2009122995 A1 | 10/2009 |
| WO | 2010024201 A1 | 3/2010 |
| WO | 2016021468 A1 | 2/2016 |
| WO | 2017208880 A1 | 12/2017 |

\* cited by examiner

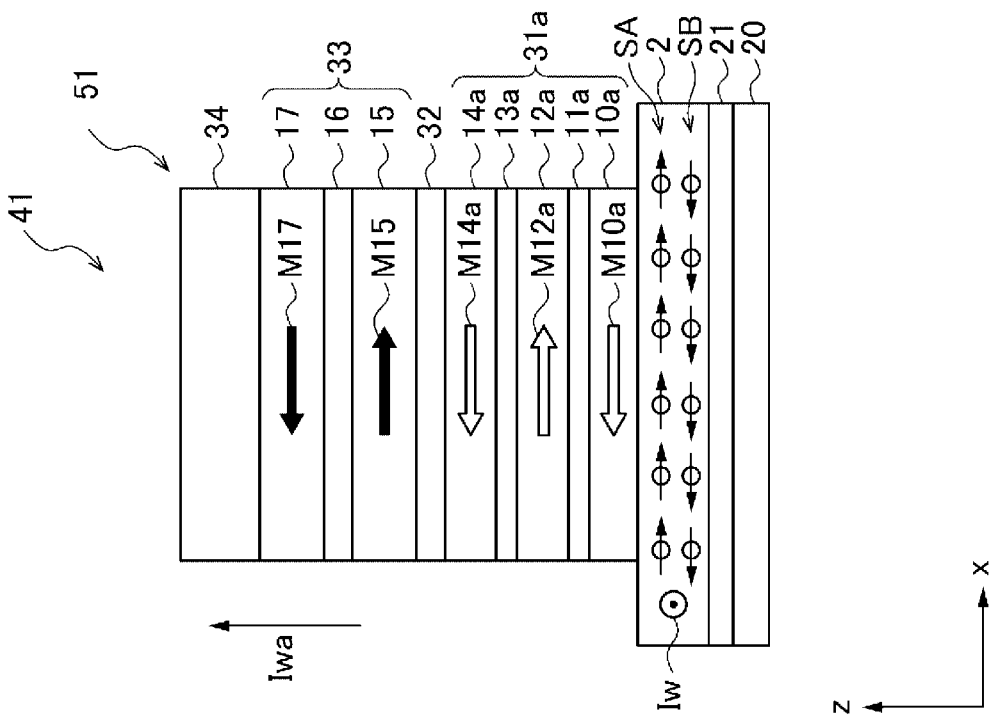

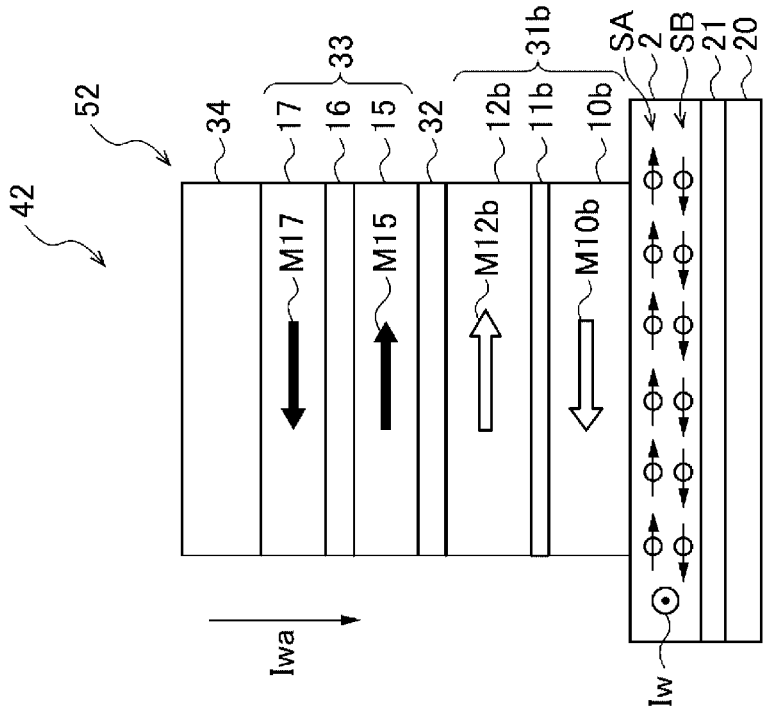
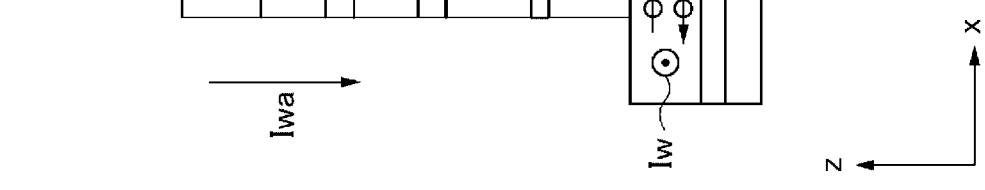
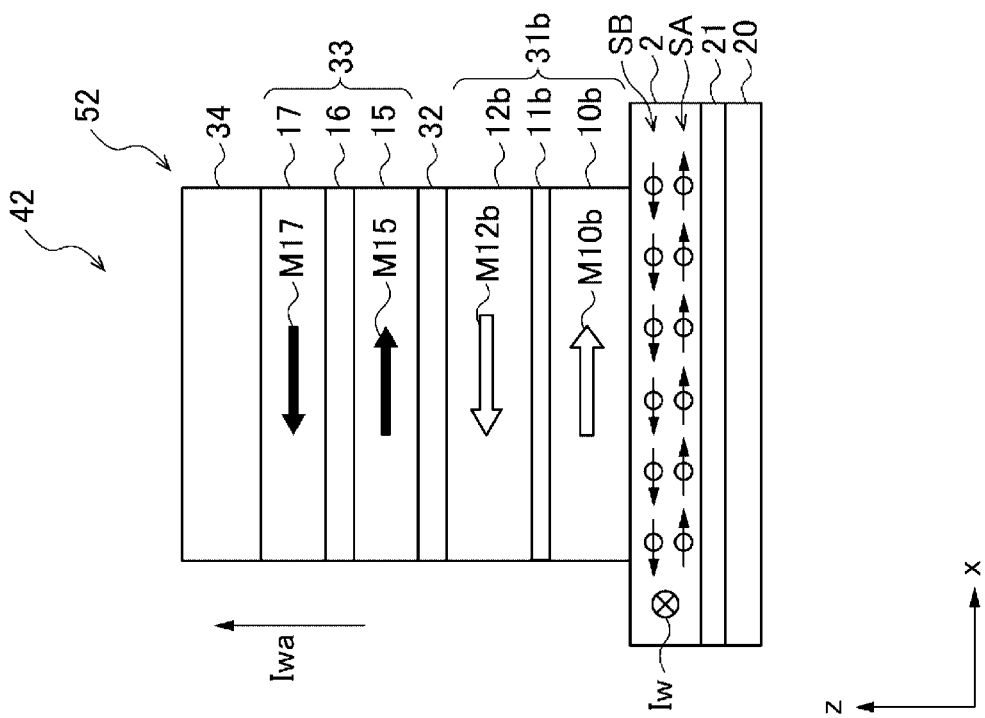

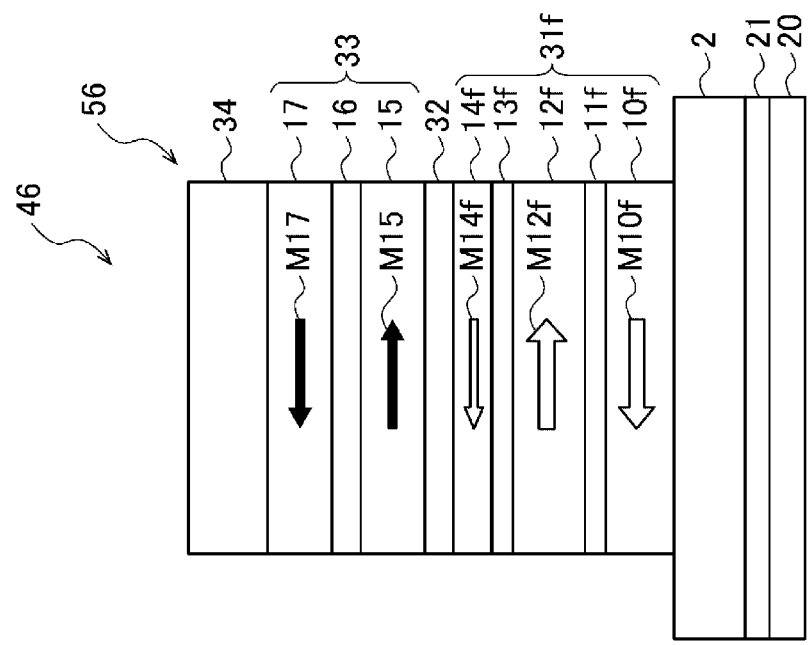
FIG. 7A
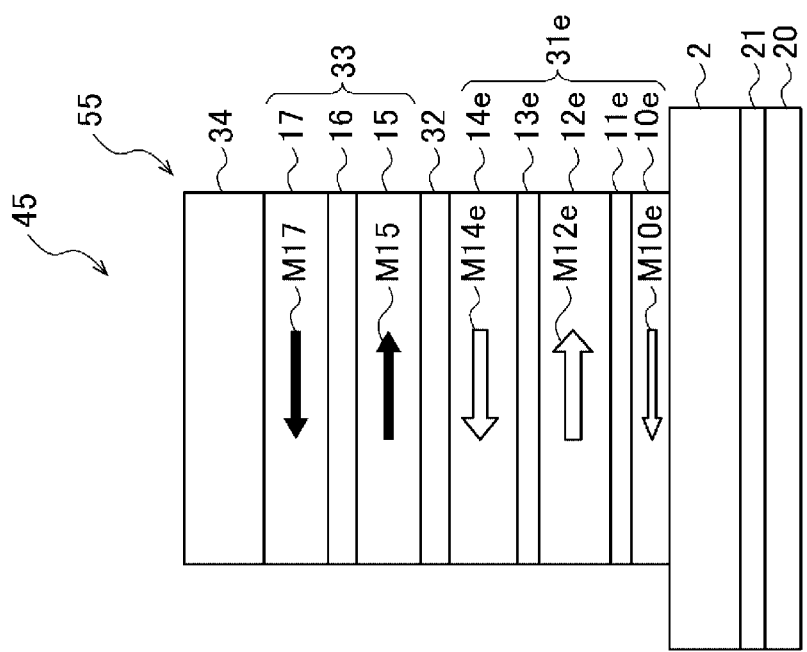
FIG. 7B

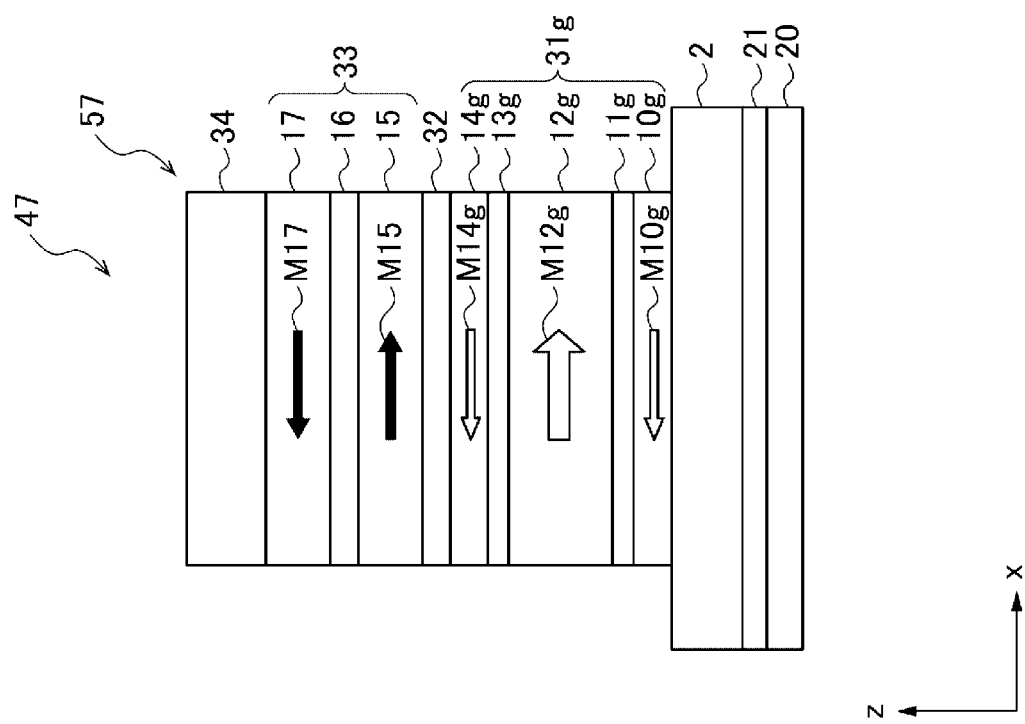

FIG. 17A
FIG. 17B
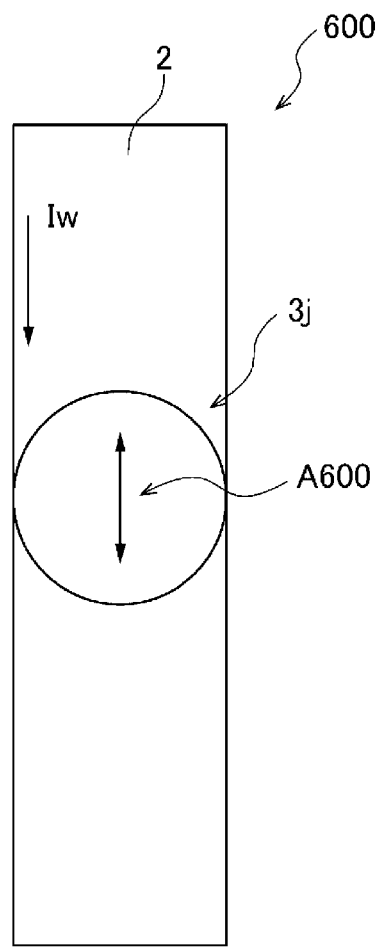
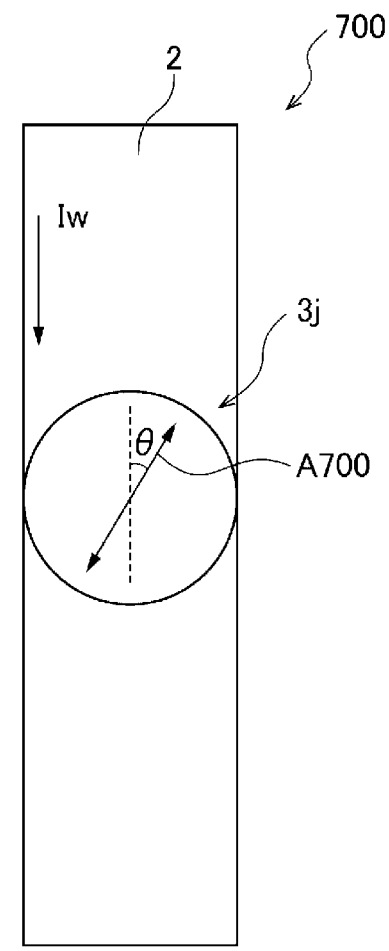

MAGNETORESISTIVE ELEMENT, MAGNETIC MEMORY DEVICE, AND WRITING AND READING METHOD FOR MAGNETIC MEMORY DEVICE

CROSS-REFERENCE TO RELATED APPLICATIONS

The present application is a U.S. National Phase of International Patent Application No. PCT/JP2019/015858, filed on Apr. 11, 2019, which claims the benefit and priority of Japanese Patent Application No. 2018-080252 filed on Apr. 18, 2018. The contents of the above applications are incorporated herein by reference in their entirety.

TECHNICAL FIELD

The present invention relates to a magnetoresistive element, a magnetic memory device, and a writing and reading method for a magnetic memory device.

BACKGROUND ART

A magnetic random access memory (MRAM) using a magnetoresistive element as a memory element has been known as a next-generation nonvolatile memory in which high-speed properties and high rewrite tolerance can be obtained. A spin-orbit torque magnetic random access memory (SOT-MRAM) element performing magnetization reversal with respect to a magnetic tunnel junction (MTJ) by using spin orbit torque has been gathering attention as a next-generation magnetoresistive element used in the MRAM (refer to Patent Literature 1).

The SOT-MRAM element has a configuration in which a junction portion having a three-layer structure of a ferromagnetic layer (also referred to as a recording layer)/an insulating layer (also referred to as a barrier layer)/a ferromagnetic layer (also referred to as a reference layer) is provided on a heavy metal layer. In the case of a Co—Fe type magnetic body that is currently used, the SOT-MRAM element has properties in which the resistance of the element is higher in an anti-parallel state in which a magnetization direction of the recording layer and a magnetization direction of the reference layer are antiparallel to each other than in a parallel state in which the magnetization direction of the recording layer and the magnetization direction of the reference layer are parallel to each other, and records data by allowing the parallel state and the anti-parallel state to correspond to 0 and 1. In the SOT-MRAM element, the magnetization direction of the reference layer is fixed, the recording layer is capable of being subjected to magnetization reversal, and the parallel state and the anti-parallel state can be switched by the magnetization reversal of the recording layer. In the SOT-MRAM element, a current is applied to the heavy metal layer, and thus, a spin current is induced by a spin orbit interaction, and a spin polarized by the spin current flows into the recording layer, and therefore, the recording layer is subjected to magnetization reversal, and the data is written. In addition, the recording layer is magnetized in an easy magnetization direction, and thus, even in a case where the spin does not flow into the recording layer, a state of magnetization is retained, and the data is stored in the SOT-MRAM element.

Examples of the SOT-MRAM element include an in-plane magnetization type SOT-MRAM element in which the recording layer and the reference layer are magnetized in an in-plane direction, and a perpendicular magnetization type SOT-MRAM element in which the recording layer and the reference layer are magnetized in a thickness direction (a perpendicular direction). In the in-plane magnetization type SOT-MRAM element, the magnetization direction is the in-plane direction, and thus, magnetization reversal is easily performed by the spin that flows into the recording layer, compared to a case where the magnetization direction is the perpendicular direction, and a write current can be decreased, compared to the perpendicular magnetization type SOT-MRAM element. For this reason, the in-plane magnetization type SOT-MRAM element has particularly attracted attention as the magnetoresistive element used in the MRAM.

CITATION LIST

Patent Literature

Patent Literature 1: WO 2016/021468

SUMMARY OF INVENTION

Technical Problem

In a SOT-MRAM element using an in-plane magnetization type MTJ, the junction portion is formed into an elongated shape having a high aspect ratio, such as an elliptical shape or a rectangular shape to generate magnetic shape anisotropy in the recording layer, sets a long axis direction of the recording layer to be the easy magnetization direction, and sets the magnetization direction of the recording layer to be the in-plane direction. As described above, in the in-plane magnetization type SOT-MRAM element, the junction portion is formed into a shape having an aspect ratio of approximately 2 to 3, and thus, the magnetic shape anisotropy is generated in the in-plane direction, and the magnetization direction is set to the in-plane direction. For this reason, in the in-plane magnetization type SOT-MRAM element, in the case of decrease the aspect ratio of the junction portion in order to increase the capacity of the memory, magnetic anisotropy decreases, thermal stability is degraded, and properties as the nonvolatile memory are degraded, and thus, it is difficult to decrease the aspect ratio of the junction portion.

Therefore, the invention has been made in consideration of the problems described above, and an object thereof is to provide a magnetoresistive element, a magnetic memory device, and a writing and reading method for a magnetic memory device, in which an aspect ratio of a junction portion can be decreased.

Solution to Problem

A magnetoresistive element according to the invention, includes: a heavy metal layer that is an epitaxial layer; and a junction portion including a recording layer that is provided on the heavy metal layer and includes a ferromagnetic layer magnetized in an in-plane direction, which is an epitaxial layer, a barrier layer that is provided on the recording layer and includes an insulating body, and a reference layer that is provided on the barrier layer and has magnetization fixed in the in-plane direction, in which the recording layer is subjected to magnetization reversal by applying a write current to the heavy metal layer.

A magnetoresistive element according to the invention, includes: a heavy metal layer; and a junction portion including a recording layer that is provided on the heavy metal layer, a barrier layer that is provided on the recording layer and includes an insulating body, and a reference layer that is provided on the barrier layer and has magnetization fixed in an in-plane direction, in which the recording layer is a stacked film including a ferromagnetic layer that is an epitaxial layer, in which a ferromagnetic layer and a non-magnetic layer are alternately stacked, and is a ferromagnetic layer in which a layer closest to the heavy metal layer side and a layer closest to the barrier layer side are magnetized in the in-plane direction, and the recording layer is subjected to magnetization reversal by applying a write current to the heavy metal layer.

A magnetoresistive element according to the invention, includes: a heavy metal layer; and a junction portion including a recording layer that is provided on the heavy metal layer, a barrier layer that is provided on the recording layer and includes an insulating body, and a reference layer that is provided on the barrier layer and has magnetization fixed in an in-plane direction, in which the recording layer is a stacked film in which a ferromagnetic layer and a non-magnetic layer are alternately stacked, and a layer closest to the heavy metal layer side and a layer closest to the barrier layer side are a ferromagnetic layer, the ferromagnetic layer is magnetized in the in-plane direction, at least one of the layer closest to the heavy metal layer side and the layer closest to the barrier layer side of the recording layer is thinner than the other ferromagnetic layer of the recording layer, and the recording layer is subjected to magnetization reversal by applying a write current to the heavy metal layer.

A magnetic memory device according to the invention, includes: the magnetoresistive element according to any one of claims 1 to 22.

A magnetic memory device according to the invention, includes: a magnetoresistive element array including a plurality of magnetoresistive elements that include a junction portion including a heavy metal layer, a recording layer that is provided on the heavy metal layer and is capable of being subjected to magnetization reversal, a barrier layer that is provided on the recording layer, and a reference layer that is provided on the barrier layer and has a fixed magnetization direction, in which the heavy metal layer of one magnetoresistive element is stretched in a first direction, the stretched heavy metal layer is shared by the plurality of other magnetoresistive elements, and the junction portion is arranged in the first direction, on the heavy metal layer; and a difference amplifier outputting a voltage according to a resistance difference between two junction portions selected from the magnetoresistive element array.

A magnetic memory device according to the invention, which includes a magnetoresistive element array including a plurality of junction portions including a recording layer capable of being subjected to magnetization reversal, a barrier layer, and a reference layer having a fixed magnetization direction, on a heavy metal layer stretched in a first direction, in which the junction portions are arranged in the first direction, and stores data in accordance with a resistance value of the junction portion, includes: a difference amplifier to which two junction portions selected from the plurality of junction portions are connected, in which in the magnetoresistive element array, in a case where a reset current is applied between one end portion and the other end portion of the heavy metal layer, a magnetization direction of the recording layer of each of the junction portions is aligned in a predetermined direction, in a case where a write current is applied between the one end portion and the other end portion of the heavy metal layer, in a state in which the magnetization direction of the recording layer is aligned in the predetermined direction, and a write auxiliary current is applied from the reference layer of one junction portion to the reference layer of the other junction portion through the heavy metal layer, one recording layer of two junction portions to which the write auxiliary current is applied is subjected to magnetization reversal, the difference amplifier outputs a voltage based on a difference between a current to be applied to the one junction portion and a current to be applied to the other junction portion, and data stored in the one junction portion and the other junction portion is read on the basis of an output voltage of the difference amplifier.

Writing and reading methods for a magnetic memory device according to the invention, which include a magnetoresistive element array including a plurality of junction portions including a recording layer capable of being subjected to magnetization reversal, a barrier layer, and a reference layer having a fixed magnetization direction, on a heavy metal layer stretched in a first direction, in which the junction portions are arranged in the first direction, and stores data in accordance with a resistance value of the junction portion, includes: a reset step of applying a reset current to the heavy metal layer and of aligning a magnetization direction of the recording layer of each of the junction portions in a predetermined direction; a write step of applying a write current to the heavy metal layer and of applying a write auxiliary current from the reference layer of one junction portion to the reference layer of the other junction portion through the heavy metal layer; and a read step of reading data stored in the one junction portion and the other junction portion, on the basis of a difference between a current to be applied to the one junction portion and a current to be applied to the other junction portion.

Advantageous Effects of Invention

According to the invention, a recording layer includes a ferromagnetic layer that is an epitaxial layer, and thus, a magnetization direction becomes an in-plane direction by magnetic crystalline anisotropy as in-plane magnetic anisotropy, and therefore, it is not necessary that the magnetization direction is set to the in-plane direction by magnetic shape anisotropy, and it is also possible to prevent thermal stability from being degraded due to a decrease in magnetic anisotropy, and to decrease an aspect ratio of a junction portion.

BRIEF DESCRIPTION OF DRAWINGS

FIG. 3A is a schematic sectional view illustrating that a recording layer and a reference layer of a magnetoresistive element of a second embodiment are in an anti-parallel state, and FIG. 3B is a schematic sectional view illustrating that the recording layer and the reference layer of the magnetoresistive element of the second embodiment are in a parallel state.

FIG. 4A is a schematic sectional view illustrating that the recording layer and the reference layer of the magnetoresistive element of the second embodiment are in the antiparallel state, and FIG. 4B is a schematic sectional view illustrating that the recording layer and the reference layer of the magnetoresistive element of the second embodiment are in the parallel state.

FIG. 7A is a schematic sectional view of a magnetoresistive element including a recording layer in which a ferromagnetic layer closest to a heavy metal layer side is thinner than other ferromagnetic layers, and FIG. 7B is a schematic sectional view of a magnetoresistive element including a recording layer in which a ferromagnetic layer closest to a barrier layer side is thinner than other ferromagnetic layers.

FIG. 7C is a schematic sectional view of a magnetoresistive element including a recording layer in which a ferromagnetic layer closest to a heavy metal layer side and a ferromagnetic layer closest to a barrier layer side are thinner than other ferromagnetic layers.

FIG. 17A is a top view of a magnetoresistive element of another embodiment of the invention, and FIG. 17B is a top view of a magnetoresistive element of another embodiment of the invention.

DESCRIPTION OF EMBODIMENTS (1) Magnetoresistive Element of First Embodiment of Invention Hereinafter, a magnetoresistive element 1 of a first embodiment will be described with reference to FIG. 1A, FIG. 2A, and FIG. 2B. FIG. 1A is a top view of the magnetoresistive element 1, and FIGS. 2A and 2B are A-A' sectional views when the magnetoresistive element 1 is cut along A-A' of FIG. 1A. Herein, as illustrated in FIG. 1A, a transverse direction of a heavy metal layer 2 is set to an x direction (the right side of the paper is set to a +x direction), a longitudinal direction is set to a y direction (in the top view, the upper side of the paper is set to a +y direction, and in the sectional view, the deep side of the paper is set to the +y direction), and a direction perpendicular to the surface of the heavy metal layer 2 is set to a z direction (in the sectional view, the upper side of the paper is set to a +z direction).

As illustrated in FIG. 1A, the magnetoresistive element 1 includes the heavy metal layer 2 and a magnetic tunnel junction portion 3 (hereinafter, simply referred to as a junction portion 3) including a recording layer, a barrier layer, and a reference layer. The heavy metal layer 2 has a rectangular parallelopiped shape that is stretched in a first direction (in this embodiment, the y direction), and has a rectangular shape when seen from an upper surface. The thickness of the heavy metal layer 2 is 0.5 nm to 20 nm, and is desirably 1 nm to 10 nm. The width of the heavy metal layer 2 in the x direction is 10 nm to 150 nm, and desirably, and it is preferable that the width of the heavy metal layer 2 is the same length as that of the width of the junction portion 3, and thus, a write efficiency is maximized. In this embodiment, the width of the heavy metal layer 2 in the x direction is set to be larger than the width of the junction portion 3. In addition, for example, as with the magnetoresistive element 1b illustrated in FIG. 1B, the width of the heavy metal layer 2 in the x direction may be identical to the width of the junction portion 3. The length of the heavy metal layer 2 in the y direction is 15 nm to 260 nm, and it is preferable that a current flow is minimized, and thus, it is possible to increase the density of the memory. The length of the heavy metal layer 2 in the longitudinal direction is a desired length at the time of providing one junction portion 3 on the heavy metal layer 2, and in a case where a plurality of junction portions 3 are disposed on one heavy metal layer 2, the length is not limited thereto. A heavy metal having a large spin orbit interaction, for example, Hf, Ta, W, Re, Os, Ir, Pt, Au, Pb, or an alloy containing such elements is desirable as the heavy metal layer 2. For example, W—Hf, W—Ta, Pt—Au, Pt—Ir, and the like are particularly desirable as the alloy. Further, the heavy metal layer 2 contains an alloy such as Pd—Rh. The heavy metal layer 2 is an epitaxial layer having high orientation and has conductivity. In this embodiment, in the heavy metal layer 2, a write current Iw for causing the magnetization reversal of the recording layer of the junction portion 3 is applied between one end portion and the other end portion of the heavy metal layer 2 in the first direction. That is, the write current Iw is applied in the same direction as the first direction, along the longitudinal direction of the heavy metal layer 2. Herein, the epitaxial layer indicates a layer or a thin film that is formed by epitaxial growth, and for example, includes a monocrystalline layer, a layer that generally contains monocrystals but partially contains polycrystals, a layer that dominantly contains monocrystals, and thus, can be regarded as a monocrystalline layer practically.

The heavy metal layer 2 is formed on a base layer including an epitaxial layer on the surface. In this embodiment, the base layer is a two-layer film including an amorphous metal layer 20 and an MgO layer 21 that is an epitaxial layer, and the heavy metal layer 2 is formed on the MgO layer 21 by epitaxial growth. The amorphous metal layer 20, for example, is an amorphous layer containing a metal including B such as Co—Fe—B, Fe—B, or Ta—B. The MgO layer 21 is an MgO layer having excellent crystallinity, which is oriented in a (100) direction, and in a case where MgO is stacked on an amorphous metal layer, the MgO layer 21 is formed by using properties in which an MgO layer that dominantly contains monocrystals oriented in the (100) direction is formed. As described above, the base layer of this embodiment is prepared by accumulating MgO on the amorphous metal layer 20 such that the MgO layer 21 that is an epitaxial layer is formed. The heavy metal layer 2, for example, is formed on the MgO layer 21 that is an epitaxial layer by epitaxial growth, in accordance with a general film formation method such as physical vapor deposition (PVD), and thus, becomes an epitaxial layer. Note that, the base layer including the epitaxial layer on the surface may be a monocrystalline substrate, or may be formed by laminating an epitaxial layer in which an epitaxial layer on a base material such as an amorphous layer is separately formed by a reverse engineering technology of a substrate used in a CMOS sensor or the like. In addition, in the heavy metal layer 2, the heavy metal layer 2 may be formed by laminating a heavy metal layer that is an epitaxial layer on various base materials. Note that, a crystalline structure of the heavy metal layer 2 is different in accordance with a material configuring the heavy metal layer 2, and in the case of W—Hf or W—Ta, the crystalline structure is a bcc structure or a β structure, and in the case of Pt—Au, Pt—Ir, or Pd—Rh, the crystalline structure is an fcc structure.

Figure 1A:
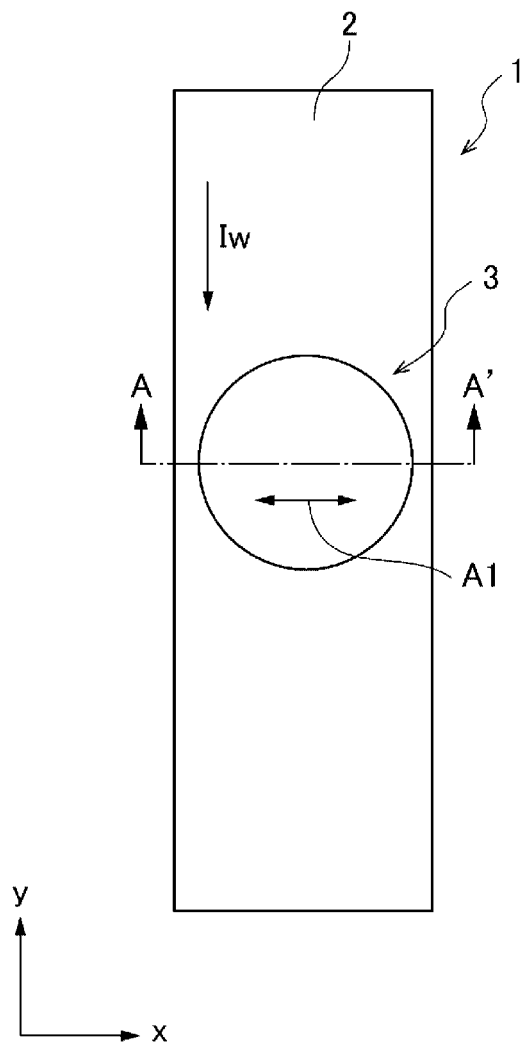
FIG. 1A is a top view of a magnetoresistive element of a first embodiment of the invention.
Figure 1B:
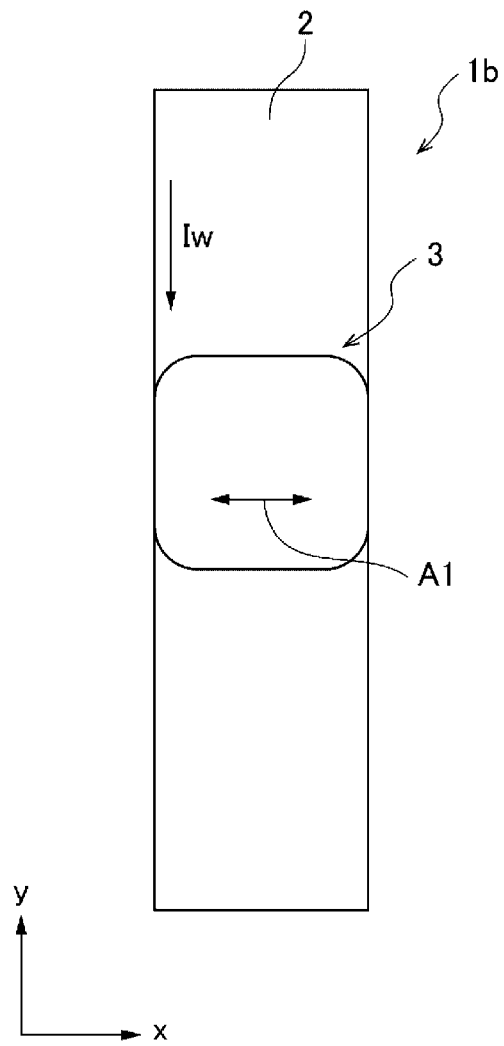
FIG. 1B is a top view of another embodiment relevant to the magnetoresistive element of the first embodiment of the invention.

The junction portion 3 is provided on the epitaxially grown heavy metal layer 2 such that an easy magnetization direction of the recording layer (an arrow A1 illustrated in FIG. 1A) is approximately perpendicular to the longitudinal direction of the heavy metal layer 2 (the y direction) and the plane of the heavy metal layer 2. For this reason, the write current Iw is applied between one end portion and the other end portion of the heavy metal layer 2 in a direction that is approximately orthogonal to a magnetization direction of the recording layer. The junction portion 3 when seen from the upper surface is formed into a columnar shape, and is in a circular shape. For this reason, an aspect ratio of the junction portion 3 is approximately 1. Herein, the aspect ratio of the junction portion 3 indicates an aspect ratio of the shape of the junction portion 3 seen from the upper surface, in a case where the junction portion 3 when seen from the upper surface (or a sectional surface in a width direction) has a shape in which a long axis and a short axis are not distinguished, such as a tetragonal shape or a circular shape, the aspect ratio is 1, in a case where the junction portion 3 has a quadrilateral shape, the aspect ratio is a ratio between the length of a long side and the length of a short side, and in a case where the junction portion 3 has an elliptical shape, the aspect ratio is a ratio between the length of the long axis and the length of the short axis. As described below, a recording layer 31 of the junction portion 3 includes a ferromagnetic layer that is an epitaxial layer, and thus, a magnetization direction of the recording layer 31 can be an in-plane direction by magnetic crystalline anisotropy, and the aspect ratio of the junction portion 3 can be approximately 1 to 1.5. The aspect ratio is desirably 1 to 1.5, and is more desirably 1 to 1.3. As described above, it is possible to prepare a magnetic memory device in which a magnetoresistive element is disposed with a high density, compared to the related art. In a case where the aspect ratio of the junction portion 3 is 1 to 1.5, the shape of the junction portion 3 is not particularly limited, and may be a cubical shape, a rectangular parallelepiped shape, an elliptical columnar shape, or the like. For example, as with a magnetoresistive element 1b illustrated in FIG. 1B, the junction portion 3 may have a quadrangular columnar shape of which a corner portion is rounded. Such a junction portion 3 when seen from the upper surface has a shape in which four corners of a tetragon are rounded to be curved.

In the junction portion 3, it is desirable that the length of the short side or the length of the short axis (in a case where the aspect ratio is 1, the length of one side or the diameter) is 10 nm to 100 nm, and in this range, it is possible to increase capacity as the value decreases. In addition, in this embodiment, each layer of the junction portion 3 is stacked on the heavy metal layer 2 by epitaxial growth, and then, the junction portion 3 is molded into a columnar shape by using a photolithography technology. For this reason, each layer of the junction portion 3 is an epitaxial layer.

Figure 2A:
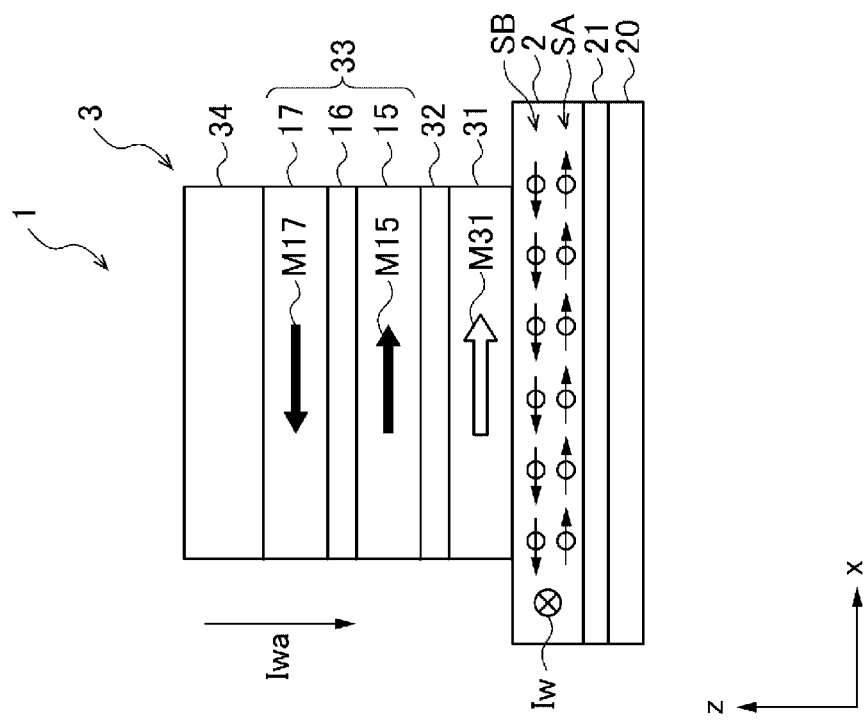
FIG. 2A is an A-A' sectional view when the magnetoresistive element is cut along A-A' of FIG. 1A and illustrates that a recording layer and a reference layer of the magnetoresistive element of the first embodiment are in an anti-parallel state.

As illustrated in FIG. 2A, the junction portion 3 includes the recording layer 31, a barrier layer 32, a reference layer 33, and an antiferromagnetic layer 34. For example, an alloy containing at least one or more of Co, Fe, Ni, and Mn is desirable as the recording layer 31. In the detailed description, an alloy such as Co—Pt, Co—Pd, Co—Cr—Pt, and Co—Cr—Ta—Pt is desirable as an alloy containing Co, and in particular, it is desirable that such an alloy is so-called Co-rich in which more Co is contained than in the other elements. An alloy such as Fe—Pt and Fe—Pd is desirable as an alloy containing Fe, and in particular, it is desirable that such an alloy is so-called Fe-rich in which more Fe is contained than in the other elements. An alloy such as Co—Fe, Co—Fe—Pt, and Co—Fe—Pd is desirable as an alloy containing Co and Fe. The alloy containing Co and Fe may be Co-rich or may be Fe-rich. An alloy such as Mn—Ga and Mn—Ge is desirable as an alloy containing Mn. In addition, an element such as B, C, N, O, P, Al, and Si may be slightly contained in the alloy containing at least one or more of Co, Fe, Ni, and Mn, described above. Note that, the recording layer 31 may be a stacked film of a ferromagnetic layer containing the material described above and a non-magnetic layer including a non-magnetic body such as Ta, W, Mo, Pt, Pd, Ru, Rh, Ir, Cr, Au, Cu, Os, and Re. In this embodiment, the recording layer 31 includes one ferromagnetic layer, but the recording layer 31, for example, may be a stacked film of a ferromagnetic layer that is an epitaxial layer and a non-magnetic layer, such as a three-layer structure of a ferromagnetic layer, a non-magnetic layer, and a ferromagnetic layer, and a five-layer structure of a ferromagnetic layer, a non-magnetic layer, a ferromagnetic layer, a non-magnetic layer, and a ferromagnetic layer. The non-magnetic layer may be an epitaxial layer or may be an amorphous layer, and is capable of containing the same material as that of a first non-magnetic layer 11a described below. Note that, the amorphous layer indicates an amorphous layer or a thin film, and includes a layer partially having crystallinity in a case where amorphousness is dominant.

The recording layer 31 may include a non-magnetic layer of 1 nm of less, which contains Ta, W, Mo, or a non-magnetic alloy containing at least one or more of such elements, and an amorphous ferromagnetic layer (approximately 0.6 nm to 2.0 nm) including a ferromagnetic body such as Co—Fe—B, Fe—B, and Co—B, on a ferromagnetic layer in this order. As described above, the barrier layer 32 containing MgO (100) is epitaxially grown on the amorphous ferromagnetic body, and thus, in-plane homogeneity of the orientation of MgO (100) can be improved, and the homogeneity of a resistance change rate (an MR change rate) can be improved. Then, the magnetization of the amorphous ferromagnetic layer is ferromagnetically bonded to the magnetization of the ferromagnetic layer facing the amorphous ferromagnetic layer through the non-magnetic layer by an interlayer interaction, and the magnetization is directed to the in-plane direction. The amorphous ferromagnetic layer indicates an amorphous layer or a thin film including a ferromagnetic body, and includes a layer partially having crystallinity in a case where amorphousness is dominant.

The recording layer 31 is stacked on the heavy metal layer 2 that is an epitaxial layer by epitaxial growth, and thus, the recording layer 31 is in contact with the heavy metal layer 2 and is an epitaxial layer. A crystalline structure of the recording layer 31 is different in accordance with a material configuring the recording layer 31. Further, in the recording layer 31, distortion occurs in crystals due to mismatch between a lattice constant of the material configuring the recording layer 31 and a lattice constant of the material configuring the heavy metal layer 2, or the like. For this reason, in a case where the recording layer 31 containing a material having a bcc structure is epitaxially grown in a bulk, the bcc structure becomes a distorted bct structure, and in a case where the recording layer 31 containing a material having a fcc structure is epitaxially grown in a bulk, the fcc structure becomes a distorted fct structure. For example, in Co—Fe, the bct structure and the fct structure can be obtained in accordance with the type of base and a composition ratio. Then, the magnetic crystalline anisotropy as in-plane magnetic anisotropy occurs in the recording layer 31 by the distortion in the crystals, an easy axis of magnetization is generated in the plane of the recording layer 31, and a direction along the easy axis of magnetization becomes the easy magnetization direction. In the recording layer 31, the magnetic crystalline anisotropy that occurs as described above is dominant. In a state in which an external magnetic field, spin torque, or the like of saturation magnetization or more is not applied, magnetization M31 of the recording layer 31 is generally directed to the easy magnetization direction, and magnetization is performed in the in-plane direction. For this reason, a state of magnetization of the recording layer 31 is retained, and data recorded in the recording layer 31 is retained.

Figure 2B:
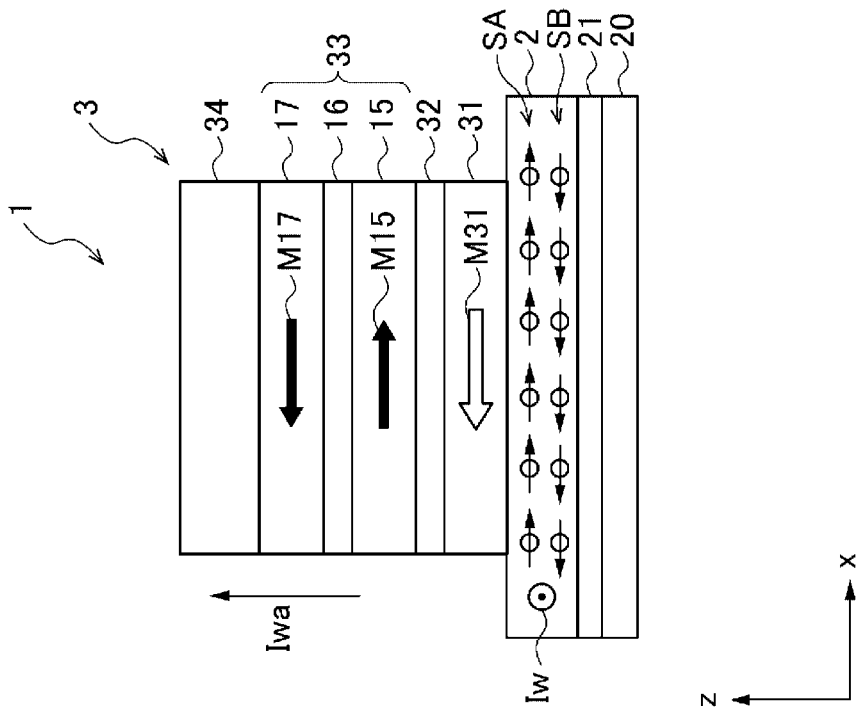
FIG. 2B is the same sectional view as that of FIG. 2A and illustrates that the recording layer and the reference layer of the magnetoresistive element of first embodiment are in a parallel state.

In this embodiment, the junction portion 3 is provided on the heavy metal layer 2 such that the easy magnetization direction of the recording layer 31 is approximately perpendicular to the longitudinal direction of the heavy metal layer 2 (the y direction), and thus, the magnetization M31 of the recording layer 31 is directed to the +x direction or a −x direction. In FIG. 2A and FIG. 2B, the magnetization M31 of the recording layer 31 is illustrated by a void arrow, and a direction illustrated by the arrow indicates the magnetization direction. Note that, in FIG. 2A and FIG. 2B, the magnetization of each layer is illustrated by the arrow, for the sake of convenience, but in practice, a component that is not directed to the magnetization direction is also contained in each layer. Hereinafter, in the drawings, the same applies to a case where the magnetization is illustrated by the arrow.

As described above, in the magnetoresistive element 1, the recording layer 31 has the easy magnetization direction by the magnetic crystalline anisotropy, and thus, it is not necessary that the recording layer 31 has the magnetic shape anisotropy, and it is not necessary that the junction portion 3 has an elongated shape having a large aspect ratio, and therefore, it is possible to decrease the aspect ratio. In addition, in a case where the recording layer 31 is magnetized in the in-plane direction by the magnetic shape anisotropy, when the aspect ratio is decreased, the magnetic anisotropy decreases, and thermal stability is degraded, but the recording layer 31 has the magnetic crystalline anisotropy, and thus, even in a case where the aspect ratio is decreased, the magnetic anisotropy becomes sufficient by the magnetic crystalline anisotropy, and the thermal stability can also be prevented from being degraded. Note that, it is desirable that the thickness of the recording layer 31 is approximately 1.0 nm to 20 nm.

The barrier layer 32, for example, is an insulating layer that is an insulating body such as MgO, $Al_2O_3$, AlN, and MgAlO, and is formed on the recording layer 31. The barrier layer 32, for example, is formed such that the thickness is 0.1 nm to 5 nm, and is desirably 0.5 nm to 2 nm. Note that, in the recording layer 31, the magnetization direction may be a perpendicular direction by an interface anisotropy effect on the interface between the recording layer 31 and the barrier layer 32, in accordance with a combination of the material and the thickness of the recording layer 31 and the barrier layer 32, and thus, it is particularly desirable that the recording layer 31 is formed to have a thickness in which the magnetization M31 can be prevented from being directed to the perpendicular direction by the interface anisotropy effect in a relationship between the recording layer 31 and the barrier layer 32. For example, in a case where the barrier layer 32 contains MgO, and the surface of the recording layer 31 contains Co—Fe—B, it is desirable that the recording layer 31 is thicker than 1.4 nm.

In this embodiment, the barrier layer 32 is formed on the recording layer 31 that is an epitaxial layer by epitaxial growth, and thus, the barrier layer 32 is also an epitaxial layer. Then, the heavy metal layer 2 and the recording layer 31 are formed on the MgO layer 21 oriented in (100) by epitaxial growth, and thus, the barrier layer 32 is an epitaxial layer of MgO oriented in (100). Note that, as described above, in the formation of an MgO (100) film configuring the barrier layer 32, a non-magnetic layer containing Ta, W, Mo, or a non-magnetic alloy containing at least one or more of such elements and an amorphous ferromagnetic layer containing Co—Fe—B, Fe—B, Co—B, or the like are formed on the recording layer 31 that is an epitaxial layer, and then, are grown, and thus, the MgO (100) film can also be formed.

The reference layer 33 is a three-layer stacked film in which a ferromagnetic layer 15, a non-magnetic layer 16, and a ferromagnetic layer 17 are stacked on the barrier layer 32 in this order, and has a three-layer stacked ferri structure. The stacked ferri structure indicates a structure in which a ferromagnetic layer and a non-magnetic layer are alternately stacked, and the ferromagnetic layers facing each other through the non-magnetic layer are antiferromagnetically bonded by an interlayer interaction such that magnetization directions are antiparallel to each other. For this reason, the direction of magnetization M15 of the ferromagnetic layer and the direction of magnetization M17 of the ferromagnetic layer 17 are antiparallel to each other. Herein, in a case where the magnetization directions are antiparallel to each other, the magnetization directions are different by approximately 180 degrees.

The ferromagnetic layer 15 and the ferromagnetic layer 17 are capable of containing the same material as that of the recording layer 31, and the non-magnetic layer 16 is capable of containing Ir, Rh, Ru, Os, Re, or a non-magnetic alloy containing at least one or more of such elements. The non-magnetic layer 16 is formed to have a thickness of approximately 0.5 nm to 1.0 nm in the case of Ru, of approximately 0.5 nm to 0.8 nm in the case of Ir, of approximately 0.7 nm to 1.0 nm in the case of Rh, of approximately 0.75 nm to 1.2 nm in the case of Os, and of approximately 0.5 nm to 0.95 nm in the case of Re. For this reason, in the reference layer 33, the magnetization M15 of the ferromagnetic layer 15 and the magnetization M17 of the ferromagnetic layer 17 are antiferromagnetically bonded by the interlayer interaction. The ferromagnetic layer 15 and the ferromagnetic layer 17 are formed to be approximately 1.0 nm to 5.0 nm and approximately 1.0 nm to 5.0 nm, respectively, and it is desirable that a film thickness of the ferromagnetic layer is slightly greater than a film thickness of the ferromagnetic layer 15 such that a leakage magnetic field to be applied to the recording layer 31 decreases. The reference layer 33 may have a stacked ferri structure of five or more layers, or may include one ferromagnetic layer without having a stacked ferri structure. In this embodiment, each layer of the reference layer 33 is an epitaxial layer, but a part of the layers may contain an amorphous material. In addition, the ferromagnetic layer 15, for example, may be a three-layer film in which an amorphous ferromagnetic layer containing Co—Fe—B, Fe—B, Co—B, or the like (approximately 0.6 nm to 2.0 nm), a non-magnetic layer containing Ta, W, Mo, or a non-magnetic alloy containing at least one or more of such elements (1 nm or less), and a ferromagnetic layer are stacked in this order.

The antiferromagnetic layer 34, for example, includes an antiferromagnetic body such as Ir—Mn, Pt—Mn, and Ni—Mn, and is formed to have a thickness of approximately 5 nm to 15 nm. The antiferromagnetic layer 34 is provided on the reference layer 33, and thus, the direction of the magnetization M17 of the ferromagnetic layer 17 of the reference layer 33 in contact with the antiferromagnetic layer 34 is fixed in a predetermined direction by an antiferromagnetic interaction of the antiferromagnetic body configuring the antiferromagnetic layer 34. As a result thereof, the direction of the magnetization M15 of the ferromagnetic layer 15 that is antiferromagnetically bonded to the magnetization M17 of the ferromagnetic layer 17 is also fixed. As described above, in the antiferromagnetic layer 34, the magnetization direction of the reference layer 33 is fixed in a predetermined direction. In FIG. 2A and FIG. 2B, the magnetization M15 and the magnetization M17 that are fixed are illustrated by a black arrow. In this embodiment, it is not necessary that the antiferromagnetic layer 34 is an epitaxial layer, and the antiferromagnetic layer 34 may be polycrystalline. Further, in the antiferromagnetic layer 34, the magnetization M15 and the magnetization M17 are fixed by an in-magnetic field heat treatment to be approximately parallel or antiparallel to the easy magnetization direction of the recording layer 31 in the plane. In the ferromagnetic layer 15 and the ferromagnetic layer 17 of the reference layer 33, it is sufficient that there are a plurality of components fixed to be parallel or antiparallel to the easy magnetization direction, and there may be components that are not parallel to the easy magnetization direction. Note that, the antiferromagnetic layer 34 may not be used.

As an example of this embodiment, the magnetoresistive element 1, for example, includes the heavy metal layer 2: W—Hf (7 nm), the recording layer 31: Co—Fe (1.8 nm), the barrier layer 32: MgO (100) (1.0 nm), the reference layer 33 including the ferromagnetic layer 15: Co—Fe—B (1.5 nm)/Ta (0.5 nm)/Co—Fe (1.0 nm), the non-magnetic layer 16: Ru (0.85 nm), the ferromagnetic layer 17: Co—Fe (2.8 nm), and the antiferromagnetic layer 34: Ir—Mn (10 nm).

In such a magnetoresistive element 1, the resistance of the junction portion 3 is changed in accordance with whether the magnetization directions of the recording layer 31 and the reference layer 33 are parallel or antiparallel to each other. In this embodiment, the reference layer 33 has a multi-layer structure, and thus, in practice, the resistance of the junction portion 3 is changed in accordance with whether the magnetization direction of the recording layer 31 (in a case where the recording layer 31 is a multi-layer, the ferromagnetic layer in contact with the barrier layer 32) (the direction of the magnetization M31) and the magnetization direction of the ferromagnetic layer 15 in contact with the barrier layer 32 (the direction of the magnetization M15) are parallel or antiparallel to each other. Specifically, in a case where the direction of the magnetization M31 and the direction of the magnetization 15 are parallel to each other, the resistance is low compared to a case where the direction of the magnetization M31 and the direction of the magnetization M15 are antiparallel to each other. In this embodiment, a case where the recording layer 31 and the reference layer 33 are in a parallel state indicates a state in which the direction of the magnetization M31 and the direction of the magnetization M15 are parallel to each other, and a case where the recording layer 31 and the reference layer 33 are in an anti-parallel state indicates a state in which the direction of the magnetization M31 and the direction of the magnetization M15 are antiparallel to each other.

In the magnetoresistive element 1, the direction of the magnetization M31 of the recording layer 31 is reversed by the write current Iw to be applied to the heavy metal layer 2, and thus, the recording layer 31 and the reference layer 33 are changed between the parallel state in which the resistance is low and the anti-parallel state in which the resistance is high. 1-Bit data of "0" and "1" is assigned to the parallel state and the anti-parallel state, and thus, data can be stored in the magnetoresistive element 1. Note that, when the data is read from the magnetoresistive element 1, a read current Ire is applied between an electrode (not illustrated) provided on the antiferromagnetic layer 34 and the heavy metal layer 2, the state of the magnetoresistive element 1 (the parallel state or the anti-parallel state) is detected, and the stored data is read.

Next, a write operation of the magnetoresistive element 1 will be described. FIG. 2A illustrates that the recording layer 31 and the reference layer 33 are in the anti-parallel state, and FIG. 2B illustrates that the recording layer 31 and the reference layer 33 are in the parallel state. That is, FIG. 2A illustrates a state in which the magnetoresistive element 1 stores data "1", and FIG. 2B illustrates a state in which the magnetoresistive element 1 stores data "0".

First, as illustrated in FIG. 2A, an example of writing the data "0" in the magnetoresistive element 1 in which the data "1" is stored will be described. The write current Iw is applied toward the longitudinal direction of the heavy metal layer 2 and the near side of the paper from the deep side of the paper of FIG. 2A (in FIG. 1A, a −y direction). The write current Iw is a pulse current. Then, in the heavy metal layer 2, a spin current (the flow of spin angular movement) is generated by a spin hall effect of the spin orbit interaction, the heavy metal layer 2 contains Hf, Ta, W, Re, or an alloy mainly containing such elements, and when the sign of an spin hall angle of the heavy metal layer 2 is negative, a spin SA of which the direction is antiparallel to the magnetization M31 of the recording layer 31 (the +x direction) is applied to the upper surface side of the heavy metal layer 2 (the +z direction), a spin SB of which the direction is parallel to the spin SA (the −x direction) is applied to the lower surface side of the heavy metal layer 2 (a −z direction), and the spins are unevenly distributed in the heavy metal layer 2. Then, the spin SA flows into the recording layer 31 by the spin current that is applied to the heavy metal layer 2. Note that, the heavy metal layer 2 contains Ir, Pt, Au, or an alloy mainly containing such elements, and when the sign of the spin hall angle of the heavy metal layer 2 is positive, the write current Iw is applied to the deep side of the paper (the +y direction) from the near side of the paper of FIG. 2A, and thus, the spin SA of which the direction is antiparallel to the magnetization M31 of the recording layer 31 (the +x direction) is applied to the upper surface side of the heavy metal layer 2 (the +z direction), the spin SB of which the direction is antiparallel to the spin SA (the −x direction) is applied to the lower surface side of the heavy metal layer 2 (the −z direction), and the spins are unevenly distributed in the heavy metal layer 2.

In the recording layer 31 of FIG. 2A, the spin SA that flows into the recording layer 31 is antiparallel to the direction of the magnetization M31, and thus, the magnetization M31 receives torque by the spin SA, and the magnetization M31 is reversed. As described above, the magnetization direction of the recording layer 31 is reversed, and as illustrated in FIG. 2B, the recording layer 31 and the reference layer 33 are in the parallel state. The reversed magnetization M31 is maintained even in a case where the write current Iw is 0. As described above, the data "0" is written in the magnetoresistive element 1. A pulse width of the pulse of the write current Iw is a time that is longer than or equal to a time required for rewrite, and in this embodiment, is a time of shorter than 30 ns, and for example, is 0.1 ns or longer and shorter than 10 ns. The power of the pulse current is suitably selected in accordance with the thickness of the ferromagnetic layer, the intensity of the anisotropy, the pulse width, and the like.

At this time, the pulse current may be applied between the recording layer 31 and the reference layer 33, as a write auxiliary current Iwa for assisting the magnetization reversal of the recording layer 31. In this case, the write auxiliary current Iwa is applied toward the electrode (not illustrated in FIG. 2A) provided on the antiferromagnetic layer 34 from the heavy metal layer 2 (in the +z direction). The write auxiliary current Iwa is applied, and thus, a tunnel current is applied to the ferromagnetic layer 15 from the recording layer 31 by a tunnel effect. At this time, as with a spin transfer torque magnetization reversal method, the spin of which the direction is antiparallel to the magnetization M31 of the recording layer 31 flows into the recording layer 31 from the ferromagnetic layer 15, and in the recording layer 31, the torque is applied to the magnetization M31 by the spin that flows into the recording layer 31. The reversal of the magnetization M31 is assisted by the spin torque. The magnetization reversal can be performed by a less current in the spin transfer torque magnetization reversal method than in a spin orbit torque magnetization reversal method, and thus, the magnetization reversal of the recording layer 31 is assisted by applying the write auxiliary current Iwa toward the electrode from the heavy metal layer 2, and therefore, the write current Iw can be reduced, and the power saving of the magnetoresistive element 1 can be attained.

A pulse width of the pulse of the write auxiliary current Iwa is a time that is longer than or equal to the time required for rewrite, and in this embodiment, is time of shorter than 30 ns, and for example, is 1 ns or longer and shorter than 20 ns. The power of the pulse current is suitably selected in accordance with the thickness of the ferromagnetic layer, the intensity of the anisotropy, the pulse width, and the like. Note that, in the case of applying the write auxiliary current Iwa, it is desirable that the write auxiliary current Iwa (the pulse current) is turned off after the write current Iw (the pulse current) that is applied to the heavy metal layer 2.

Next, as illustrated in FIG. 2B, an example of writing the data "1" in the magnetoresistive element 1 in which the data "0" is stored will be described by using a case where the sign of the spin hall angle of the heavy metal layer 2 is negative, as an example. The write current Iw is applied toward the longitudinal direction of the heavy metal layer 2 and the deep side of the paper from the near side of the paper of FIG. 2B (in FIG. 1A, the +y direction). Then, in the heavy metal layer 2, the spin current is generated by the spin hall effect of the spin orbit interaction, the spin SA of which the direction is parallel to the magnetization M31 of the recording layer 31 (the +x direction) is applied to the lower surface side of the heavy metal layer 2 (the −z direction), the spin SB of which the direction is antiparallel to the spin SA (the −x direction) is applied to the upper surface side of the heavy metal layer 2 (the +z direction), and the spins are unevenly distributed in the heavy metal layer 2. Then, the spin SB flows into the recording layer 31 by the spin current that is applied to the heavy metal layer 2.

In the recording layer 31, the spin SB that flows into the recording layer 31 is antiparallel to the direction of the magnetization M31, and thus, the magnetization M31 receives the torque by the spin SA, the magnetization M31 is reversed, and as illustrated in FIG. 2A, the recording layer 31 and the reference layer 33 are in the anti-parallel state. The reversed magnetization M31 is maintained even in a case where the write current Iw is 0. As described above, the data "1" is written in the magnetoresistive element 1.

The write auxiliary current Iwa may be applied to the heavy metal layer 2 from the electrode (not illustrated in FIG. 2B) provided on the antiferromagnetic layer 34. The write auxiliary current Iwa is applied, and thus, the tunnel current is applied to the recording layer from the ferromagnetic layer 15. At this time, the direction of the magnetization M31 of the recording layer and the direction of the magnetization M15 of the ferromagnetic layer 15 are parallel to each other, and thus, most spins of the recording layer 31 are parallel to the direction of the magnetization M15, and the spins flow into the ferromagnetic layer 15 from the recording layer 31. On the other hand, a part of spins of which the direction is antiparallel to the magnetization M15 of the ferromagnetic layer 15 scatters on the interface between the barrier layer 32 and the ferromagnetic layer 15, and flows again into the recording layer 31. The spin of which the direction is antiparallel to the magnetization M15 is also antiparallel to the magnetization M31, and thus, in the recording layer 31, the magnetization M31 receives the torque from the spin that flows into the recording layer 31, the reversal of the magnetization M31 is assisted by the spin torque. As described above, the magnetization reversal of the recording layer 31 is assisted by the write auxiliary current Iwa, and thus, as with the case of writing the data "0", the write current Iw can be reduced, and the power saving of the magnetoresistive element 1 can be attained.

As described above, it is possible to rewrite the data retained in the magnetoresistive element 1.

In a case where the write current Iw for writing the data "0" is applied to the heavy metal layer 2 of the magnetoresistive element 1 in which the data "0" is stored, the direction of the magnetization M31 of the recording layer 31 is parallel to the direction of the spin that flows into the recording layer 31, and thus, the torque is not applied to the magnetization M31, and the rewrite of the data does not occur. The same applies to a case where the write current Iw for writing the data "1" is applied to the heavy metal layer 2 of the magnetoresistive element 1 in which the data "1" is stored. Note that, in this embodiment, in a case where the write auxiliary current Iwa is applied to a direction reverse to that described above, the magnetization reversal of the recording layer 31 cannot be assisted by the spin torque, and thus, it is necessary to suitably select the direction to which the write auxiliary current is applied, in accordance with the magnetization direction of the magnetization M31 of the recording layer 31 and the magnetization direction of the ferromagnetic layer 15 of the reference layer 33.

(Action and Effect)

In the configuration described above, the magnetoresistive element 1 includes the heavy metal layer 2 that is an epitaxial layer, and the junction portion 3 including the recording layer 31 that is provided on the heavy metal layer 2 and includes the ferromagnetic layer magnetized in the in-plane direction, which is an epitaxial layer, the barrier layer 32 that is provided on the recording layer 31 and includes the insulating body, and the reference layer 33 that is provided on the barrier layer 32 and has the magnetization fixed in the in-plane direction, and the recording layer 31 is subjected to magnetization reversal by applying the pulse current to the heavy metal layer 2.

Accordingly, in the magnetoresistive element 1, the recording layer 31 is the ferromagnetic layer that is an epitaxial layer, and thus, the magnetization direction becomes the in-plane direction by the magnetic crystalline anisotropy as the in-plane magnetic anisotropy, and therefore, it is not necessary that the magnetization direction is set to the in-plane direction by the magnetic shape anisotropy, and it is also possible to prevent the thermal stability from being degraded due to a decrease in the magnetic anisotropy, and to decrease the aspect ratio of the junction portion 3.

In the magnetoresistive element 1, the recording layer 31 is the epitaxial layer, and thus, the resistance decreases compared to a case where the recording layer formed on the heavy metal layer 2 is amorphous, and therefore, the spin easily flows into the recording layer 31 of the junction portion 3 by the spin current generated in the heavy metal layer 2, the write current Iw can be reduced, and the power saving can be attained.

In the magnetoresistive element 1, the heavy metal layer 2 is the epitaxial layer, and thus, the recording layer 31 can be continuously formed on the heavy metal layer 2 by epitaxial growth, and therefore, the recording layer 31 that is an epitaxial layer can be easily formed. In the magnetoresistive element 1, the recording layer 31 is continuously epitaxially grown on the heavy metal layer 2 that is an epitaxial layer, and thus, the occurrence of a defect on the interface between the heavy metal layer 2 and the recording layer 31 can be suppressed. Accordingly, in the magnetoresistive element 1, it is possible to reduce the spin that scatters by the defect on the interface, and thus, the spin easily flows into the recording layer 31 from the heavy metal layer 2, the write current Iw can be reduced, and the power saving can be attained.

(2) Magnetoresistive Element of Second Embodiment of Invention

A magnetoresistive element of a second embodiment is different from the magnetoresistive element 1 of the first embodiment in the configuration of the recording layer. Hereinafter, in the magnetoresistive element of the second embodiment, the structure of the recording layer will be mainly described, and the description of the same configurations as those of the first embodiment will be omitted. As illustrated in FIG. 3A and FIG. 3B in which the same reference numerals are applied to the same configurations as those of FIG. 2A and FIG. 2B, a magnetoresistive element 41 of the second embodiment includes the heavy metal layer 2 that is an epitaxial layer, and a junction portion 51 formed on the heavy metal layer 2. The junction portion 51 includes a recording layer 31a of a five-layer stacked film, the barrier layer 32, the reference layer 33, and the antiferromagnetic layer 34. The heavy metal layer 2, the barrier layer 32, the reference layer 33, and the antiferromagnetic layer 34 are identical to those of the magnetoresistive element 1 of the first embodiment, and thus, the description thereof will be omitted.

The recording layer 31a is a five-layer stacked film in which a first ferromagnetic layer 10a, a first non-magnetic layer 11a, a second ferromagnetic layer 12a, a second non-magnetic layer 13a, and a third ferromagnetic layer 14a are stacked on the heavy metal layer 2 in this order. In the recording layer 31a, the first ferromagnetic layer 10a, the first non-magnetic layer 11a, the second ferromagnetic layer 12a, the second non-magnetic layer 13a, and the third ferromagnetic layer 14a are stacked on the heavy metal layer 2 that is an epitaxial layer, by epitaxial growth, and thus, the recording layer 31a is an epitaxial layer. The recording layer 31a has a stacked ferri structure, in which a ferromagnetic layer and a non-magnetic layer are alternately stacked, and a layer closest to the heavy metal layer 2 side (the first ferromagnetic layer 10a) and a layer closest to the barrier layer 32 side (the third ferromagnetic layer 14a) are a ferromagnetic layer.

The first ferromagnetic layer 10a, the second ferromagnetic layer 12a, and the third ferromagnetic layer 14a contain the same material as that of the recording layer 31 of the first embodiment. In the first ferromagnetic layer 10a, distortion occurs in crystals due to mismatch between a lattice constant of a material configuring the first ferromagnetic layer 10a and a lattice constant of a material configuring the heavy metal layer 2, or the like. For this reason, in a case where the first ferromagnetic layer 10a, the second ferromagnetic layer 12a, and the third ferromagnetic layer 14a, containing a material having a bcc structure, are epitaxially grown in a bulk, the bcc structure becomes a distorted bct structure, and in a case where the first ferromagnetic layer 10a, the second ferromagnetic layer 12a, and the third ferromagnetic layer 14a, containing a material having an fcc structure, are epitaxially grown in a bulk, the fcc structure becomes a distorted fct structure. The magnetic crystalline anisotropy as the in-plane magnetic anisotropy occurs in the first ferromagnetic layer 10a by the distortion in the crystals, the easy axis of magnetization is generated in the plane of the first ferromagnetic layer 10a, and the direction along the easy axis of magnetization becomes the easy magnetization direction. The second ferromagnetic layer 12a and the third ferromagnetic layer 14a are also formed by epitaxial growth, and thus, are an epitaxial layer, the distortion occurs in the crystals as with the first ferromagnetic layer 10a, and the same direction as that of the first ferromagnetic layer 10a becomes the easy magnetization direction. In a state in which an external magnetic field, spin torque, or the like of a coersive force or more is not applied, the magnetization of the first ferromagnetic layer 10a, the second ferromagnetic layer 12a, and the third ferromagnetic layer 14a is generally directed to the easy magnetization direction, and the magnetization is performed in the in-plane direction. For this reason, the magnetization of the recording layer 31a is retained, and data recorded in the recording layer 31a is retained. In addition, in the first ferromagnetic layer 10a, the second ferromagnetic layer 12a, and the third ferromagnetic layer 14a, the magnetic crystalline anisotropy is dominant.

In this embodiment, the junction portion 51 is provided on the heavy metal layer 2 such that the easy magnetization direction of the first ferromagnetic layer 10a, the second ferromagnetic layer 12a, and the third ferromagnetic layer 14a of the recording layer 31a is approximately perpendicular to the longitudinal direction of the heavy metal layer 2 (the y direction), and thus, the magnetization of each layer is directed to the +x direction or the −x direction. In FIG. 3A and FIG. 3B, magnetization M10a, magnetization M12a, and magnetization M14a of the first ferromagnetic layer 10a, the second ferromagnetic layer 12a, and the third ferromagnetic layer 14a are illustrated by a void arrow, and a direction illustrated by the arrow indicates the magnetization direction. Note that, in FIG. 3A and FIG. 3B, the magnetization of each layer is illustrated by the arrow, for the sake of convenience, but in practice, a component that is not directed to the magnetization direction may be contained in each layer.

The recording layer 31a has a stacked ferri structure, and thus, the magnetization M10a of the first ferromagnetic layer 10a and the magnetization M12a of the second ferromagnetic layer 12a are antiferromagnetically (the magnetization directions are antiparallel to each other) bonded by the interlayer interaction. Similarly, in the recording layer 31a, the magnetization M12a of the second ferromagnetic layer 12a and the magnetization M14a of the third ferromagnetic layer 14a are antiferromagnetically bonded by the interlayer interaction.

In a case where the magnetization M10a of the first ferromagnetic layer 10a is reversed, the magnetization M12a of the second ferromagnetic layer 12a is also reversed by the interlayer interaction between the first ferromagnetic layer 10a and the second ferromagnetic layer 12a. Then, the magnetization M12a of the second ferromagnetic layer 12a is reversed, and thus, the magnetization M14a of the third ferromagnetic layer 14a is also reversed by the interlayer interaction between the second ferromagnetic layer 12a and the third ferromagnetic layer 14a. Similarly, in a case where the magnetization M14a of the third ferromagnetic layer 14a is reversed, the magnetization M12a and the magnetization M10a are also reversed by the interlayer interaction. As described above, the ferromagnetic layer of the recording layer 31a is subjected to magnetization reversal.

As described above, in the magnetoresistive element 41, the first ferromagnetic layer 10a, the second ferromagnetic layer 12a, and the third ferromagnetic layer 14a of the recording layer 31 have the easy magnetization direction by the magnetic crystalline anisotropy, and thus, it is not necessary that the recording layer 31a has the magnetic shape anisotropy, and it is not necessary that the junction portion 51 has an elongated shape having a large aspect ratio, and thereof, it is possible to decrease the aspect ratio.

In the recording layer 31a, the magnetization M10a of the first ferromagnetic layer 10a and the magnetization M12a of the second ferromagnetic layer 12a are antiferromagnetically bonded by the interlayer interaction, and the magnetization M12a of the second ferromagnetic layer 12a and the magnetization M14a of the third ferromagnetic layer 14a are antiferromagnetically bonded by the interlayer interaction. For this reason, the recording layer 31a has a magnetic field in which a leakage magnetic field applied from a positive electrode side of the first ferromagnetic layer 10a and the third ferromagnetic layer 14a is directed to a negative electrode side of the second ferromagnetic layer 12a, and a leakage magnetic field applied from a positive electrode side of the second ferromagnetic layer 12a is directed to a negative electrode side of the first ferromagnetic layer 10a and the third ferromagnetic layer 14a. As a result thereof, in the recording layer 31a, the leakage magnetic field can be suppressed, compared to a case where the recording layer includes one ferromagnetic layer. As a result thereof, when the magnetoresistive elements 41 are integrated, it is possible to suppress the influence of a leakage magnetic field of one magnetoresistive element 41 on the other magnetoresistive element 41, and to manufacture a magnetic memory device in which the magnetoresistive elements 41 are integrated with a higher density.

The first ferromagnetic layer 10a, the second ferromagnetic layer 12a, and the third ferromagnetic layer 14a are formed to have a thickness of approximately 1.0 nm to 20 nm, and each film thickness is finely adjusted such that the leakage magnetic field is eliminated.

The first non-magnetic layer 11a and the second non-magnetic layer 13a, for example, contain a non-magnetic metal such as Ir, Rh, Ru, Os, Re, and a non-magnetic alloy containing at least one or more of such elements, and are formed to have a thickness in a range of 0.5 nm to 1.0 nm and 1.8 nm to 2.3 nm in the case of Ru, in a range of 0.5 nm to 0.8 nm in the case of Ir, in a range of 0.7 nm to 1.0 nm in the case of Rh, in a range of 0.75 nm to 1.2 nm in the case of Os, and in a range of 0.5 nm to 0.95 nm in the case of Re. The first ferromagnetic layer 10a and the second ferromagnetic layer 12a are stacked through the first non-magnetic layer 11a having such a thickness, and thus, the magnetization M10a of the first ferromagnetic layer 10a and the magnetization M12a of the second ferromagnetic layer 12a are antiferromagnetically bonded by the interlayer interaction. Similarly, the thickness of the second non-magnetic layer 13a is set as described above, and thus, the magnetization M12a of the second ferromagnetic layer 12a and the magnetization M14a of the third ferromagnetic layer 14a can be antiferromagnetically bonded by the interlayer interaction.

In the magnetoresistive element 41, the first non-magnetic layer 11a and the second non-magnetic layer 13a are also an epitaxial layer. It is desirable that the first non-magnetic layer 11a and the second non-magnetic layer 13a, for example, contain materials having spin hall angles with reverse signs, representing a conversion efficiency between the applied current and the generated spin current or a material having a small spin hall angle, such as Ir. Further, for example, it is desirable that the first non-magnetic layer 11a and the second non-magnetic layer 13a contain different materials, for example, the first non-magnetic layer 11a contains Ir, and the second non-magnetic layer 13a contains Ru. As described above, the magnetization reversal of the recording layer 31a, in particular, the first ferromagnetic layer 10a can be facilitated.

The recording layer 31a may include a non-magnetic layer of 1 nm or less, which contains Ta, W, Mo, or a non-magnetic alloy containing at least one or more of such elements, and an amorphous ferromagnetic layer (approximately 0.6 nm to 2.0 nm), for example, including a ferromagnetic body such as Co—Fe—B, Fe—B, and Co—B, on the third ferromagnetic layer 14a in this order. As described above, the barrier layer 32 containing MgO (100) is epitaxially grown on the amorphous ferromagnetic body, and thus, the in-plane homogeneity of the orientation of MgO (100) can be improved, and the homogeneity of the resistance change rate (the MR change rate) can be improved. Then, the magnetization of the amorphous ferromagnetic layer is antiferromagnetically bonded to the magnetization of the third ferromagnetic layer 14a by the interlayer interaction, and the magnetization is directed to the in-plane direction.

As an example of the magnetoresistive element 41, the recording layer 31a includes the first ferromagnetic layer 10a: Co—Fe (1.4 nm), the first non-magnetic layer 11a: Ir (0.7 nm), the second ferromagnetic layer 12a: Co—Fe (3.0 nm), the second non-magnetic layer 13a: Ru (0.85 nm), and the third ferromagnetic layer 14a: Co—Fe (1.4 nm).

Next, a write operation of the magnetoresistive element 41 will be described. FIG. 3A illustrates that the recording layer 31a and the reference layer 33 are in the anti-parallel state, and FIG. 3B illustrates that the recording layer 31a and the reference layer 33 are in the parallel state. That is, FIG. 3A illustrates a state in which the magnetoresistive element 41 stores the data "1", and FIG. 3B illustrates a state in which the magnetoresistive element 41 stores the data "0".

First, as illustrated in FIG. 3A, an example of writing the data "0" in the magnetoresistive element 41 in which the data "1" is stored will be described by using a case where the sign of the spin hall angle of the heavy metal layer 2 is negative, as an example. The write current Iw is applied toward the longitudinal direction of the heavy metal layer 2 and the near side of the paper from the deep side of the paper of FIG. 3A (in FIG. 1A, the −y direction). Then, in the heavy metal layer 2, the spin current is generated by the spin hall effect of the spin orbit interaction, the spin SA of which the direction is antiparallel to the magnetization M10a of the first ferromagnetic layer 10a (the +x direction) is applied to the upper surface side of the heavy metal layer 2 (the +z direction), the spin SB of which the direction is parallel to the spin SA (the −x direction) is applied to the lower surface side of the heavy metal layer 2 (the −z direction), and the spins are unevenly distributed in the heavy metal layer 2. Then, the spin SA flows into the first ferromagnetic layer 10a by the spin current that is applied to the heavy metal layer 2.

In the first ferromagnetic layer 10a of FIG. 3A, the spin SA that flows into the first ferromagnetic layer 10a is antiparallel to the direction of the magnetization M10a, and thus, the magnetization M10a receives the torque by the spin SA, and the magnetization M10a is reversed. As described above, the magnetization direction of the first ferromagnetic layer 10a is reversed. In a case where the magnetization M10a is reversed, as described above, the magnetization M12a of the second ferromagnetic layer 12a is reversed by the interlayer interaction, and the magnetization M14a of the third ferromagnetic layer 14a is reversed by the interlayer interaction, and as illustrated in FIG. 3B, the recording layer 31a and the reference layer 33 are in the parallel state. The reversed magnetization M14a is maintained even in a case where the write current Iw is 0. As described above, the data "0" is written in the magnetoresistive element 41.

At this time, the pulse current may be applied between the recording layer 31a and the reference layer 33, as the write auxiliary current Iwa for assisting the magnetization reversal of the recording layer 31a. In this case, the write auxiliary current Iwa is applied toward the electrode (not illustrated in FIG. 3A) provided on the antiferromagnetic layer 34 from the heavy metal layer 2 (in the +z direction). The write auxiliary current Iwa is applied, and thus, the tunnel current is applied to the ferromagnetic layer 15 from the third ferromagnetic layer 14a by the tunnel effect. At this time, as with the spin transfer torque magnetization reversal method, the spin of which the direction is antiparallel to the magnetization M14a of the third ferromagnetic layer 14a flows into the third ferromagnetic layer 14a from the ferromagnetic layer 15, and in the third ferromagnetic layer 14a, the torque is applied to the magnetization M14a by the spin that flows into the third ferromagnetic layer 14a. The reversal of the magnetization M14a is assisted by the spin torque. The magnetization reversal can be performed by less current in the spin transfer torque magnetization reversal method than in the spin orbit torque magnetization reversal method, and thus, the magnetization reversal of the third ferromagnetic layer 14a, that is, the recording layer 31a is assisted by applying the write auxiliary current Iwa toward the electrode from the heavy metal layer 2, and therefore, the write current Iw can be reduced, and the power saving of the magnetoresistive element 41 can be attained.

Next, as illustrated in FIG. 3B, an example of writing the data "1" in the magnetoresistive element 41 in which the data "0" is stored will be described by using a case where the sign of the spin hall angle of the heavy metal layer is negative, as an example. The write current Iw is applied toward the longitudinal direction of the heavy metal layer 2 and the deep side of the paper from the near side of the paper of FIG. 3B (in FIG. 1A, the +y direction). Then, in the heavy metal layer 2, the spin current is generated by the spin hall effect of the spin orbit interaction, the spin SA of which the direction is parallel to the magnetization M10a of the first ferromagnetic layer 10a (the +x direction) is applied to the lower surface side of the heavy metal layer 2 (the −z direction), the spin SB of which the direction is antiparallel to the spin SA (the −x direction) is applied to the upper surface side of the heavy metal layer 2 (the +z direction), and the spins are unevenly distributed in the heavy metal layer 2. Then, the spin SB flows into the first ferromagnetic layer 10a by the spin current that is applied to the heavy metal layer 2.

In the first ferromagnetic layer 10a, the spin SB that flows into the first ferromagnetic layer 10a is antiparallel to the direction of the magnetization M10a, and thus, the magnetization M10a receives the torque by the spin SA, and the magnetization M10a is reversed. As a result thereof, the magnetization directions of the second ferromagnetic layer 12a and the third ferromagnetic layer 14a are also reversed, the magnetization direction of the recording layer 31a is also reversed, and as illustrated in FIG. 2A, the recording layer 31a and the reference layer 33 are in the anti-parallel state. The reversed magnetization M14a is maintained even in a case where the write current Iw is 0. As described above, the data "1" is written in the magnetoresistive element 1.

The write auxiliary current Iwa may be applied to the heavy metal layer 2 from the electrode (not illustrated in FIG. 3B) provided on the antiferromagnetic layer 34. The write auxiliary current Iwa is applied, and thus, the tunnel current is applied to the third ferromagnetic layer 14a from the ferromagnetic layer 15. At this time, the direction of the magnetization M14a of the third ferromagnetic layer 14a and the direction of the magnetization M15 of the ferromagnetic layer 15 are parallel to each other, and thus, most spins of the third ferromagnetic layer 14a are parallel to the direction of the magnetization M15, and the spins flow into the ferromagnetic layer 15 from the third ferromagnetic layer 14a. On the other hand, a part of spins of which the direction is antiparallel to the magnetization M15 of the ferromagnetic layer 15 scatters on the interface between the barrier layer 32 and the ferromagnetic layer 15, and flows again into the third ferromagnetic layer 14a. The spin of which the direction is antiparallel to the magnetization M15 is also antiparallel to the magnetization M14a, and thus, in the third ferromagnetic layer 14a, the magnetization M14a receives the torque from the spin that flows into the third ferromagnetic layer 14a, and the reversal of the magnetization M14a is assisted by the spin torque. As described above, the magnetization reversal of the third ferromagnetic layer 14a, that is, the recording layer 31a is assisted by the write auxiliary current Iwa, and thus, as with the case of writing the data "0", the write current Iw can be reduced, and the power saving of the magnetoresistive element 41 can be attained.

As described above, it is possible to rewrite the data retained in the magnetoresistive element 41. Note that, a read operation is identical to that of the magnetoresistive element 1, and thus, the description thereof will be omitted.

In the above description, the magnetoresistive element 41 including the recording layer 31a of a five-layer stacked film having a stacked ferri structure, has been described as the magnetoresistive element of the second embodiment, but as with a magnetoresistive element illustrated in FIGS. 4A and 4B in which the same reference numerals are applied to the same configuration as those of FIG. 2A, a recording layer 31b of a junction portion 52 may be a three-layer stacked film having a stacked ferri structure. The recording layer 31b includes a first ferromagnetic layer 10b, a non-magnetic layer 11b, and a second ferromagnetic layer 12b, and each layer is an epitaxial layer. At this time, the first ferromagnetic layer 10b and the second ferromagnetic layer 12b are antiferromagnetically bonded by the interlayer interaction. In the magnetoresistive element 42, the first ferromagnetic layer 10b and the second ferromagnetic layer 12b are formed of the same material with approximately the same thickness as that of the first ferromagnetic layer 10a of the magnetoresistive element 41, with the same material. It is desirable that the non-magnetic layer 11b is formed of the same material with approximately the same thickness as that of the first non-magnetic layer of the magnetoresistive element 41. As an example of the magnetoresistive element 42, the recording layer 31b includes the first ferromagnetic layer 10b: Co—Fe (1.8 nm), the non-magnetic layer 11b: Ir (0.7 nm), and the second ferromagnetic layer 12b: Co—Fe (1.8 nm).

In such a magnetoresistive element 42, the recording layer 31b is an epitaxial layer, and has the easy magnetization direction that is caused by the magnetic crystalline anisotropy in the plane, and thus, it is not necessary that the easy magnetization direction caused by the magnetic shape anisotropy in the plane, and it is possible to decrease the aspect ratio of the junction portion 52.

In the magnetoresistive element 42, the first ferromagnetic layer 10b and the second ferromagnetic layer 12b are antiferromagnetically bonded by the interlayer interaction, and thus, a leakage magnetic field applied from a positive electrode side of the first ferromagnetic layer 10b can be directed to a negative electrode side of the second ferromagnetic layer 12b, a leakage magnetic field applied from a positive electrode side of the second ferromagnetic layer 12b can be directed to a negative electrode side of the first ferromagnetic layer 10b, and the leakage magnetic field can be suppressed. For this reason, it is possible to suppress the influence of a leakage magnetic field of one magnetoresistive element 42 on the other magnetoresistive element 42, and to manufacture a magnetic memory device in which the magnetoresistive elements 42 are integrated with a higher density.

The recording layer 31b may include a non-magnetic layer of 1 nm or less, which contains Ta, W, Mo or a non-magnetic alloy containing at least one or more of such elements, and an amorphous ferromagnetic layer (approximately 0.6 nm to 2.0 nm), for example, including a ferromagnetic body such as Co—Fe—B, Fe—B, and Co—B, on the second ferromagnetic layer 12b. As described above, the barrier layer 32 containing MgO (100) is epitaxially grown on the amorphous ferromagnetic body, and thus, the in-plane homogeneity of the orientation of MgO (100) can be improved, and the homogeneity of the resistance change rate (the MR change rate) can be improved. Then, the magnetization of the amorphous ferromagnetic layer is ferromagnetically bonded to the magnetization of the second ferromagnetic layer 12b by the interlayer interaction, and the magnetization is directed to the in-plane direction.

The operation of such a magnetoresistive element 42 will be described by using a case where the sign of the spin hall angle of the heavy metal layer 2 is negative, as an example. In the magnetoresistive element 42, the direction to which the write current Iw is applied is reverse to that of a case where the recording layer 31a of the magnetoresistive element 41 is subjected to magnetization reversal. First, as illustrated in FIG. 4A, an example of writing the data "0" in the magnetoresistive element 42 in which the data "1" is stored will be described. Note that, in FIGS. 4A and 4B, the deep side of the paper is the +y direction. The write current Iw is applied toward the longitudinal direction of the heavy metal layer 2 and the deep side of the paper from the near side of the paper of FIG. 4A (in FIG. 1A, the +y direction). Then, in the heavy metal layer 2, the spin current (the flow of the spin angular movement) is generated by the spin hall effect of the spin orbit interaction, the spin SB of which the direction is antiparallel to magnetization M10b of the first ferromagnetic layer 10b (the −x direction) is applied to the upper surface side of the heavy metal layer 2 (the +z direction), the spin SA of which the direction is parallel to the spin SA (the +x direction) is applied to the lower surface side of the heavy metal layer 2 (the −z direction), and the spins are unevenly distributed in the heavy metal layer 2. Then, the spin SB flows into the first ferromagnetic layer 10b by the spin current that is applied to the heavy metal layer 2.

In the first ferromagnetic layer 10b, the spin SB that flows into the first ferromagnetic layer 10b is antiparallel to the direction of the magnetization M10b, and thus, the magnetization M10b receives the torque by the spin SB, and the magnetization direction of the first ferromagnetic layer 10b is reversed. In a case where the magnetization M10b is reversed, as described above, magnetization M12b of the second ferromagnetic layer 12b is reversed by the interlayer interaction, and as illustrated in FIG. 4B, the recording layer 31b and the reference layer 33 are in the parallel state.

At this time, the pulse current may be applied between the recording layer 31b and the reference layer 33, as the write auxiliary current Iwa for assisting the magnetization reversal of the recording layer 31b. In this case, the write auxiliary current Iwa is applied toward the electrode (not illustrated in FIG. 4A) provided on the antiferromagnetic layer 34 from the heavy metal layer 2 (in the +z direction). The write auxiliary current Iwa is applied, and thus, the reversal of the magnetization M12b of the second ferromagnetic layer 12b is assisted by the spin torque.

Next, as illustrated in FIG. 4B, an example of writing the data "1" in the magnetoresistive element 42 in which the data "0" is stored will be described by using a case where the sign of the spin hall angle of the heavy metal layer 2 is negative, as an example. The write current Iw is applied toward the longitudinal direction of the heavy metal layer 2 and the near side of the paper from the deep side of the paper of FIG. 4B (in FIG. 1A, the −y direction). Then, in the heavy metal layer 2, the spin current (the flow of the spin angular movement) is applied by the spin hall effect of the spin orbit interaction, the spin SB of which the direction is parallel to the magnetization M10b of the first ferromagnetic layer 10b (the −x direction) is applied to the lower surface side of the heavy metal layer 2 (the −z direction), the spin SA of which the direction is antiparallel to the magnetization M10b (the +x direction) is applied to the upper surface side of the heavy metal layer 2 (the +z direction), and the spins are unevenly distributed in the heavy metal layer 2. Then, the spin SA flows into the first ferromagnetic layer 10b by the spin current that is applied to the heavy metal layer 2.

As a result thereof, the magnetization direction of the first ferromagnetic layer 10b is reversed, and the magnetization direction of the second ferromagnetic layer 12b is also reversed by the interlayer interaction. As described above, as illustrated in FIG. 4A, the recording layer 31b and the reference layer 33 are in the anti-parallel state, and the data "1" is written in the magnetoresistive element 42. In addition, the write auxiliary current Iwa may be applied to the heavy metal layer 2 from the electrode (not illustrated in FIG. 4B) provided on the antiferromagnetic layer 34, and the reversal of the magnetization M12b of the second ferromagnetic layer 12b may be assisted by the spin torque. Note that, in a case where the spin hall angle of the heavy metal layer 2 is positive, and in any cases described above, it is necessary that the direction of the current that is applied to the heavy metal layer 2 is reversed. In addition, a read operation is identical to that of the magnetoresistive element 1, and thus, the description thereof will be omitted.

Insofar as the recording layer is a stacked film that is an epitaxial layer, in which a ferromagnetic layer and a non-magnetic layer are alternately stacked, the layer closest to the heavy metal layer 2 side and the layer closest to the barrier layer 32 side are a ferromagnetic layer, the number of ferromagnetic layers and non-magnetic layers to be stacked may be further increased.

In the second embodiment described above, a case has been described in which the recording layer 31a or the recording layer 31b is formed on the heavy metal layer 2 that is an epitaxial layer by epitaxial growth, and thus, the recording layer 31a or the recording layer 31b that is in contact with the heavy metal layer 2 and is an epitaxial layer is provided on the heavy metal layer 2, but the invention is not limited thereto, and for example, the recording layer 31a or the recording layer 31b that is a separately formed epitaxial film is laminated on the heavy metal layer 2 that is an epitaxial layer or an amorphous layer, and thus, the recording layer 31a or the recording layer 31b that is an epitaxial layer can be provided on the heavy metal layer 2. In addition, MgO is stacked on the amorphous heavy metal layer 2, and thus, an MgO layer that is an epitaxial layer may be obtained on the amorphous heavy metal layer 2, and the recording layer 31a or the recording layer 31b may be formed on the MgO layer by epitaxial growth.

Figure 5:
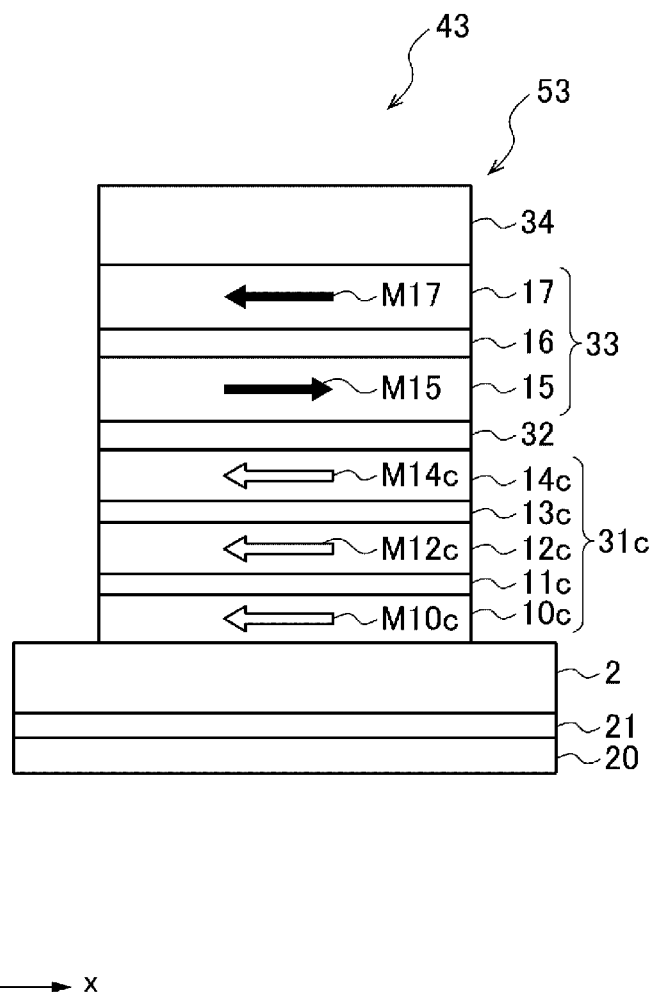
FIG. 5 is a schematic sectional view of a magnetoresistive element including a recording layer in which ferromagnetic layers are ferromagnetically bonded.

In the second embodiment described above, the magnetoresistive element 41 including the recording layer 31a having a stacked ferri structure or the magnetoresistive element 42 including the recording layer 31b having a stacked ferri structure have been described, but the invention is not limited thereto. For example, as with a magnetoresistive element 43 illustrated in FIG. 5 in which the same reference numerals are applied to the same configurations as those of FIG. 3A, a recording layer 31c may include a first ferromagnetic layer 10c, a first non-magnetic layer 11c, a second ferromagnetic layer 12c, a second non-magnetic layer 13c, and a third ferromagnetic layer 14c, and may be a five-layer film in which each layer is an epitaxial layer, and the magnetization directions of the respective ferromagnetic layers may be aligned.

In the recording layer 31c, the first ferromagnetic layer 10c and the second ferromagnetic layer 12c are ferromagnetically bonded by the interlayer interaction, and the direction of magnetization M10c of the first ferromagnetic layer 10c and the direction of magnetization M12c of the second ferromagnetic layer 12c are aligned. Similarly, in the recording layer 31c, the second ferromagnetic layer 12c and the third ferromagnetic layer 14c are ferromagnetically bonded by the interlayer interaction, and the direction of the magnetization M12c of the second ferromagnetic layer 12c and the direction of magnetization M14c of the third ferromagnetic layer 14c are aligned. As described above, in the recording layer, the directions of the magnetization M10c, the magnetization M12c, and the magnetization M14c are aligned.

In the recording layer 31c, in a case where the magnetization M10c of the first ferromagnetic layer 10c is reversed by the spin torque or the like, the magnetization M12c of the second ferromagnetic layer 12c is reversed by the interlayer interaction between the first ferromagnetic layer 10c and the second ferromagnetic layer 12c. Further, the magnetization M12c of the second ferromagnetic layer 12c is reversed, and thus, the magnetization M14c of the third ferromagnetic layer 14c is reversed by the interlayer interaction between the second ferromagnetic layer 12c and the third ferromagnetic layer 14c. In addition, in a case where the magnetization M14c of the third ferromagnetic layer 14c is reversed by the spin torque or the like, the magnetization M12c of the second ferromagnetic layer 12c is reversed by the interlayer interaction, and the magnetization M10c of the first ferromagnetic layer 10c is reversed. Here, in order to retain high thermal stability by decreasing a reversal current of the recording layer 31c, it is preferable to decrease the size of the magnetic anisotropy of the magnetization M10c such that the magnetization M10c is easily reversed, to increase the size of the magnetic anisotropy of the second ferromagnetic layer 12c such that the second ferromagnetic layer 12c is designed as a layer having high thermal stability. As an optimal size of a magnetic anisotropy constant of the magnetization M10c and the magnetization 12c, it is preferable that the second ferromagnetic layer 12c has the size of the magnetic anisotropy of approximately 70% to 85% of the total.

The interlayer interaction is changed in accordance with the thickness of the non-magnetic layer between the ferromagnetic layers, and two ferromagnetic layers are ferromagnetically bonded or antiferromagnetically bonded. In the magnetoresistive element 43, the thickness of the first non-magnetic layer 11c and the second non-magnetic layer 13c is less or greater than the thickness of the first non-magnetic layer 11a and the second non-magnetic layer 13a of the magnetoresistive element 41, and thus, the first ferromagnetic layer 10c and the second ferromagnetic layer 12c are ferromagnetically bonded, and the second ferromagnetic layer 12c and the third ferromagnetic layer 14c are ferromagnetically bonded. The first non-magnetic layer 11c and the second non-magnetic layer 13c contain the same material as that of the first non-magnetic layer 11a and the second non-magnetic layer 13a.

The first ferromagnetic layer 10c, the second ferromagnetic layer 12c, and the third ferromagnetic layer 14c contain the same material as that of the first ferromagnetic layer 10a of the magnetoresistive element 41, and in the magnetoresistive element 43, and each layer has the same film thickness. The magnetoresistive element 41, for example, includes the first ferromagnetic layer 10c: Co—Fe (1.4 nm), the first non-magnetic layer 11c: Ir (1.1 nm), the second ferromagnetic layer 12c: Co—Fe (2.8 nm), the second non-magnetic layer 13c: Ru (1.25 nm), and the third ferromagnetic layer 14c: Co—Fe (1.4 nm).

A write operation and the read operation are identical to those of the magnetoresistive element 41, and thus, the description thereof will be omitted.

Figure 6:
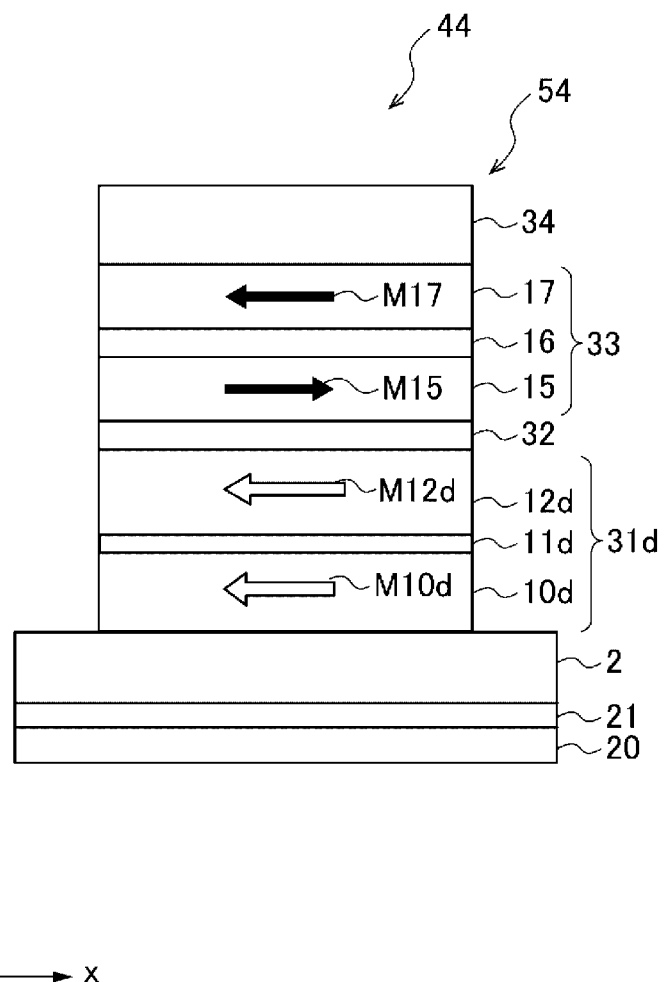
FIG. 6 is a schematic sectional view of a magnetoresistive element including a recording layer in which ferromagnetic layers are ferromagnetically bonded.

As with a magnetoresistive element 44 illustrated in FIG. 6 in which the same reference numerals are applied to the same configurations as those of FIG. 4A, a recording layer 31d may include a first ferromagnetic layer 10d, a non-magnetic layer 11d, and a second ferromagnetic layer 12d, and may be a three-layer film in which each layer is an epitaxial layer, the first ferromagnetic layer 10d and the second ferromagnetic layer 12d may be ferromagnetically bonded by the interlayer interaction, and the direction of magnetization M10d of the first ferromagnetic layer 10d and the direction of magnetization M12d of the second ferromagnetic layer 12d may be aligned.

As an example of the magnetoresistive element 44, the recording layer 31d includes the first ferromagnetic layer 10d: Co—Fe (1.6 nm), the non-magnetic layer 11d: Ir (0.7 nm), and the second ferromagnetic layer 12d: Co—Fe (1.8 nm).

(Action and Effect)

In the configuration described above, the magnetoresistive element 41 includes the heavy metal layer 2, and the junction portion 51 including the recording layer 31a that is provided on the heavy metal layer 2, the barrier layer 32 that is provided on the recording layer 31a and includes the insulating body, and the reference layer 33 that is provided on the barrier layer 32 and has the magnetization fixed in the in-plane direction, the recording layer 31a is the stacked film including the ferromagnetic layer that is an epitaxial layer (the first ferromagnetic layer 10a, the second ferromagnetic layer 12a, and the third ferromagnetic layer 14a), in which the ferromagnetic layer and the non-magnetic layer are alternately stacked, and is the ferromagnetic layer in which the layer closest to the heavy metal layer 2 side (the first ferromagnetic layer 10a) and the layer closest to the barrier layer side (the third ferromagnetic layer 14a) are magnetized in the in-plane direction, and the recording layer 31 is subjected to magnetization reversal by applying the pulse current to the heavy metal layer.

Accordingly, in the magnetoresistive element 41, the recording layer 31a includes the ferromagnetic layer that is an epitaxial layer, and thus, the magnetization direction becomes the in-plane direction by the magnetic crystalline anisotropy as the in-plane magnetic anisotropy, and therefore, it is not necessary that the magnetization direction is set to the in-plane direction by the magnetic shape anisotropy, and it is also possible to prevent the thermal stability from being degraded due to a decrease in the magnetic anisotropy, and to decrease the aspect ratio of the junction portion 51.

In the magnetoresistive element 41, the first ferromagnetic layer 10a and the second ferromagnetic layer 12a are antiferromagnetically bonded by the interlayer interaction, and the second ferromagnetic layer 12a and the third ferromagnetic layer 14a are antiferromagnetically bonded by the interlayer interaction, and thus, the leakage magnetic field applied from the positive electrode side of the first ferromagnetic layer 10 and the third ferromagnetic layer 14a can be directed to the negative electrode side of the second ferromagnetic layer 12a, the leakage magnetic field applied from the positive electrode side of the second ferromagnetic layer 12a can be directed to the negative electrode side of the first ferromagnetic layer 10a and the third ferromagnetic layer 14a, and the leakage magnetic field can be suppressed. Accordingly, when the magnetoresistive elements 41 are integrated, it is possible to suppress the influence of the leakage magnetic field of one magnetoresistive element 41 on the other magnetoresistive element 41, and to manufacture a magnetic memory device in which the magnetoresistive elements 1 are integrated with a higher density.

In the magnetoresistive element 41, the recording layer (the first ferromagnetic layer 10a, the second ferromagnetic layer 12a, and the third ferromagnetic layer 14a) is an epitaxial layer, and thus, the resistance decreases compared to a case where the ferromagnetic layer formed on the heavy metal layer 2 is amorphous, and therefore, the spin easily flows into the first ferromagnetic layer 10a configuring the recording layer 31a of the junction portion 3 by the spin current generated in the heavy metal layer 2, the write current Iw can be reduced, and the power saving can be attained.

(3) Magnetoresistive Element of Third Embodiment of Invention

As with the in-plane magnetization type magnetoresistive element described above, in the magnetoresistive element including the reference layer of which the magnetization direction is fixed in the in-plane direction, the barrier layer, and the recording layer of which the magnetization direction is the in-plane direction and can be reversed in parallel or antiparallel to the magnetization direction of the reference layer, in a case where the in-plane magnetic anisotropy of the recording layer is low, the recording layer is easily subjected to magnetization reversal, the write current Iw or the write auxiliary current Iwa can be reduced, and the power saving can be attained. On the other hand, in a case where the in-plane magnetic anisotropy of the recording layer decreases, there is a concern that the coercive force of the recording layer also decreases, the magnetization direction of the recording layer is changed due to an external factor such as a leakage magnetic field, and recorded information is eliminated.

Therefore, in a third embodiment, an object is to provide a magnetoresistive element in which data can be stored with saved power, and data can be stably stored.

As illustrated in FIG. 7A in which the same reference numerals are applied to the same configurations as those of FIG. 3A, a magnetoresistive element 45 includes a recording layer 31e that is a five-layer stacked film in which a first ferromagnetic layer 10e, a first non-magnetic layer 11e, a second ferromagnetic layer 12e, a second non-magnetic layer 13e, and a third ferromagnetic layer 14e are stacked in this order, and each layer is an epitaxial layer. The first ferromagnetic layer 10e, the second ferromagnetic layer 12e, and the third ferromagnetic layer 14e include a ferromagnetic body, and for example, an alloy containing at least one or more of Co, Fe, Ni, and Mn is desirable. In the detailed description, an alloy such as Co—Pt, Co—Pd, Co—Cr—Pt, and Co—Cr—Ta—Pt is desirable as an alloy containing Co, and in particular, it is desirable that such an alloy is so-called Co-rich in which more Co is contained than in the other elements. An alloy such as Fe—Pt and Fe—Pd is desirable as an alloy containing Fe, and in particular, it is desirable that such an alloy is so-called Fe-rich in which more Fe is contained than in the other elements. An alloy such as Co—Fe, Co—Fe—Pt, and Co—Fe—Pd is desirable as an alloy containing Co and Fe. An alloy such as Mn—Ga and Mn—Ge is desirable as an alloy containing Mn. The first ferromagnetic layer 10e, the second ferromagnetic layer 12e, and the third ferromagnetic layer 14e may be a stacked film of an alloy containing at least one or more of Co, Fe, and Ni described above, and a non-magnetic body such as Ta, W, Mo, Pt, Pd, Ru, Rh, Ir, Cr, Au, Cu, Os, or Re. In addition, an element such as B, C, N, O, P, Al, and Si may be slightly contained in the alloy containing at least one or more of Co, Fe, and Ni.

In this embodiment, the first ferromagnetic layer 10e, the second ferromagnetic layer 12e, and the third ferromagnetic layer 14e contain Co—Fe. The first ferromagnetic layer 10e, the second ferromagnetic layer 12e, and the third ferromagnetic layer 14e are formed on the heavy metal layer 2 by epitaxial growth, and are an epitaxial layer in contact with the heavy metal layer 2, and distortion occurs in crystals due to mismatch between a lattice constant of a material configuring each ferromagnetic layer and a lattice constant of a material configuring the heavy metal layer 2, or the like. For this reason, in a case where the first ferromagnetic layer 10e, the second ferromagnetic layer 12e, and the third ferromagnetic layer 14e, containing a material having a bcc structure, are epitaxially grown in a bulk, the bcc structure becomes a distorted bct structure, and in a case where the first ferromagnetic layer 10e, the second ferromagnetic layer 12e, and the third ferromagnetic layer 14e, containing a material having an fcc structure, are epitaxially grown in a bulk, the fcc structure becomes a distorted fct structure. In the first ferromagnetic layer 10e, the second ferromagnetic layer 12e, and the third ferromagnetic layer 14e, the magnetic crystalline anisotropy as the in-plane magnetic anisotropy due to the distortion in the crystals is dominantly, and the magnetization is performed in the in-plane direction by the magnetic crystalline anisotropy. The first non-magnetic layer 11e and the second non-magnetic layer 13e are formed of the same material with the same film thickness as that of the magnetoresistive element 41 described above. The configurations other than the recording layer 31e are identical to those of the magnetoresistive element 41, and thus, the description thereof will be omitted.

In the recording layer 31e, it is desirable that the thickness of the first ferromagnetic layer 10e (a layer closest to the heavy metal layer 2 side of the recording layer 31e) is approximately 10% to 30% of the total value of the thickness of the ferromagnetic layer of the recording layer 31e. Specifically, the thickness of the first ferromagnetic layer 10e is set to 1.2 nm, the thickness of the second ferromagnetic layer 12e is set to 3.0 nm, the thickness of the third ferromagnetic layer 14e is set to 2.1 nm, and the first ferromagnetic layer 10e is formed such that the thickness is less than the thickness of the second ferromagnetic layer 12e and the third ferromagnetic layer 14e while each film thickness is finely adjusted such that the leakage magnetic field is eliminated.

Here, the in-plane magnetic anisotropy of the ferromagnetic layer is represented by $E \propto (K_u V - K_i S)$. $K_u$ is an in-plane magnetic anisotropy component such as magnetic crystalline anisotropy or magnetic shape anisotropy, $K_i$ is interface magnetic anisotropy and is a magnetic anisotropy component in a perpendicular direction, and $V$ and $S$ are the volume of the ferromagnetic layer and the area of the ferromagnetic layer, respectively. The volume of the ferromagnetic layer is $V = S i t$ (t is the thickness of the ferromagnetic layer) and is proportional to the thickness of the ferromagnetic layer, and thus, the first term of the expression described above increases in proportion to the thickness of the ferromagnetic layer. On the other hand, the interface magnetic anisotropy $K_i$ acts only on the interface, and thus, even in a case where the thickness of the ferromagnetic layer is increased, the second term is not changed. For this reason, the in-plane magnetic anisotropy of the ferromagnetic layer is proportional to the thickness of the ferromagnetic layer.

The first ferromagnetic layer 10e is thinner than the second ferromagnetic layer 12e and the third ferromagnetic layer 14e, preferably, the thickness of the first ferromagnetic layer 10e is approximately 10% to 30% of the total value of the thickness of the ferromagnetic layer of the recording layer 31e, and thus, the in-plane magnetic anisotropy $K_u$ decreases, and the magnetization is easily reversed. In the recording layer 31e, the first ferromagnetic layer 10e that is easily subjected to magnetization reversal is provided on the layer closest to the heavy metal layer 2 side (in this embodiment, on the heavy metal layer 2), and is subjected to magnetization reversal by the write current Iw, and thus, magnetization M10e of the first ferromagnetic layer 10e can be reversed with a less write current Iw, the write current Iw necessary for reversing the magnetization of the recording layer 31e can be reduced, and data can be written with further saved power. On the other hand, the thicknesses of the second ferromagnetic layer 12e and the third ferromagnetic layer 14e are greater than the thickness of the first ferromagnetic layer 10e, and thus, the in-plane magnetic anisotropy is high. The second ferromagnetic layer 12e and the third ferromagnetic layer 14e are thicker than the first ferromagnetic layer 10a, and thus, the in-plane magnetic anisotropy $K_u$ is high, and it is difficult to reverse the magnetization. For this reason, it is possible to increase the coercive force of the entire recording layer 31e, and to stably store data by suppressing the reversal of the magnetization direction of the recording layer 31e due to the external influence. As described above, in the magnetoresistive element 45, data can be stored with saved power, and data can be stably stored.

As with a magnetoresistive element 46 illustrated in FIG. 7B in which the same reference numerals are applied to the same configurations as those of FIG. 7A, in a recording layer 31f, a third ferromagnetic layer 14f (a layer closest to the barrier layer 32 side of the recording layer 31f) may be formed such that the thickness is less than the thickness of a first ferromagnetic layer 10f and a second ferromagnetic layer 12f. The first ferromagnetic layer 10f, the second ferromagnetic layer 12f, and the third ferromagnetic layer 14f are capable of containing the same material as that of the magnetoresistive element 45. The first non-magnetic layer 11f and the second non-magnetic layer 13f are identical to those of the magnetoresistive element 45 described above.

In the recording layer 31f, as with the first ferromagnetic layer 10e of the magnetoresistive element 45, it is desirable that the thickness of the third ferromagnetic layer 14f is approximately 10% to 30% of the total value of the thickness of the ferromagnetic layer of the recording layer 31f. Specifically, for example, the thickness of the first ferromagnetic layer 10f is set to 2.2 nm, the thickness of the second ferromagnetic layer 12f is set to 3.5 nm, the thickness of the third ferromagnetic layer 14f is set to 1.2 nm, and the first ferromagnetic layer 10f is formed such that the thickness is less than the thickness of the second ferromagnetic layer 12f and the third ferromagnetic layer 14 while each film thickness is finely adjusted such that the leakage magnetic field is eliminated.

In the magnetoresistive element 46, the third ferromagnetic layer 14f that assists magnetization reversal by the spin torque that is generated by the write auxiliary current Iwa is thinner than the first ferromagnetic layer 10f and the second ferromagnetic layer 12f, and more preferably, the thickness is approximately 10% to 30% of the total value of the thickness of the ferromagnetic layer of the recording layer 31f, and thus, the in-plane magnetic anisotropy Ku decreases, and the magnetization is easily reversed. For this reason, in the magnetoresistive element 46, it is possible to reverse magnetization M14f of the third ferromagnetic layer 14f by a less write auxiliary current Iwa, to reduce the write auxiliary current Iwa, and to write data with further saved power. On the other hand, the first ferromagnetic layer 10f and the second ferromagnetic layer 12f are thicker than the third ferromagnetic layer 14f, and thus, the in-plane magnetic anisotropy is high, and it is difficult to reverse the magnetization. For this reason, it is possible to increase the coersive force of the entire recording layer 31f, and to stably store data by suppressing the reversal of the magnetization direction of the recording layer 31f due to the external influence. As described above, in the magnetoresistive element 46, data can be stored with saved power, and data can be stably stored.

As with a magnetoresistive element 47 illustrated in FIG. 7C in which the same reference numerals are applied to the same configurations as those of FIG. 7A, a recording layer 31g may be formed such that the thickness of a first ferromagnetic layer 10g (a layer closest to the heavy metal layer 2 side of the recording layer 31g) and a third ferromagnetic layer 14g (a layer closest to the barrier layer 32 side of the recording layer 31g) is less than the thickness of a second ferromagnetic layer 12g. The first ferromagnetic layer 10g, the second ferromagnetic layer 12g, and the third ferromagnetic layer 14g are capable of containing the same material as that of the magnetoresistive element 45. The first non-magnetic layer 11g and the second non-magnetic layer 13g are identical to those of the magnetoresistive element 45 described above.

In the recording layer 31g, it is desirable that the thickness of each of the first ferromagnetic layer 10g and the second ferromagnetic layer 12g is approximately 10% to 25% of the total value of the thickness of the ferromagnetic layer of the recording layer 31g, and the thickness of the second ferromagnetic layer 12g is approximately 65% to 85% of the total value of the thickness of the ferromagnetic layer of the recording layer 31g. As an example, the thickness of the first ferromagnetic layer 10g is approximately 1.0 nm, the thickness of the second ferromagnetic layer 12g is approximately 6.0 nm, the thickness of the third ferromagnetic layer 14g is approximately 1.0 nm, and each film thickness is finely adjusted such that the leakage magnetic field is eliminated.

In the magnetoresistive element 47, the first ferromagnetic layer 10g and the second ferromagnetic layer 12g occupy 10% to 25% of the total value of the thickness of the ferromagnetic layer of the recording layer 31g, and the second ferromagnetic layer 12g occupies approximately 65% to 85% of the total value of the thickness of the ferromagnetic layer of the recording layer 31g, and thus, the first ferromagnetic layer 10g that is subjected to magnetization reversal by the write current Iw and the third ferromagnetic layer 14g that assists magnetization reversal by the spin torque generated by the write auxiliary current Iwa become thin, the in-plane magnetic anisotropy Ku decreases, and the magnetization is easily reversed. For this reason, the write current Iw and the write auxiliary current Iwa can be reduced, and data can be written with further saved power.

On the other hand, the second ferromagnetic layer 12g is approximately 65% to 85% of the total value of the thickness of the ferromagnetic layer, and thus, the in-plane magnetic anisotropy Ku increases, and is approximately 80% of the in-plane magnetic anisotropy Ku of the entire recording layer 31g. Accordingly, it is possible to increase the coersive force of the entire recording layer 31g, and to stably store data by suppressing of the reversal of the magnetization direction of the recording layer 31g due to the external influence. As described above, the magnetoresistive element 47 is most desirable since the second ferromagnetic layer 12g occupies approximately 65% to 85% of the total value of the thickness of the ferromagnetic layer of the recording layer 31g, and not only the write current Iw but also the write auxiliary current Iwa can be reduced, and thus, the power saving can be further attained, and the thickness of the second ferromagnetic layer 12g increases and is 80% of the in-plane magnetic anisotropy Ku of the entire recording layer 31g, and therefore, the coersive force of the recording layer 31g can be increased, and data can be stably stored. In the magnetoresistive element 47, data can be stored with saved power, and data can be stably stored.

The recording layers 31e, 31f, and 31g described above may include a non-magnetic layer of 1 nm or less, which contains Ta, W, Mo, or a non-magnetic alloy containing at least one or more of such elements, and an amorphous ferromagnetic layer (approximately 0.6 nm to 2.0 nm), for example, including a ferromagnetic body such as Co—Fe—B, Fe—B, and Co—B, on the third ferromagnetic layers 14e, 14f, and 14g in this order. As described above, the barrier layer 32 containing MgO (100) is epitaxially grown on the amorphous ferromagnetic body, and thus, the in-plane homogeneity of the orientation of MgO (100) can be improved, and the homogeneity of the resistance change rate (the MR change rate) can be improved. Then, the magnetization of the amorphous ferromagnetic layer of the recording layers 31e, 31f, and 31g is ferromagnetically bonded to the magnetization of the third ferromagnetic layers 14e, 14f, and 14g by the interlayer interaction, and the magnetization is directed to the in-plane direction. In this case, a layer of which the magnetization reversal is assisted by the write auxiliary current Iwa becomes an amorphous ferromagnetic layer. The amorphous ferromagnetic layer is not an epitaxial layer, and thus, the magnetic crystalline anisotropy is small, and the in-plane magnetic anisotropy is small. In addition, in a case where the thickness of the amorphous ferromagnetic layer is less than the thickness of the first ferromagnetic layers 10e, 10f, and 10g, the second ferromagnetic layers 12e, 12f, and 12g, and the third ferromagnetic layers 14e, 14f, and 14g, the in-plane magnetic anisotropy is small, and the magnetization is easily reversed. For this reason, the amorphous ferromagnetic layer is provided, and thus, the write auxiliary current Iwa can be reduced, and the power saving can be attained.

Figure 8A:
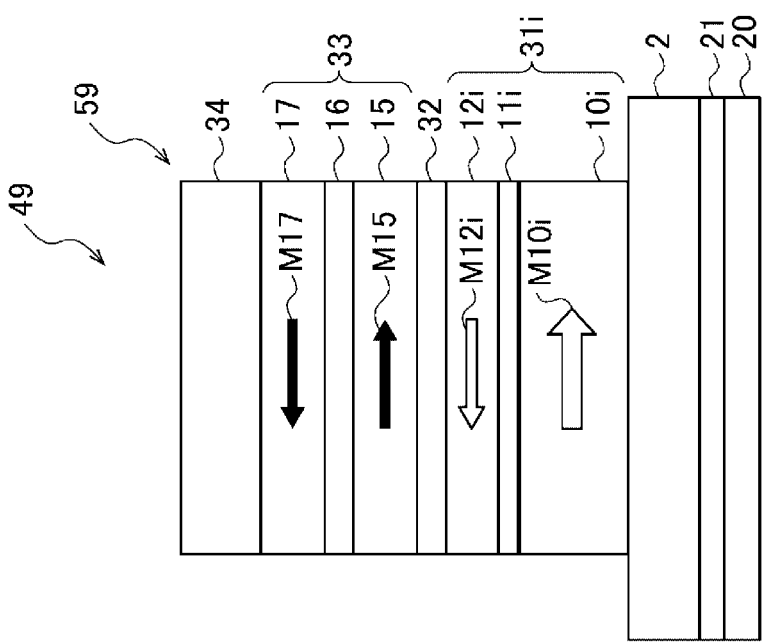
FIG. 8A is a schematic sectional view of a magnetoresistive element including a recording layer in which a ferromagnetic layer closest to a heavy metal layer side is thinner than other ferromagnetic layers.

As with a magnetoresistive element 48 illustrated in FIG. 8A in which the same reference numerals are applied to the same configurations as those of FIG. 4A, a recording layer 31h that is a three-layer film in which a first ferromagnetic layer 10h, a non-magnetic layer 11h, and a second ferromagnetic layer 12h are stacked in this order and each layer is an epitaxial layer may be provided, and the first ferromagnetic layer 10h (a layer closest to the heavy metal layer 2 side of the recording layer 31h) may be formed to be thinner than the second ferromagnetic layer 12h. In this case, the first ferromagnetic layer 10h and the second ferromagnetic layer 12h are capable of containing the same material as that of the ferromagnetic layer of the magnetoresistive element 45. The non-magnetic layer 11h is identical to that of the magnetoresistive element 45 described above.

In the recording layer 31h, it is desirable that the thickness of the first ferromagnetic layer 10h is approximately 10% to 35% of the total value of the thickness of the ferromagnetic layer of the recording layer 31h, and the thickness of the second ferromagnetic layer 12h is approximately 65% to 90% of the total value of the thickness of the ferromagnetic layer of the recording layer 31h. Specifically, for example, the thickness of the first ferromagnetic layer 10h is set to 2 nm, the thickness of the second ferromagnetic layer 12h is set to 8 nm, and the first ferromagnetic layer 10h is formed such that the thickness is less than the thickness of the second ferromagnetic layer 12h while each film thickness is finely adjusted such that the leakage magnetic field is eliminated.

In the magnetoresistive element 48, the thickness of the first ferromagnetic layer 10h is approximately 10% to 35% of the total value of the thickness of the ferromagnetic layer of the recording layer 31h, the in-plane magnetic anisotropy Ku is decreased by decreasing the thickness of the first ferromagnetic layer 10h that is subjected to magnetization reversal by the write current Iw, and the magnetization is easily reversed, and thus, the write current Iw can be reduced, and data can be written with further saved power. On the other hand, the thickness of the second ferromagnetic layer 12h is approximately 65% to 90% of the total value of the thickness of the ferromagnetic layer of the recording layer 31h, and thus, the in-plane magnetic anisotropy Ku is high, and is approximately 80% of the in-plane magnetic anisotropy Ku of the entire recording layer 31h. For this reason, it is possible to increase the coercive force of the entire recording layer 31h, and to stably store data by suppressing the reversal of the magnetization direction of the recording layer 31h due to the external influence. As described above, in the magnetoresistive element 48, data can be stored with saved power, and data can be stably stored.

Figure 8B:
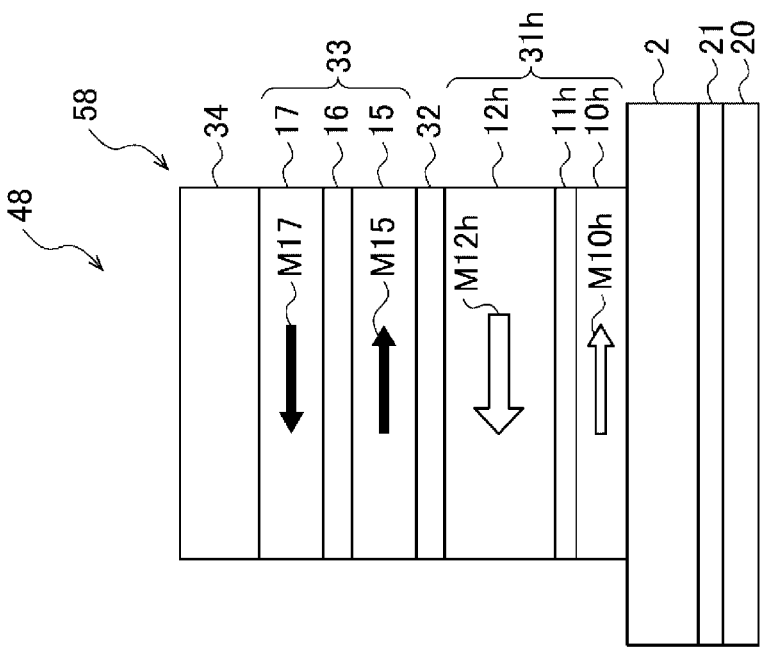
FIG. 8B is a schematic sectional view of a magnetoresistive element including a recording layer in which a ferromagnetic layer closest to a barrier layer side is thinner than other ferromagnetic layers.

As with a magnetoresistive element 49 illustrated in FIG. 8B in which the same reference numerals are applied to the same configurations as those of FIG. 8A, a second ferromagnetic layer 12i (a layer closest to the barrier layer 32 side of a recording layer 31i) may be formed to be thinner than a first ferromagnetic layer 10i. In this case, the first ferromagnetic layer 10i and the second ferromagnetic layer 12i are capable of containing the same material as that of the ferromagnetic layer of the magnetoresistive element 45. The non-magnetic layer 11i is identical to that of the magnetoresistive element 45 described above.

In the recording layer 31i, it is desirable that the thickness of the second ferromagnetic layer 12i is approximately 10% to 35% of the total value of the thickness of the ferromagnetic layer of the recording layer 31i, and the thickness of the first ferromagnetic layer 10i is approximately 65% to 90% of the total value of the thickness of the ferromagnetic layer of the recording layer 31i. Specifically, for example, the thickness of the first ferromagnetic layer 10i is set to 7 nm, the thickness of the second ferromagnetic layer 12i is set to 1.1 nm, and the second ferromagnetic layer 12i is formed such that the thickness is less than the thickness of the first ferromagnetic layer 10i while each film thickness is finely adjusted such that the leakage magnetic field is eliminated.

In the magnetoresistive element 49, the thickness of the second ferromagnetic layer 12i is approximately 10% to 35% of the total value of the thickness of the ferromagnetic layer of the recording layer 31i, the in-plane magnetic anisotropy Ku of the second ferromagnetic layer 12i that assists magnetization reversal by the spin torque generated by the write auxiliary current Iwa decreases, and the magnetization is easily reversed, and thus, the write auxiliary current Iwa can be reduced, and data can be written with further saved power. On the other hand, the thickness of the first ferromagnetic layer 10i is approximately 65% to 90% of the total value of the thickness of the ferromagnetic layer of the recording layer 31i, and thus, the in-plane magnetic anisotropy Ku is high, and is approximately 80% of the in-plane magnetic anisotropy Ku of the entire recording layer 31i. For this reason, it is possible to increase the coercive force of the entire recording layer 31i, and to stably store data by suppressing the reversal of the magnetization direction of the recording layer 31i due to the external influence. As described above, in the magnetoresistive element 49, data can be stored with saved power, and data can be stably stored.

The recording layers 31h and 31i described above may include a non-magnetic layer of 1 nm or less, which contains Ta, W, Mo, or a non-magnetic alloy containing at least one or more of such elements, and an amorphous ferromagnetic layer (approximately 0.6 nm to 2.0 nm), for example, including a ferromagnetic body such as Co—Fe—B, Fe—B, and Co—B, on the second ferromagnetic layers 12h and 12i in this order. As described above, the barrier layer containing MgO (100) is epitaxially grown on the amorphous ferromagnetic body, and thus, the in-plane homogeneity of the orientation of MgO (100) can be improved, and the homogeneity of the resistance change rate (the MR change rate) can be improved. Then, the magnetization of the amorphous ferromagnetic layer of the recording layers 31h and 31i is ferromagnetically bonded to the magnetization of the second ferromagnetic layers 12h and 12i by the interlayer interaction, and the magnetization is directed to the in-plane direction. In this case, a layer of which the magnetization reversal is assisted by the write auxiliary current Iwa becomes an amorphous ferromagnetic layer. The amorphous ferromagnetic layer is not an epitaxial layer, and thus, the magnetic crystalline anisotropy is small, and the in-plane magnetic anisotropy is small. In addition, in a case where the thickness of the amorphous ferromagnetic layer is less than the thickness of the first ferromagnetic layers 10h and 10i and second ferromagnetic layers 12h and 12i, the in-plane magnetic anisotropy is small, and the magnetization is easily reversed. For this reason, the amorphous ferromagnetic layer is provided, and thus, the write auxiliary current Iwa can be reduced, and the power saving can be attained.

In the third embodiment, a case where the ferromagnetic layer of the recording layer is magnetized in the in-plane direction by the magnetic crystalline anisotropy as the in-plane magnetic anisotropy has been described as an example, but the ferromagnetic layer of the recording layer may be magnetized in the in-plane direction by the magnetic shape anisotropy as the in-plane magnetic anisotropy, and in the case of the magnetic shape anisotropy, the ferromagnetic layer may be polycrystalline and may be amorphous. In such a case, at least one of the ferromagnetic layer closest to the heavy metal layer side and the ferromagnetic layer closest to the barrier layer side is thinner than the other ferromagnetic layer, and thus, the magnetization of the ferromagnetic layer that is subjected to magnetization reversal by the write current Iw or the ferromagnetic layer of which the magnetization reversal is assisted by the write auxiliary current Iwa are easily reversed, and therefore, at least one of the write current Iw and the write auxiliary current Iwa can be reduced, and the power saving can be attained. Then, the other ferromagnetic layer is thicker than the ferromagnetic layer closest to the heavy metal layer side or the ferromagnetic layer closest to the barrier layer side, and thus, the in-plane magnetic anisotropy is high, and it is possible to increase the coersive force of the entire recording layer, and to stably store data by suppressing the reversal of the magnetization direction of the recording layer due to the external influence. In addition, the heavy metal layer 2 may be an amorphous layer but not an epitaxial layer. Further, the first non-magnetic layers 11e, 11f, and 11g, the second non-magnetic layers 13e, 13f, and 13g, and the non-magnetic layers 11h and 11i may be an amorphous layer. In this case, an amorphous non-magnetic layer is formed on a ferromagnetic layer that is an epitaxial layer, and a ferromagnetic layer that is an epitaxial layer is laminated thereon, and thus, a stacked film is formed.

(Action and Effect)

The magnetoresistive element of the third embodiment includes a junction portion (junction portions 55, 56, 57, 58, and 59) including the heavy metal layer 2, and the recording layer (the recording layers 31e, 31f, 31g, 31h, and 31i) that is provided on the heavy metal layer 2, the barrier layer 32 that is provided on the recording layer 31e and includes the insulating body, and the reference layer 33 that is provided on the barrier layer 32 and has the magnetization fixed in the in-plane direction, the recording layer (the recording layers 31e, 31f, 31g, 31h, and 31i) is a stacked film in which the ferromagnetic layer and the non-magnetic layer are alternately stacked, and the layer closest to the heavy metal layer 2 side (the first ferromagnetic layers 10e, 10f, 10g, 10h, and 10i) and the layer closest to the barrier layer 32 side (the third ferromagnetic layers 14e, 14f, and 14g and the second ferromagnetic layers 12h and 12i) are a ferromagnetic layer, the ferromagnetic layer is magnetized in the in-plane direction, at least one of the layer closest to the heavy metal layer side of the recording layer (the first ferromagnetic layers 10e, 10f, 10g, 10h, and 10i) or the layer closest to the barrier layer side of the recording layer (the third ferromagnetic layers 14e, 14f, and 14g and the second ferromagnetic layers 12h and 12i) is thinner than the other ferromagnetic layer of the recording layer (the recording layers 31e, 31f, 31g, 31h, and 31i), and the pulse current (the write current Iw) is applied to the heavy metal layer 2, and thus, the recording layer (the recording layers 31e, 31f, 31g, 31h, and 31i) is subjected to magnetization reversal.

Accordingly, in the magnetoresistive element, at least one of the ferromagnetic layer closest to the heavy metal layer side and the ferromagnetic layer closest to the barrier layer side is thinner than the other ferromagnetic layer, and thus, the magnetization of the ferromagnetic layer that is subjected to magnetization reversal by the write current Iw or the ferromagnetic layer of which the magnetization reversal is assisted by the write auxiliary current Iwa is easily reversed, at least one of the write current Iw and the write auxiliary current Iwa can be reduced, and the power saving can be attained. Then, the other ferromagnetic layer is thicker than the ferromagnetic layer closest to the heavy metal layer side or the ferromagnetic layer closest to the barrier layer side, and thus, the in-plane magnetic anisotropy is high, it is possible to increase the coersive force of the entire recording layer, and to stably store data by suppressing the reversal of the magnetization direction of the recording layer due to the external influence.

(4) Magnetic Memory Device Including Magnetoresistive Element of Invention

Figure 9A:
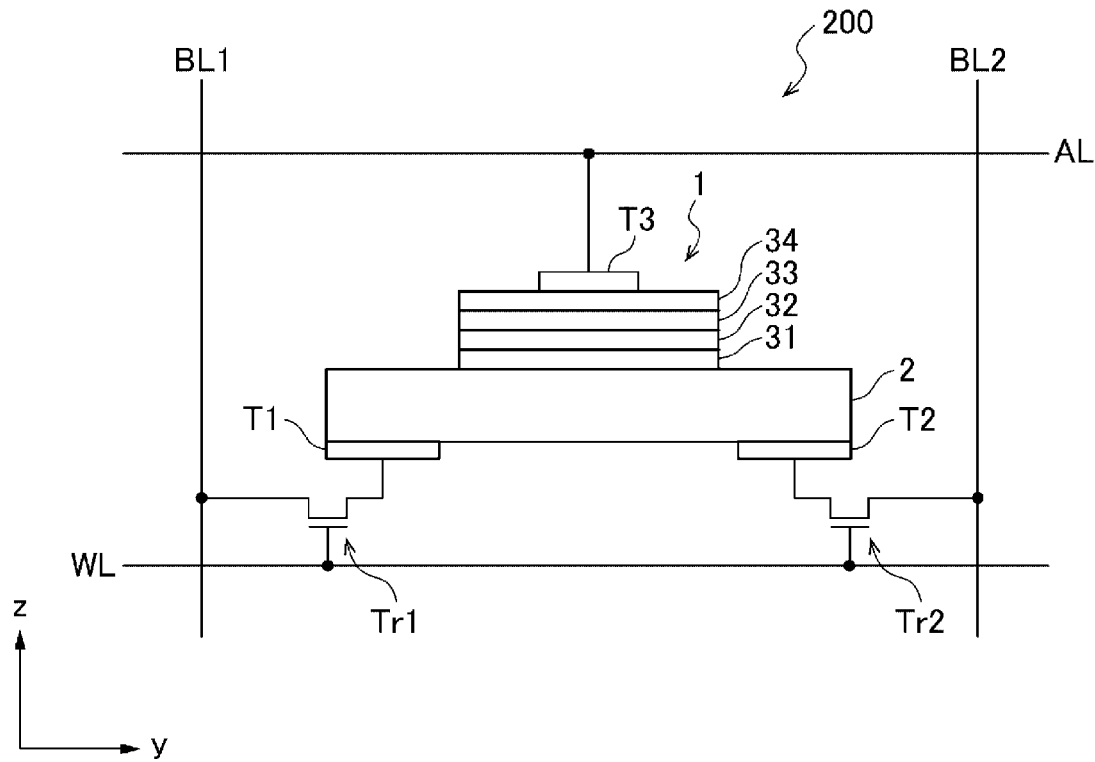
FIG. 9A is an example illustrating a circuit configuration in a case where a terminal is provided in a lower portion of both ends of a heavy metal layer in a memory cell circuit of one bit, using a magnetoresistive element of the embodiments of the invention.

Next, a configuration example of a memory cell circuit using the magnetoresistive element 1 having the configuration described above as a memory element will be described with reference to FIG. 9A in which the same reference numerals are applied to the same configurations as those of FIG. 2A. FIG. 9A illustrates the configuration of a magnetic memory cell circuit 200 of one bit. The magnetic memory cell circuit 200 includes the magnetoresistive element 1 configuring a memory cell of one bit, a first bit line BL1, a second bit line BL2, an assist line AL, a word line WL, a first transistor Tr1, and a second transistor Tr2.

The magnetoresistive element 1 has a three-terminal structure in which the first terminal T1 is connected to the lower surface of one end portion of the heavy metal layer 2 and the second terminal T2 is connected to the lower surface of the other end portion, the third terminal T3 is disposed on the antiferromagnetic layer 34 or a Cap layer (not illustrated in FIG. 9A) provided thereon. Note that, for the convenience of explanation, in FIG. 9A, the MgO layer 21 and the amorphous metal layer 20 in the lower portion of the heavy metal layer 2 are omitted. The heavy metal layer 2 may be in contact with the first terminal T1 and the second terminal T2 through a through hole or the like that is formed in the MgO layer 21 and the amorphous metal layer 20, a contact may be formed in the heavy metal layer 2, or the heavy metal layer 2 may be electrically connected to the first terminal T1 and the second terminal T2.

The third terminal T3 is connected to the assist line AL. The first terminal T1 is connected to a drain of the first transistor Tr1. The second terminal T2 is connected to a drain of the second transistor Tr2. A gate electrode of the first transistor Tr1 and the second transistor Tr2 is connected to the word line WL. A source of the first transistor Tr1 is connected to the first bit line BL1. A source of the second transistor Tr2 is connected to the second bit line BL2.

A method for writing data in the magnetoresistive element 1 is as follows. First, in order to select the magnetoresistive element 1, a signal having an active level, which turns on the first transistor Tr1 and the second transistor Tr2, is applied to the word line WL. Here, the first transistor Tr1 and the second transistor Tr2 include an N-channel MOS transistor. In this case, the word line WL is set to a High level. Accordingly, the first transistor Tr1 and the second transistor Tr2 are set to be in an on state. On the other hand, one of the first bit line BL1 and the second bit line BL2 is set to a High level, and the other is set to a Low level, in accordance with data of a write target.

Specifically, in the case of writing the data "0", the first bit line BL1 is set to the Low level, and the second bit line BL2 is set to the High level. Accordingly, the write current Iw is applied to the first terminal T1 from the second terminal T2 (corresponding to the near side of the paper from the deep side of the paper of FIG. 2A), and the data "1" is written. At this time, the assist line AL is set to the High level, and thus, the write auxiliary current Iwa may be applied to the first terminal T1 from the third terminal T3, and the magnetization reversal of the recording layer 31 may be assisted. On the other hand, in the case of writing the data "1", the first bit line BL1 is set to the High level, and the second bit line BL2 is set to the Low level. Accordingly, the write current Iw is applied to the second terminal T2 from the first terminal T1 (corresponding to the deep side of the paper from the near side of the paper of FIG. 2B), and the data "1" is written. At this time, the assist line AL is set to the Low level, and thus, the write auxiliary current Iwa may be applied to the third terminal T3 from the first terminal T1, and the magnetization reversal of the recording layer 31 may be assisted. As described above, bit data is written in the magnetoresistive element 1.

A method for reading the data stored in the magnetoresistive element 1 is as follows. First, the word line WL is set to an active level, and the first transistor Tr1 and the second transistor Tr2 are set to be in the on state. Both of the first bit line BL1 and the second bit line BL2 are set to the High level, or one of the first bit line BL1 and the second bit line BL2 is set to the High level, and the other is set to be in an open state. Then, the assist line AL is set to the Low level. The read current Ire is applied to the heavy metal layer 2→the recording layer 31→the barrier layer 32→the reference layer 33→the antiferromagnetic layer 34→the third terminal T3→the assist line AL from the bit line that is set to the High level. The size of the current is measured, and thus, the size of the resistance of a path from the heavy metal layer 2 to the antiferromagnetic layer 34, that is, the stored data can be determined.

Figure 9B:
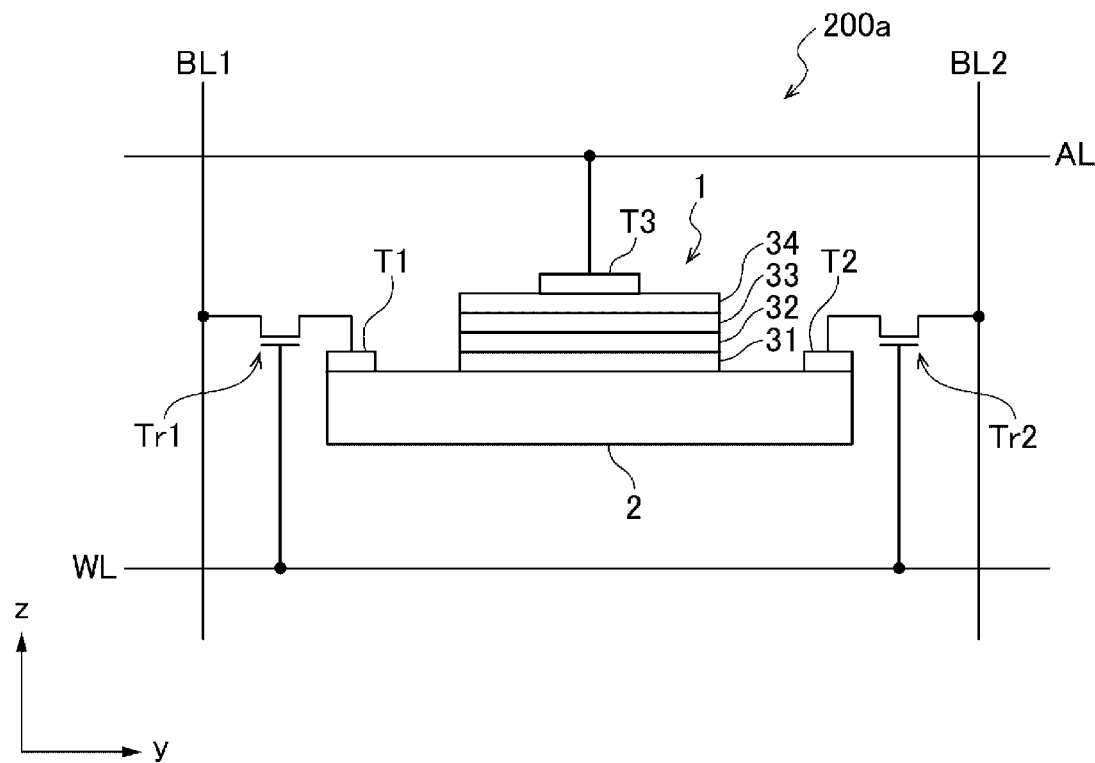
FIG. 9B is an example illustrating a circuit configuration in a case where the terminal is provided on the surface of the both ends of the heavy metal layer.

The configuration or the circuit operation of the magnetic memory cell circuit 200 is an example, and can be suitably changed. For example, in order to read the data, the word line WL is set to the High level, the assist line AL is set to the High level, and one or both of the first bit line and the second bit line are set to the Low level. As described above, the read current Ire may be applied to the first bit line BL1 and the second bit line BL2 from the assist line AL. In a case where the write auxiliary current Iwa is not applied, the third terminal T3 may be connected to a ground line. In addition, as with a magnetic memory cell circuit 200a illustrated in FIG. 9B, the first terminal T1 may be provided on the upper surface of one end portion of the heavy metal layer 2, and the second terminal T2 may be provided on the upper surface of the other end portion of the heavy metal layer 2.

Figure 10:
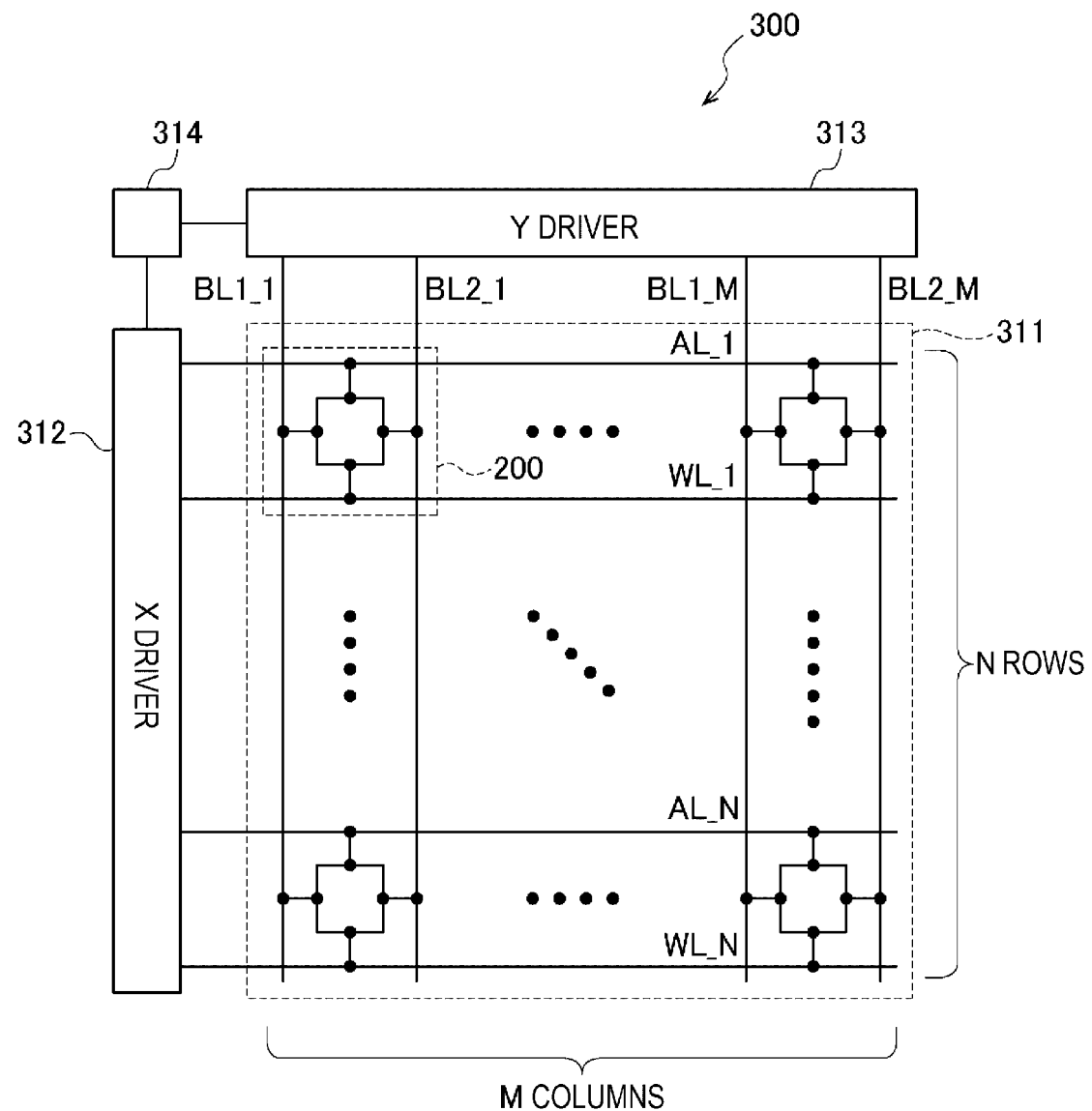
FIG. 10 is a block diagram of a magnetic memory device in which a plurality of memory cell circuits illustrated in FIG. 9A are disposed.

Next, the configuration of a magnetic memory device 300 including a plurality of magnetic memory cell circuits 200 exemplified in FIG. 9A will be described with reference to FIG. 10. As illustrated in FIG. 10, the magnetic memory device 300 includes a memory cell array 311, an X driver 312, a Y driver 313, and a controller 314. The memory cell array 311 includes the magnetic memory cell circuits 200 that are disposed into the shape of an array of N rows and M columns. The magnetic memory cell circuit 200 in each column is connected to a pair of the first bit line BL1 and the second bit line BL2 in the corresponding column. In addition, the magnetic memory cell circuit 200 in each row is connected to the word line WL and the assist line AL in the corresponding row.

The X driver 312 is connected to a plurality of word lines WL and a plurality of assist lines AL, and decodes a row address that is received, and thus, drives the word line WL in a row that is an access target to the active level, and sets the assist line AL to the High level or the Low level. For example, in a case where the first transistor Tr1 and the second transistor Tr2 are an N-channel MOS transistor, the X driver 312 sets the word line WL to the High level.

The Y driver 313 functions as a write unit that writes data in the magnetoresistive element 1 and a read unit that reads data from the magnetoresistive element 1. The Y driver 313 is connected to a plurality of first bit lines BL1 and a plurality of second bit lines BL2. The Y driver 313 decodes a column address that is received, and sets the first bit line BL1 and the second bit line BL2, connected to the magnetic memory cell circuit 200 that is an access target, to be in a data write state or a data read state.

In the write of the data "0", the Y driver 313 sets the first bit line BL1 connected to the magnetic memory cell circuit 200 that is a write target to the Low level, and sets the second bit line BL2 to the High level. In a case where the write auxiliary current Iwa is applied, the X driver 312 sets the assist line AL in a row belonging to the magnetic memory cell circuit 200 that is a write target to the High level. In addition, in the write of the data "1", the Y driver 313 sets the first bit line BL1 connected to the magnetic memory cell circuit 200 that is a write target to the High level, and sets the second bit line BL2 to the Low level. In a case where the write auxiliary current Iwa is applied, the X driver 312 sets the assist line AL in a row belonging to the magnetic memory cell circuit 200 that is a write target to the Low level. Further, in the read of the data that is stored in the magnetic memory cell circuit 200, the Y driver 313, first, sets both of the first bit line BL1 and the second bit line BL2, connected to the magnetic memory cell circuit 200 that is a read target, to the High level, or sets one of the first bit line BL1 and the second bit line BL2 to the High level, and sets the other to be in the open state. The X driver 312 sets the assist line AL in a row belonging to the magnetic memory cell circuit 200 that is a read target to the Low level. Then, the Y driver 313 determines a resistance state of the magnetic memory cell circuit 200 in each column by comparing a current that is applied to the first bit line BL1 and the second bit line BL2 with a reference value, and thus, reads the stored data.

The controller 314 controls each of the X driver 312 and the Y driver 313, in accordance with data write or data read. Note that, the magnetoresistive element 41 or the like, described above, can be applied instead of the magnetoresistive element 1.

Figure 11A:
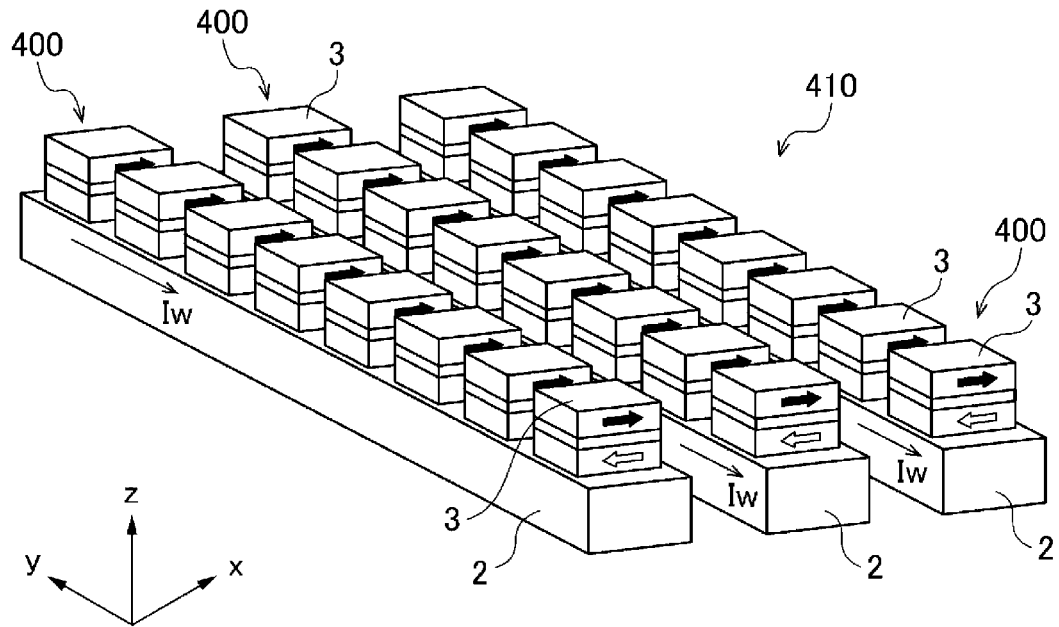
FIG. 11A is a schematic view illustrating a magnetic memory device using a magnetoresistive element array of the invention.

As described above, in the magnetoresistive element 1 of this embodiment, not only the write current Iw but also the write auxiliary current Iwa can be applied, and the magnetization reversal of the recording layer 31 using the spin orbit torque can be assisted by the spin transfer torque magnetization reversal, and thus, as illustrated in FIG. 11A, a magnetoresistive element array 400 can be obtained in which a plurality of (for example, eight) junction portions 3 are arranged in the first direction (the longitudinal direction of the heavy metal layer 2) on one heavy metal layer 2 having an elongated shape that is stretched in the first direction, and the heavy metal layer 2 of one magnetoresistive element 1 can be shared by the plurality of other magnetoresistive elements 1. That is, the magnetoresistive element array 400 includes a plurality of magnetoresistive elements 1, the heavy metal layer 2 of one magnetoresistive element 1 is stretched in the first direction, the stretched heavy metal layer 2 is shared by the plurality of other magnetoresistive elements 1, and the junction portion 3 is arranged in the first direction on the heavy metal layer 2. Then, it is possible to manufacture a magnetic memory device 410 by preparing a plurality of magnetoresistive element arrays 400. In the magnetic memory device 410, data is stored by using one junction portion 3 as one bit. Note that, the size of the heavy metal layer 2 of the magnetoresistive element array 400 can be suitably selected in accordance with the size of the junction portion, the number of junction portions, or the like, and thus, for example, the width of the heavy metal layer 2 may be greater than the width of the junction portion 3, as with the magnetoresistive element 1 illustrated in FIG. 1A, or may be the same size as that of the junction portion 3, as with the magnetoresistive element 1b illustrated in FIG. 1B.

Figure 11B:
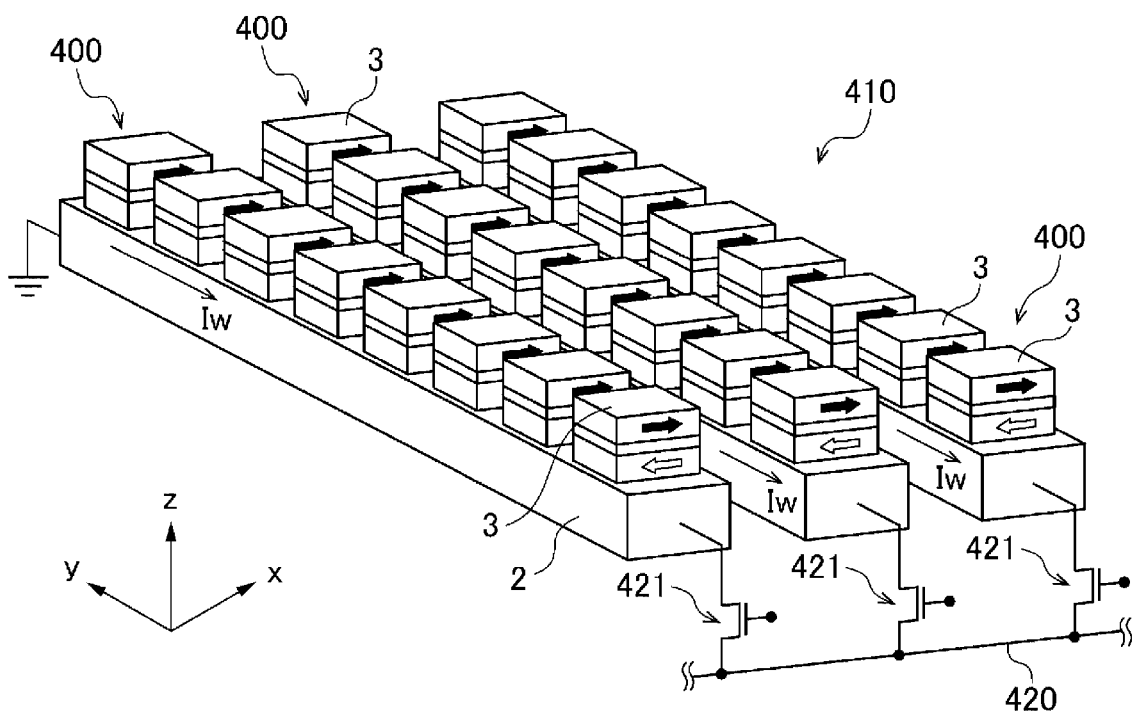
FIG. 11B is a schematic view illustrating an example of wiring of the magnetic memory device using the magnetoresistive element array.

As illustrated in FIG. 11B, in the magnetoresistive element array 400, one end is connected to a ground, and the other end is connected to a control line 420 through a transistor 421. For example, the potential of the control line 420 is set to the Low level that is lower than the ground, and the transistor 421 is turned on (a voltage is applied to a gate), and thus, the write current Iw can be applied to the heavy metal layer 2 in the −y direction. Then, the transistor 421 that is turned on is selected, and thus, a magnetoresistive element array to which the write current Iw is applied can be selected. Note that, in FIG. 11A and FIG. 11B, for convenience, only the recording layer 31, the barrier layer 32, and the reference layer 33 of the junction portion 3 are illustrated. In addition, here, the magnetoresistive element array 400 including the junction portion 3 has been described as an example, but as with the magnetoresistive element 47 illustrated in FIG. 7C, a magnetoresistive element array including a plurality of junction portions 57 including the recording layer 31g that is a five-layer stacked film of the first ferromagnetic layer 10g, the first non-magnetic layer 11g, the second ferromagnetic layer 12g, the second non-magnetic layer 13g, and the third ferromagnetic layer 14g and has a stacked ferri structure in which each layer is an epitaxial layer, in which the first ferromagnetic layer 10g and the third ferromagnetic layer 14g are thinner than the second ferromagnetic layer 12g, is most advantageous. In this case, it is possible to suppress the leakage magnetic field, and thus, it is possible to store data with a higher density, and it is possible to reduce the write current Iw and the write auxiliary current Iwa, and thus, the power saving can be further attained.

In the magnetoresistive element array 400, the write auxiliary current Iwa is applied only to a predetermined junction portion 3 while the write current Iw is applied between one end portion and the other end portion of the heavy metal layer 2 along the first direction (the longitudinal direction of the heavy metal layer 2), in a size in which the magnetization of the recording layer is not reversed, and thus, the magnetization of the recording layer of a predetermined magnetoresistive element can be selectively reversed. In the write auxiliary current Iwa, a write time is long, but the magnetization of the recording layer can be reversed, and thus, write with the write current Iw is assisted by the write auxiliary current Iwa, and therefore, it is possible to suppress a half-select write error, and to configure a multi-bit magnetic memory device.

Figure 12A:
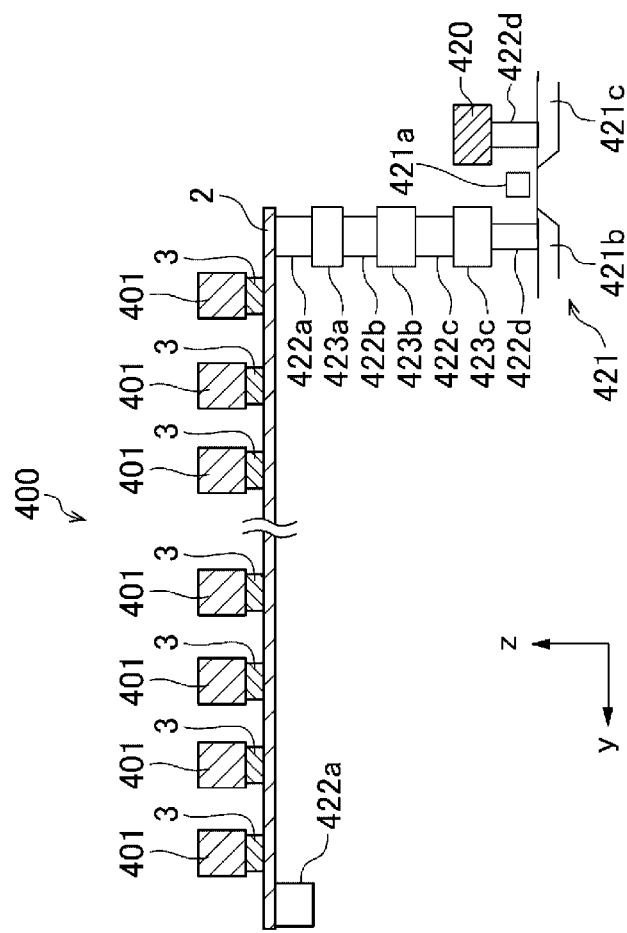
FIG. 12A is a schematic view illustrating an overall configuration of a magnetic memory device using a magnetoresistive element of the invention.
Figure 12B:
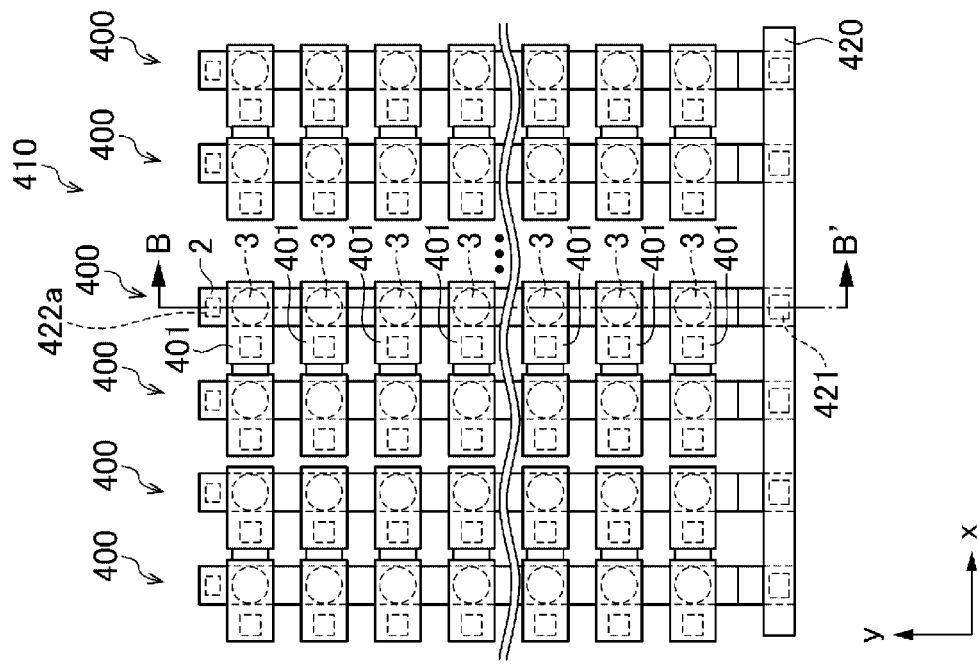
FIG. 12B is a B-B' sectional view when a magnetoresistive element array is cut along B-B' of FIG. 12A.

Such a magnetic memory device 410 will be described in detail, with reference to FIG. 12A and FIG. 12B. FIG. 12A is a schematic view illustrating the overall configuration of the magnetic memory device 410, and FIG. 12B is a B-B' sectional view of FIG. 12A. In the magnetic memory device 410, the plurality of magnetoresistive element arrays 400 are disposed in parallel, and one end of the heavy metal layer 2 of each of the magnetoresistive element arrays 400 is connected to the control line 420 through the transistor 421. The transistor 421 is an FET type transistor, a drain 412b is connected to the heavy metal layer 2, and a source 412c is connected to the control line 420. In addition, the other end of the heavy metal layer 2 is connected to the ground (not illustrated) through a through hole 422 or the like. In practice, as illustrated in FIG. 12B, the transistor 421 is provided on the lower layer from the heavy metal layer 2, and the heavy metal layer 2 is connected to a drain 421b of the transistor 421 through through holes 422a, 422b, 422c, and 422d and metal electrode layers 423a, 423b, and 423c, provided on an interlayer insulating film (not illustrated). The control line 420 is connected to a source 421c of the transistor 421 through the through hole 422d. Then, a voltage is applied to a gate 421a of the transistor 421, and thus, as described below, the write current Iw is applied between one end portion and the other end portion of the heavy metal layer 2 along the longitudinal direction of the heavy metal layer 2.

The control line 420 is set to the Low level that is lower than the ground, and thus, the write current Iw is applied to the heavy metal layer 2 in the −y direction, and the control line 420 is set to the High level that is higher than the ground, and thus, the write current Iw is applied to the heavy metal layer 2 in the +y direction. An electrode 401 is formed on the junction portion 3. The assist line AL (not illustrated) is connected to the electrode 401, and for example, the assist line AL is set to the High level that is higher than the control line 420, and thus, the read current Ire and the write auxiliary current Iwa are applied to the junction portion 3 from the electrode 401.

In the magnetic memory device 410, a voltage is applied to the gate 421a of a predetermined transistor 421, and thus, the heavy metal layer 2 of the magnetoresistive element array 400 to which the write current Iw is applied is selected, a direction in which the write current Iw is applied is selected in accordance with whether the bit line is set to the High level or the Low level by the control line 420, and the junction portion 3 to which the write auxiliary current Iwa is applied is selected, and therefore, the magnetization of only the recording layer of a predetermined junction portion 3 can be reversed. On the other hand, the assist line AL is set to the High level by the control line 420, and thus, the read current Ire is applied to the junction portion 3 from the control line 420 through the heavy metal layer 2, and therefore, it is possible to read the data stored for each junction portion 3, that is, each bit.

In the memory device described above, in order to read the data for each bit, it takes time to read the data. Therefore, hereinafter, a magnetic memory device in which the data can be read more quickly will be described by using a case where the sign of the spin hall angle of the heavy metal layer 2 is negative will, as an example.

Figure 13A:
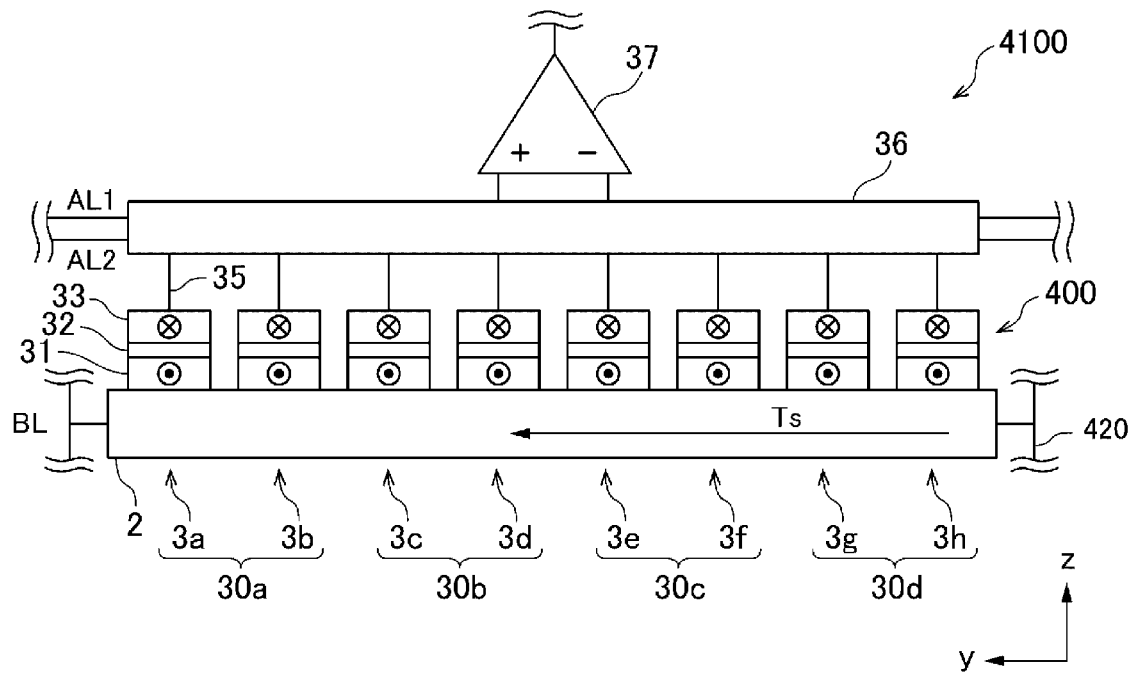
FIG. 13A and FIG. 13B are schematic views describing a write method of a magnetic memory device.
Figure 13B:
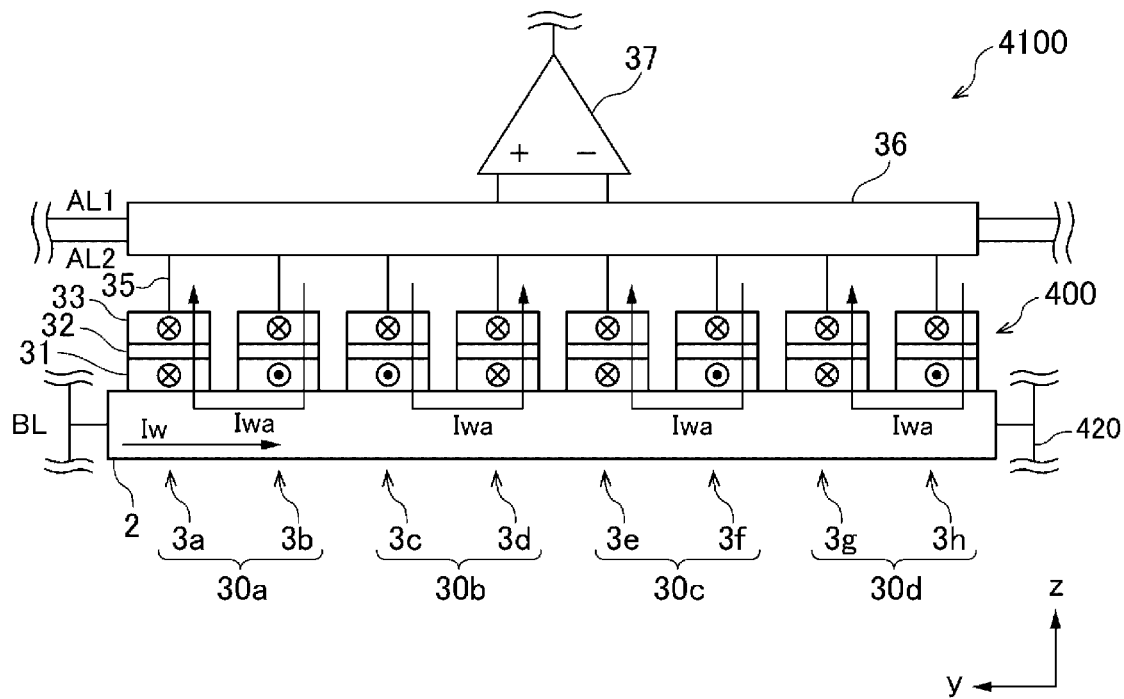

A magnetic memory device 4100 illustrated in FIGS. 13A and 13B in which the same reference numerals are applied to the same configuration as those of FIG. 11A and FIG. 12A includes the magnetoresistive element array 400 including a plurality of junction portions 3a, 3b, 3c, 3d, 3e, 3f, 3g, and 3h (also referred to as a bit) on the heavy metal layer 2, a bit selector 36, and a difference amplifier 37. In FIG. 13A and FIG. 13B, for convenience, one magnetoresistive element array 400 is illustrated, but the magnetic memory device 4100 includes a plurality of magnetoresistive element arrays 400, and the bit selector 36 and the difference amplifier 37, connected to each of the magnetoresistive element arrays 400. In addition, the junction portions 3a, 3b, 3c, 3d, 3e, 3f, 3g, and 3h provided on the magnetoresistive element arrays 400 have different signs, for the sake of convenience, but have the same configuration. Note that, the number of junction portions provided on the heavy metal layer 2 is not particularly limited. In addition, the junction portions 51, 52, 53, 54, 55, 56, 57, 58, and 59 described above may be used as the junction portion that is used in such a magnetic memory device 4100, instead of the junction portion 3. Further, the junction portion of the magnetic memory device 4100 is not particularly limited insofar as the junction portion is a magnetic tunnel junction including a recording layer that can be subjected to magnetization reversal, a barrier layer, and a reference layer having a fixed magnetization direction, and the ferromagnetic layer of the recording layer and the reference layer may be magnetized in the in-plane direction by the other magnetic anisotropy such as the magnetic shape anisotropy or may be magnetized in a direction perpendicular to the in-plane direction by the interface magnetic anisotropy or the like.

In the heavy metal layer 2, one end is connected to the bit line BL and the other end is connected to the control line 420. In the heavy metal layer 2, a reset current Is for resetting data of each bit (for aligning the magnetization direction of each recording layer 31 in a predetermined direction) or the write current Iw is applied to the control line 420 from the bit line BL or to the bit line BL from the control line 420, that is, between one end portion and the other end portion of the heavy metal layer 2, in accordance with a voltage level of the bit line BL and the control line 420. The bit selector 36 is connected to each of the junction portions 3a, 3b, 3c, 3d, 3e, 3f, 3g, and 3h through an assist line AL1, an assist line AL2, the difference amplifier 37, and wiring 35. The magnetization direction of the reference layer 33 of the junction portions 3a, 3b, 3c, 3d, 3e, 3f, 3g, and 3h is aligned in the +x direction (a direction directed to the deep side of the paper from the near side of the paper of FIG. 13A).

Figure 14:
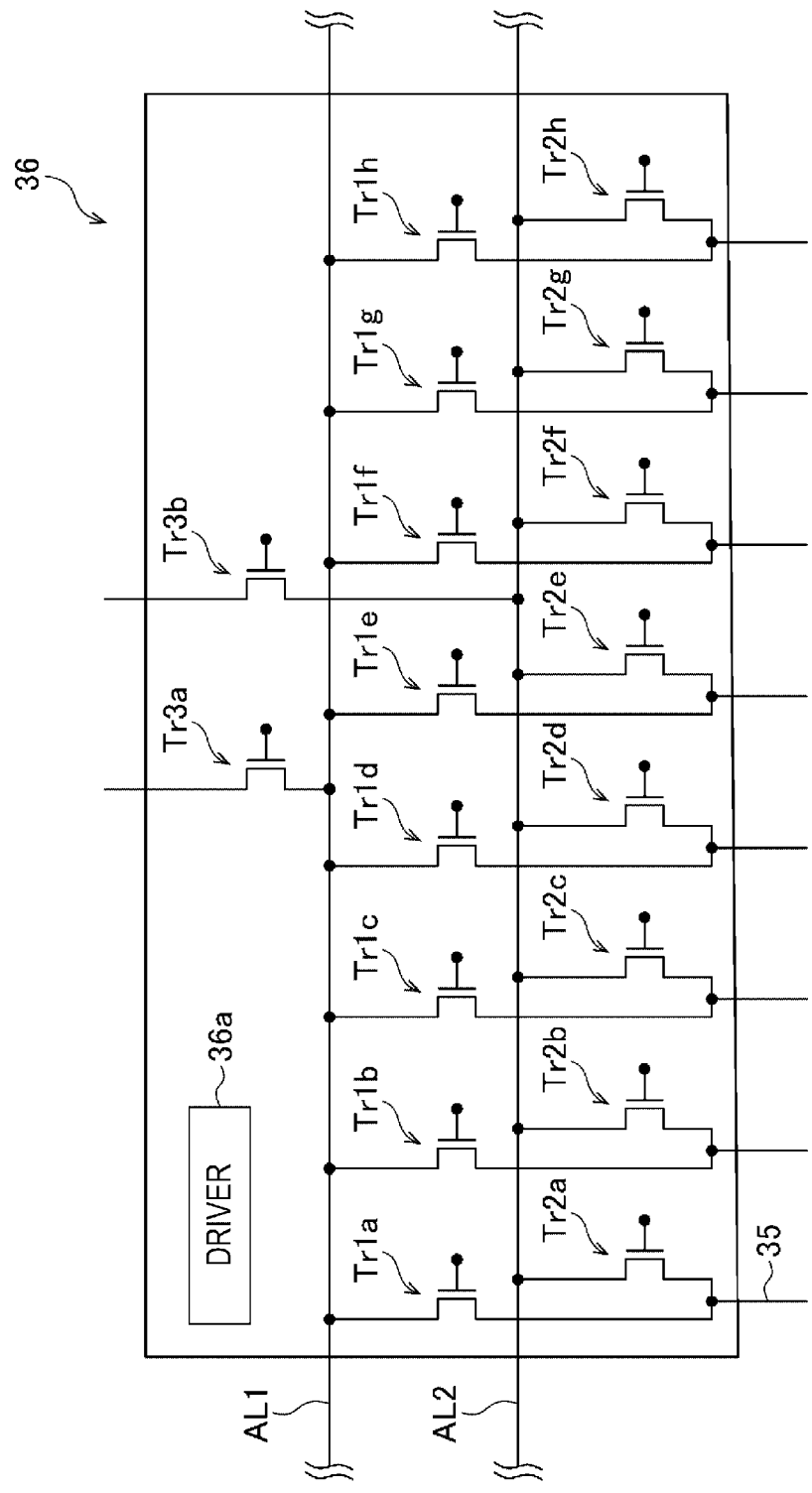
FIG. 14 is a schematic view illustrating an example of a configuration of a bit selector.

The bit selector 36 selects a junction portion that is electrically connected to the assist line AL1 and a junction portion that is electrically connected to the assist line AL2. As illustrated in FIG. 14, the bit selector 36 includes first transistors Tr1a, Tr1b, Tr1c, Tr1d, Tr1e, Tr1f, Tr1g, and Tr1h, second transistors Tr2a, Tr2b, Tr2c, Tr2d, Tr2e, Tr2f, Tr2g, and Tr2h, third transistors Tr3a and Tr3b, and a driver 36a controlling an on state (a state in which a current can be applied) and an off state (a state in which a current is not applied) of such transistors. In this embodiment, all of the transistors are an FET type transistor, but are not particularly limited insofar as the transistors are an element that is capable of switching the on state and the off state.

In the first transistors Tr1a, Tr1b, Tr1c, Tr1d, Tr1e, Tr1f, Tr1g, and Tr1h, the assist line AL1 is connected to a source side. Similarly, in the second transistors Tr2a, Tr2b, Tr2c, Tr2d, Tr2e, Tr2f, Tr2g, and Tr2h, the assist line AL2 is connected to a source side. Then, a drain side of the first transistor Tr1a and a drain side of the second transistor Tr2a are subjected to wire connection, and thus, are connected to the junction portion 3a through the wiring 35.

Similarly, a drain side of the first transistor Tr1b and a drain side of the second transistor Tr2b are subjected to wire connection, and thus, are connected to the junction portion 3b, a drain side of the first transistor Tr1c and a drain side of the second transistor Tr2c are subjected to wire connection, and thus, are connected to the junction portion 3c, and a drain side of the first transistor Tr1d and a drain side of the second transistor Tr2d are subjected to wire connection, and thus, are connected to the junction portion 3d. Then, a drain side of the first transistor Tr1e and a drain side of the second transistor Tr2e are subjected to wire connection, and thus, are connected to the junction portion 3e, and a drain side of the first transistor Tr1f and a drain side of the second transistor Tr2f are subjected to wire connection, and thus, are connected to the junction portion 3f. In addition, a drain side of the first transistor Tr1g and a drain side of the second transistor Tr2g are subjected to wire connection, and thus, are connected to the junction portion 3g, and a drain side of the first transistor Tr1h and a drain side of the second transistor Tr2h are subjected to wire connection, and thus, are connected to the junction portion 3h.

As described above, the bit selector 36 sets the first transistors Tr1a, Tr1b, Tr1c, Tr1d, Tr1e, Tr1f, Tr1g, and Tr1h to be in the on state, and thus, is capable of electrically connecting the junction portions 3a, 3b, 3c, 3d, 3e, 3f, 3g, and 3h to the assist line AL1. Similarly, the bit selector 36 sets the second transistors Tr2a, Tr2b, Tr2c, Tr2d, Tr2e, Tr2f, Tr2g, and Tr2h to be in the on state, and thus, is capable of electrically connecting the junction portions 3a, 3b, 3c, 3d, 3e, 3f, 3g, and 3h to the assist line AL2.

In the third transistor Tr3a, the assist line AL1 is connected to a drain side, and a plus terminal of the difference amplifier 37 is connected to a source side, and in the on state, the plus terminal of the difference amplifier 37 is electrically connected to the assist line AL1. In the third transistor Tr3b, the assist line AL2 is connected to the drain side, and a minus terminal of the difference amplifier 37 is connected to the source side, and in the off state, the minus terminal of the difference amplifier 37 is electrically connected to the assist line AL2. The driver 36a is connected to a gate of each transistor by wiring (not illustrated), and the transistor is set to be in the on state from the off state by applying a voltage to the gate.

For example, the bit selector 36 sets the first transistor Tr1a to be in the on state and sets the second transistor Tr2a to be in the off state, and thus, is capable of selecting the junction portion 3a as a junction that is electrically connected to the assist line AL1. Similarly, the bit selector 36 sets the first transistor Tr1b to be in the off state and sets the second transistor Tr2b to be in the on state, and thus, is capable of selecting the junction portion 3b as a junction portion that is electrically connected to the assist line AL2. At this time, in a case where the assist line AL1 is set to the High level, and the assist line AL2 is set to the Low level, a current is applied in the order of the junction portion 3a, the heavy metal layer 2, the junction portion 3b, and the assist line AL2, from the assist line AL1, and thus, the write auxiliary current Iwa can be applied to the junction portion 3a and junction portion 3b. The write auxiliary current Iwa is applied from the reference layer of one junction portion that is electrically connected to the assist line AL1 toward the reference layer of the other junction portion that is electrically connected to the assist line AL2 through the heavy metal layer 2. As described above, in the magnetic memory device 4100, the write auxiliary current Iwa can be applied to a junction portion that is electrically connected to the assist line A12 from the junction portion that is electrically connected to the assist line AL1 or a reverse direction thereof.

In the magnetic memory device 4100, the write auxiliary current Iwa is applied to two junction portions, and thus, the write current Iw and the write auxiliary current Iwa are applied to the heavy metal layer 2, and therefore, it is possible to simultaneously write data in two junction portions. As described above, the magnetic memory device 4100 performs write with respect to two junction portion as a set.

Figure 15A:
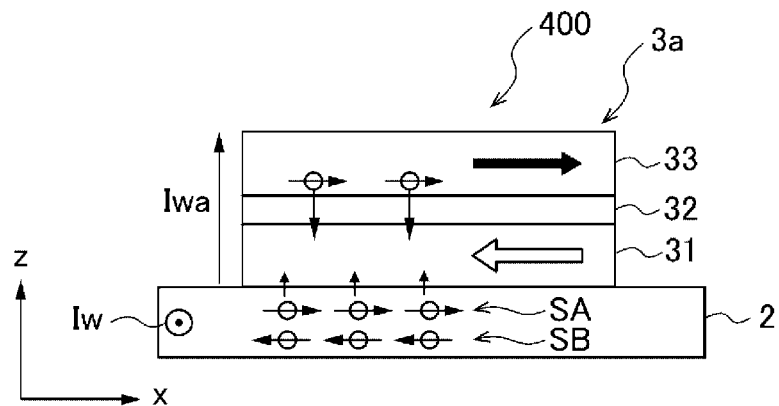
FIG. 15A is a diagram illustrating an example in a case where it is possible to assist magnetization reversal by a write auxiliary current.
Figure 15B:
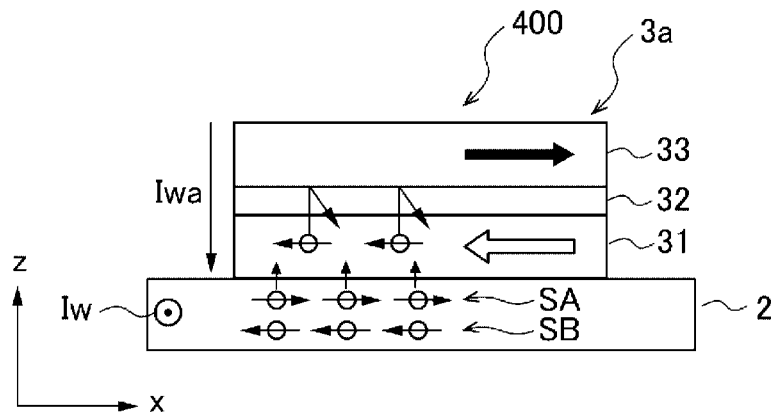
FIG. 15B is a diagram illustrating an example in a case where it is not possible to assist the magnetization reversal by the write auxiliary current.
Figure 16:
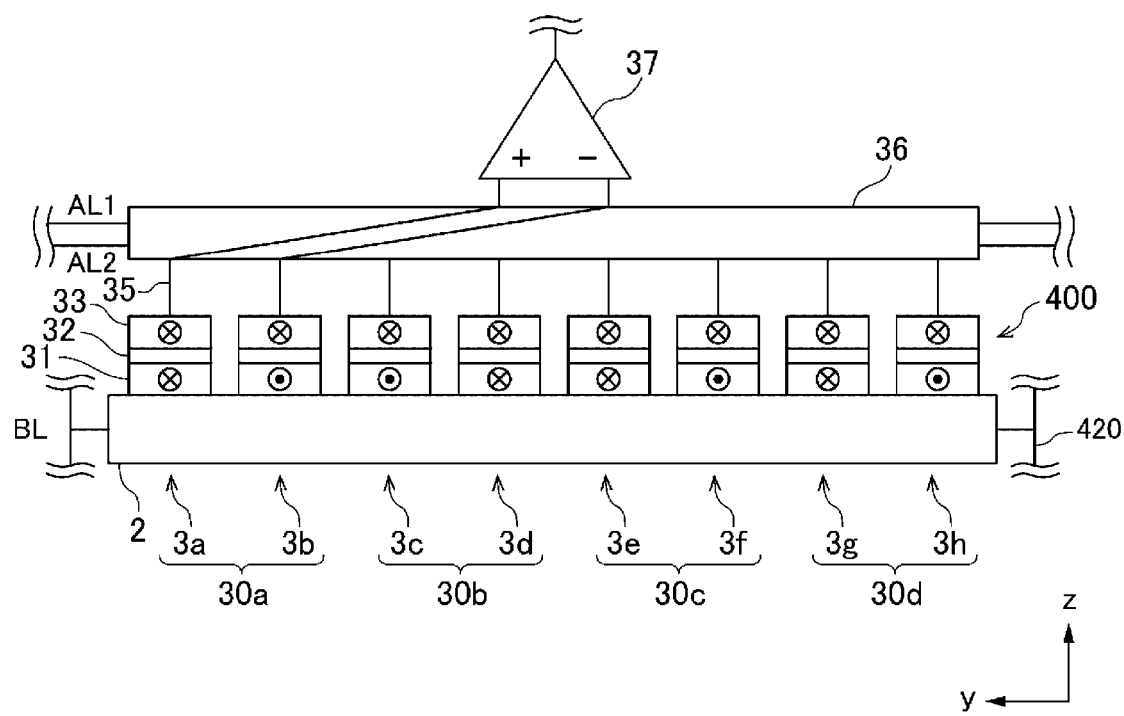
FIG. 16 is a schematic view describing a read method of a magnetic memory device.

Here, in the write auxiliary current Iwa, the magnetization reversal may be assisted or the magnetization reversal may not be assisted in accordance with a direction in which the write auxiliary current Iwa is applied to the junction portion. This will be described by using FIGS. 15A and 15B in which the same reference numerals are applied to the same configurations as those of FIG. 13A and FIG. 13B. FIGS. 15A and 15B are sectional views in a case where the junction portion 3a of the magnetoresistive element array 400 is cut in the y direction. FIG. 15A illustrates a state in which the write current Iw is applied to the heavy metal layer 2 in the −y direction (a direction directed to the near side of the paper from the deep side of the paper), and the write auxiliary current Iwa is applied to the junction portion 3a, in a direction toward the reference layer 33 from the heavy metal layer 2, in order to set the junction portion 3a in the anti-parallel state to be in the parallel state. At this time, the spin hall effect occurs in the heavy metal layer 2 by the write current Iw, and the spin SA that is antiparallel to the magnetization direction of the recording layer 31 flows into the recording layer 31. The spin SA acts to reverse the magnetization direction of the recording layer 31.

The write auxiliary current Iwa is applied to the reference layer 33 from the heavy metal layer 2, and thus, an electron is applied to the recording layer 31 from the reference layer 33, and the spin that is antiparallel to the magnetization direction of the recording layer 31 flows into the recording layer 31 from the reference layer 33. The spin that flows into the recording layer 31 by the write auxiliary current Iwa is antiparallel to the magnetization direction of the recording layer 31, and thus, the torque acts to reverse the magnetization direction of the recording layer 31. As described above, in a case where the junction portion 3a is in the anti-parallel state, and the write auxiliary current Iwa is applied to the reference layer 33 from the heavy metal layer 2, the write auxiliary current Iwa acts to assist the magnetization reversal of the recording layer 31.

On the other hand, FIG. 15B illustrates a state in which the write current Iw is applied to the heavy metal layer 2 in the −y direction (a direction directed to the near side of the paper from the deep side of the paper), and the write auxiliary current Iwa is applied to the junction portion 3a in a direction toward the heavy metal layer 2 from the reference layer 33. In this case, the spin hall effect occurs in the heavy metal layer 2 by the write current Iw, and the spin SA that is antiparallel to the magnetization direction of the recording layer 31 flows into the recording layer 31. The spin SA acts to reverse the magnetization direction of the recording layer 31. The write auxiliary current Iwa is applied to the heavy metal layer 2 from the reference layer 33, and thus, an electron is applied to the reference layer 33 from the recording layer 31. At this time, the spin in the recording layer 31, which is parallel to the magnetization direction of the reference layer 33, flows into the reference layer 33, but the spin in the recording layer 31, which is antiparallel to the magnetization direction of the reference layer 33 in the recording layer 31, scatters on the interface between the barrier layer 32 and the reference layer 33, and flows again into the recording layer 31.

The spin that flows into the recording layer 31 by the write auxiliary current Iwa is the spin that is parallel to the magnetization direction of the recording layer 31, and thus, the torque is not generated in the magnetization of the recording layer 31 by the spin, and the magnetization reversal of the recording layer 31 is not assisted. Further, the spin that flows into the recording layer 31 by the write auxiliary current Iwa suppresses the rotation of the magnetization due to the spin that flows by the write current Iw, and acts to assist the magnetization reversal not to be performed. As a result thereof, the magnetization of the recording layer is not reversed. As described above, when the magnetization direction of the junction portion 3a is antiparallel, in a case where the write auxiliary current Iwa is applied to the reference layer 33 from the heavy metal layer 2, the magnetization reversal of the recording layer 31 is assisted, and the magnetization direction of the recording layer 31 is reversed, and in a case where the write auxiliary current Iwa is applied to the heavy metal layer 2 from the reference layer 33, the magnetization reversal is not assisted (the magnetization is assisted not to be reversed), and the magnetization direction of the recording layer 31 is not reversed. Note that, when the magnetization direction of the recording layer 31 and the magnetization direction of the reference layer 33 are parallel to each other, in a case where the write auxiliary current Iwa is applied to the heavy metal layer 2 from the reference layer 33, the magnetization reversal of the recording layer 31 is assisted, and in a case where the write auxiliary current Iwa is applied to the reference layer 33 from the heavy metal layer 2, the magnetization reversal of the recording layer 31 is not assisted.

In the magnetic memory device 4100, two junction portions (for example, the junction portions 3a and 3b) are selected, the write auxiliary current Iwa is applied from the reference layer 33 of one junction portion 3b toward the reference layer 33 of the other junction portion 3a through the heavy metal layer 2, and thus, write is performed with respect to two junction portions 3a and 3b as a set. For this reason, in one junction portion 3b, the write auxiliary current Iwa is applied to the heavy metal layer 2 from the reference layer 33, and in the other junction portion 3a, the write auxiliary current Iwa is applied to the reference layer 33 from the heavy metal layer 2, and thus, in the junction portions 3a and 3b as a set, a direction in which the write auxiliary current Iwa is applied is different (refer to FIG. 13B).

The bit selector 36 electrically connects the junction portion for reading the data to the difference amplifier 37. For example, the bit selector 36 sets the first transistor Tr1a to be in the on state, and sets the other first transistors Tr1b, Tr1c, Tr1d, Tr1e, Tr1f, Tr1g, and Tr1h to be in the off state, and thus, electrically connects the junction portion 3a to the assist line AL1. Then, the bit selector 36 sets the second transistor Tr2b to be in the on state, and sets the other second transistors Tr2a, Tr2c, Tr2d, Tr2e, Tr2f, Tr2g, and Tr2h to be in the off state, and thus, electrically connects the junction portion 3b to the assist line AL2. Subsequently, the bit selector 36 simultaneously sets the third transistors Tr3a and Tr3b to be in the on state, electrically connects the plus terminal of the difference amplifier 37 to the assist line AL1, and electrically connects the minus terminal of the difference amplifier 37 to the assist line AL2. As a result thereof, as the junction portion for reading data, the junction portion 3a is electrically connected to the plus terminal of the difference amplifier 37, and the junction portion 3b is electrically connected to the minus terminal of the difference amplifier 37. As described above, two junction portions 3a and 3b are selected from the plurality of junction portions 3a, 3b, 3c, 3d, 3e, 3f, 3g, and 3h, and two selected junction portions 3a and 3b are connected to the difference amplifier 37.

At this time, the bit line BL is set to the High level. Then, a current is applied to the plus terminal of the difference amplifier 37 from the heavy metal layer 2 through the junction portion 3a, and a current is applied to the minus terminal of the difference amplifier 37 from the heavy metal layer 2 through the junction portion 3b. As a result thereof, the difference amplifier 37 outputs a voltage based on a difference between a current that is input into the plus terminal and a current that is input into the minus terminal, that is, a voltage according to a resistance difference between the junction portion 3a and the junction portion 3b that are selected from the magnetoresistive element array. On the basis of such an output voltage, the resistance difference between the junction portion 3a and the junction portion 3b can be detected, whether the junction portion 3a and the junction portion 3b are in the parallel state or in the anti-parallel state can be determined, and the data stored in the junction portion 3a and the junction portion 3b can be read. As described above, in the magnetic memory device 4100, two bits are simultaneously read by using the difference amplifier 37, and thus, it is possible to read the data more quickly, compared to the case of reading each bit. Note that, the configuration of the bit selector 36 is an example, and is not particularly limited insofar as the junction portion that is connected to the assist line AL1, the assist line AL2, and the difference amplifier can be selected.

In such a magnetic memory device 4100, the data "0" corresponds to the parallel state, and the data corresponds to the anti-parallel state, by using the fact that the resistance value of the junction portion is different between the anti-parallel state in which the magnetization directions of the recording layer and the reference layer of the junction portion are antiparallel to each other and the parallel state in which the magnetization directions are parallel to each other, and thus, the data is stored in accordance with the resistance value of the junction portion. The magnetic memory device 4100 performs write and read with respect to two junction portions as a set. Note that, it is desirable that the adjacent junction portions are formed as a set. As described above, the write auxiliary current Iwa can be applied to all of the paired junction portions, and thus, write can be collectively performed with respect to each of the junction portions 3a, 3b, 3c, 3d, 3e, 3f, 3g, and 3h of the magnetoresistive element array 400.

A write operation and a read operation of data of such a magnetic memory device 4100 will be described in detail. At this time, the junction portion 3a and the junction portion 3b, which are adjacent to each other, are set to a junction portion pair 30a, the junction portion 3c and the junction portion 3d are set to a junction portion pair 30b, the junction portion 3e and the junction portion 3f are set to a junction portion pair 30c, and the junction portion 3g and the junction portion 3h are set to a junction portion pair 30d, and thus, the data is written and read by using each of the junction portions 3a, 3b, 3c, 3d, 3e, 3f, 3g, and 3h as a set.

First, as illustrated in FIG. 13A, the control line 420 is set to the High level, and the bit line BL is set to the Low level, and thus, the reset current Is is applied to the heavy metal layer 2 in the +y direction. The reset current Is is set to a size in which the magnetization of the recording layer 31 of each of the junction portions 3a, 3b, 3c, 3d, 3e, 3f, 3g, and 3h can be reversed only by the reset current Is. For this reason, in the magnetization of the recording layer 31 of the junction portions 3a, 3b, 3c, 3d, 3e, 3f, 3g, and 3h, the magnetization that is not directed to the −x direction (a direction directed to the near side of the paper from the deep side of the paper of FIG. 13A) is reversed, the magnetization direction of the recording layer 31 is aligned in the −x direction (a predetermined direction), all of the junction portions 3a, 3b, 3c, 3d, 3e, 3f, 3g, and 3h are in the anti-parallel state, and the data "1" is recorded in all bits. As described above, in a case where the reset current Is is applied between one end portion and the other end portion of the heavy metal layer 2, the magnetization direction of the recording layer 31 of each of the junction portions 3a, 3b, 3c, 3d, 3e, 3f, 3g, and 3h is aligned in a predetermined direction, and all bits are in the anti-parallel state and the data "1" is recorded, and thus, the magnetoresistive element array 400 is initialized. At this time, the reset current Is may be applied in the −y direction, all of the junction portions 3a, 3b, 3c, 3d, 3e, 3f, 3g, and 3h may be in the parallel state, that is, in a state where the data "0" is recorded, and thus, the magnetoresistive element array 400 may be initialized.

Next, the bit selector 36 electrically connects the junction portions 3b, 3c, 3f, and 3h to the assist line AL1, and electrically connects the junction portions 3a, 3d, 3e, and 3g to the assist line AL2. That is, one junction portion of each of the junction portion pairs 30a, 30b, 30c, and 30d is electrically connected to the assist line AL1, and the other junction portion is electrically connected to the assist line AL2.

Subsequently, as illustrated in FIG. 13B, the bit line BL is set to the High level, the control line 420 is set to the Low level, the write current Iw is applied between one end portion and the other end portion of the heavy metal layer 2 in the −y direction, the assist line AL1 is set to the High level, and the assist line AL2 is set to the Low level, and thus, the write auxiliary current Iwa is applied to each of the junction portions. The write current Iw is set to a size in which the magnetization reversal of the recording layer 31 is not caused only by the write current Iw. At this time, in the junction portion pair 30a, the junction portion 3b is electrically connected to the assist line AL1, and the junction portion 3a is electrically connected to the assist line AL2, and thus, the write auxiliary current Iwa is applied to the junction portion 3a from the junction portion 3b. For this reason, in the junction portion 3b, the write auxiliary current Iwa is applied to the recording layer 31 from the reference layer 33, the spin torque generated by the write auxiliary current Iwa acts to maintain the magnetization direction of the recording layer 31, and thus, the magnetization reversal of the recording layer 31 is not assisted, and the magnetization reversal is not caused. As a result thereof, in the junction portion 3b, a state in which the data "1" is stored is maintained, that is, the data "1" is written. On the other hand, in the junction portion 3a, the write auxiliary current Iwa is applied to the reference layer 33 from the recording layer 31, and thus, the magnetization reversal of the recording layer 31 is assisted. As a result thereof, in the junction portion 3a, the recording layer 31 is subjected to magnetization reversal, and is in the parallel state, and thus, the data "0" is written. As described above, in a state in which the magnetization direction of the recording layer 31 of each of the junction portions 3a, 3b, 3c, 3d, 3e, 3f, 3g, and 3h is aligned in a predetermined direction, in a case where the write current Iw is applied between one end portion and the other end portion of the heavy metal layer 2, and the write auxiliary current Iwa is applied from the reference layer 33 of one junction portion 3b to the reference layer of the other junction portion 3a through the heavy metal layer 2, the recording layer 31 of any one of two junction portions 3a and 3b to which the write auxiliary current Iwa is applied (here, the junction portion 3a) is subjected to magnetization reversal.

Similarly, in the junction portion pair 30b, the write auxiliary current Iwa is applied to the junction portion 3d from the junction portion 3c, and thus, the data "0" is written in the junction portion 3d, and the data "1" is written in the junction portion 3c. In the junction portion pair 30c, the write auxiliary current Iwa is applied to the junction portion 3e from the junction portion 3f, and thus, the data "0" is written in the junction portion 3e, and the data "1" is written in the junction portion 3f. In the junction portion pair 30d, the write auxiliary current Iwa is applied to the junction portion 3g from the junction portion 3h, and thus, the data "0" is written in the junction portion 3g, and the data "1" is written in the junction portion 3h. As described above, data can be collectively written in each of the junction portions 3a, 3b, 3c, 3d, 3e, 3f, 3g, and 3h of the magnetoresistive element array 400. At this time, it is desirable that the write current Iw (the pulse current) is applied to the heavy metal layer 2, the write auxiliary current (the pulse current) is applied from the reference layer 33 of one junction portion to the reference layer 33 of the other junction portion through the heavy metal layer 2, and the recording layer 31 is subjected to magnetization reversal, and then, the write auxiliary current Iwa is turned off after the write current Iw that is applied to the heavy metal layer 2. Note that, it is effective to form two junction portions that are adjacent to each other as a junction portion pair, but two junction portion separated by one or two junction portions may be set as a junction portion pair, and the write auxiliary current may be applied between the junction portions.

In the magnetic memory device 4100, the magnetization direction of the recording layer 31 of each of the junction portions 3a, 3b, 3c, 3d, 3e, 3f, 3g, and 3h of the magnetoresistive element array 400 is aligned in a predetermined direction by applying the reset current Is, and the initialization is performed, and then, the write auxiliary current Iwa is applied to each of the junction portion pairs 30a, 30b, 30c, and 30d, that is, from the reference layer 33 of one junction portion toward the reference layer 33 of the other junction portion through the heavy metal layer 2, and write is performed with respect to two junction portions of the junction portion pairs 30a, 30b, 30c, and 30d as a set. Then, as described above, in the junction portions as a set, a direction in which the write auxiliary current Iwa is applied is different. For this reason, in the magnetic memory device 4100, the magnetization reversal of one junction portion of the junction portion pair is assisted by the write auxiliary current Iwa, and the recording layer 31 is subjected to magnetization reversal, and the magnetization reversal of the other junction portion is assisted by the write auxiliary current Iwa not to be caused, and the recording layer 31 is not subjected to magnetization reversal. Accordingly, in the magnetic memory device 4100, the data "0" and the data "1" can be reliably written in each of the junction portion pairs 30a, 30b, 30c, and 30d.

Subsequently, a read operation of the magnetic memory device 4100 will be described with reference to FIG. 14 in which the same reference numerals are applied to the same configurations as those of FIG. 13A. First, the bit selector 36, for example, electrically connects the junction portion 3a to the plus terminal of the difference amplifier 37, and electrically connects the junction portion 3b to the minus terminal of the difference amplifier 37. At this time, the bit selector 36 selects one junction portion pair, electrically connects one junction portion of the selected junction portion pair to the plus terminal of the difference amplifier 37, and electrically connects the other junction portion to the minus terminal of the difference amplifier.

Next, the bit line BL is set to the High level, a current is input into the plus terminal the of the difference amplifier 37 from the heavy metal layer 2 through the junction portion 3a, and a current is input into the minus terminal of the difference amplifier 37 from the heavy metal layer 2 through the junction portion 3b. The difference amplifier 37 outputs a voltage based on a difference between the current that is input into the plus terminal and is applied to the junction portion 3a (one junction portion) and the current that is input into the minus terminal and is applied to the junction portion 3b (the other junction portion). Whether the junction portion 3a and the junction portion 3b are in the parallel state or in the anti-parallel state is determined from the output voltage of the difference amplifier 37, and the data stored in the junction portion 3a and the junction portion 3b is read. In this embodiment, the data "0" can be read from the junction portion 3a, and the data "1" can be read from the junction portion 3b. After that, the bit selector 36 sequentially electrically connects the junction portion to the difference amplifier 37, and the data stored in each of the junction portions 3a, 3b, 3c, 3d, 3e, 3f, 3g, and 3h is read on the basis of the output voltage of the difference amplifier 37. As described above, the data stored in a plurality of junction portions (bits) is simultaneously read, and thus, the data can be read more quickly, compared to the related art.

At this time, two difference amplifiers 37 may be prepared, and the data may be read for every four bits, or the difference amplifier 37 dedicated for each of the junction portion pairs 30a, 30b, 30c, and 30d may be prepared, and the data stored in the magnetoresistive element array 400 may be collectively read. In addition, it is desirable to electrically connect two junction portions belonging to one junction portion pair to the same difference amplifier 37, from the viewpoint of efficiently reading the data, but one junction portion belonging to one junction portion pair and one junction portion belonging to the other junction portion pair can be simultaneously electrically connected to the difference amplifier 37, and thus, the stored data can be read.

The writing and reading method for a magnetic memory device has been described by using the magnetic memory device 4100 including the plurality of magnetoresistive element arrays 400 in which the plurality of junction portions 3 are provided on the heavy metal layer 2, but can also be applied to a magnetic memory device including a magnetoresistive element array in which a plurality of other junction portions 51, 52, 53, 54, 55, 56, 57, 58, and 59 described above are provided on the heavy metal layer 2, and the same effects are obtained. In addition, even in a case where the writing and reading method is applied to a magnetoresistive element array in which a plurality of junction portions including the recording layer and the reference layer that are magnetized in the in-plane direction by the other magnetic anisotropy such as the magnetic shape anisotropy are provided on the heavy metal layer 2 or a magnetic memory device including a magnetoresistive element array in which a plurality of junction portions including the recording layer and the reference layer that are magnetized in a direction perpendicular to the in-plane direction are provided on the heavy metal layer 2, the same effects are obtained. In addition, in the writing and reading method for a magnetic memory device, in the case of using a magnetoresistive element array including a junction portion in which the recording layer and the reference layer are magnetized in the perpendicular direction, the recording layer of each of the junction portions is set to an epitaxial layer and is magnetized in the perpendicular direction, but has the in-plane magnetic anisotropy due to the fact that the recording layer is an epitaxial layer, the junction portion is disposed such that the direction of the in-plane magnetic anisotropy of the recording layer and the longitudinal direction of the heavy metal layer 2 (the first direction) are approximately parallel to each other, and the write current Iw is applied to the heavy metal layer 2 in the direction of the in-plane magnetic anisotropy of the recording layer, and thus, the recording layer can be subjected to magnetization reversal in a non-magnetic field, in accordance with the in-plane magnetic anisotropy due to the epitaxial layer.

In the configuration described above, the writing and reading method for a magnetic memory device includes a reset step of applying the reset current Is to the heavy metal layer 2 and of aligning the magnetization direction of the recording layer 31 of each of the junction portions 3a, 3b, 3c, 3d, 3e, 3f, 3g, and 3h in a predetermined direction, a write step of applying the write current Iw to the heavy metal layer 2 and of applying the write auxiliary current Iwa from the reference layer 33 of one junction portion toward the reference layer 33 of the other junction portion 3 through the heavy metal layer 2, and a read step of reading the data stored in one junction portion and the other junction portion, on the basis of a difference between a current to be applied to one junction portion and a current to be applied to the other junction portion.

Accordingly, in the writing and reading method for a magnetic memory device, it is possible to simultaneously read the data stored in two junction portions, and thus, to read the data more quickly, compared to the related art.

In the write step, the write auxiliary current Iwa is applied from one junction portion to the other junction portion adjacent to the one junction portion, and thus, it is possible to collectively write the data in each of the junction portions 3a, 3b, 3c, 3d, 3e, 3f, 3g, and 3h formed on the heavy metal layer 2.

(5) Other Embodiments

In the embodiments described above, a case has been described in which the junction portion 3 is provided on the heavy metal layer 2 such that the easy magnetization direction of the recording layer 31 (in a case where the recording layer is a multi-layer film, each of the ferromagnetic layers) is approximately orthogonal to the longitudinal direction of the heavy metal layer 2 (the direction in which the write current Iw is applied) when the magnetoresistive element 1 is seen from the upper portion, but the invention is not limited thereto. For example, as with a magnetoresistive element 600 illustrated in FIG. 17A, a junction portion 3j may be provided on the heavy metal layer 2 such that the easy magnetization direction of the recording layer 31 (an arrow A600 in FIG. 17A) is approximately the longitudinal direction of the heavy metal layer 2. In this case, the magnetic field generating device is provided in the lower portion of the magnetoresistive element 1, and thus, a magnetic field is applied in a direction perpendicular to the heavy metal layer 2 (the +z direction). In the magnetoresistive element 600, the junction portion 3j has a columnar shape, and the width of the heavy metal layer 2 is identical to the width of the junction portion 3j. Note that, the configuration other than the shape of the junction portion 3j is identical to that of the junction portion 3. As described above, the size of the heavy metal layer 2 or the sectional shape of the junction portion 3j in the width direction is not particularly limited.

As with a magnetoresistive element 700 illustrated in FIG. 17B, the junction portion 3 may be provided on the heavy metal layer 2 such that the easy magnetization direction of the recording layer 31 (an arrow A700 in FIG. 17B) is inclined with respect to the longitudinal direction of the heavy metal layer 2 by a predetermined angle θ. In this case, θ is ±3 degrees to ±177 degrees, is more preferably ±15 degrees to ±165 degrees, and is even more preferably ±30 to ±150 degrees. By setting the angle as described above, the recording layer of the junction portion 3j can be subjected to magnetization reversal in a non-magnetic field and at a low current. In addition, θ is set to ±3 degrees to ±25 degrees or ±155 degrees to ±177 degrees, and thus, the power consumption increases, but the magnetization reversal of the recording layer of the junction portion 3j can be performed more quickly, and a write speed can be increased. In such a case, the write current Iw is applied between one end portion and the other end portion of the heavy metal layer in a direction identical to the first direction (the longitudinal direction of the heavy metal layer 2). Accordingly, the write current Iw is applied in a direction that is inclined with respect to the magnetization direction of the recording layer by a predetermined angle (±3 degrees to ±177 degrees).

REFERENCE SIGNS LIST 1, 41, 42, 43, 44, 45, 46, 47, 48, 49 Magnetoresistive element
2 Heavy metal layer
31, 31a, 31b, 31c, 31d, 31e, 31f, 31g, 31h, 31i Recording layer
32 Barrier layer
33 Reference layer
34 Antiferromagnetic layer
300, 410, 4100 Magnetic memory device
400 Magnetoresistive element array
Iw Write current
Iwa Write auxiliary current

The invention claimed is:

1. A spin-orbit torque magnetic random access memory (SOT-MRAM) element, comprising:
a heavy metal layer that is an epitaxial layer formed of a monocrystalline; and
a junction portion including a recording layer that is provided on the heavy metal layer and includes a ferromagnetic layer magnetized in an in-plane direction, the ferromagnetic layer is an epitaxial layer formed of a monocrystalline, a barrier layer that is provided on the recording layer and includes an insulating body, and a reference layer that is provided on the barrier layer and has magnetization fixed in the in-plane direction,
wherein
the recording layer is subjected to magnetization reversal by applying a write current to the heavy metal layer, and
the heavy metal layer is an epitaxial layer epitaxially grown on an MgO layer that is oriented in a (100) direction and the heavy metal layer contains Hf, Ta, W, Re, Os, Ir, Pt, Au, Pb, or an alloy containing at least one or more of such elements, or Pd—Rh.

2. The spin-orbit torque magnetic random access memory (SOT-MRAM) element according to claim 1,
wherein a lattice of the MgO layer and a lattice of the heavy metal layer are matched on an interface between the MgO layer and the heavy metal layer.

3. The spin-orbit torque magnetic random access memory (SOT-MRAM) element according to claim 1,
wherein the recording layer is a stacked film in which a ferromagnetic layer and a non-magnetic layer are alternately stacked, and a layer closest to the heavy metal layer side and a layer closest to the barrier layer side are a ferromagnetic layer.

4. The spin-orbit torque magnetic random access memory (SOT-MRAM) element according to claim 3,
wherein the recording layer has an interlayer interaction between the ferromagnetic layers interposing the non-magnetic layer.

5. The spin-orbit torque magnetic random access memory (SOT-MRAM) element according to claim 3,
wherein at least one of the layer closest to the heavy metal layer side and the layer closest to the barrier layer side of the recording layer is thinner than the other ferromagnetic layer of the recording layer.

6. The spin-orbit torque magnetic random access memory (SOT-MRAM) element according to claim 5,
wherein the recording layer is a stacked film in which a first ferromagnetic layer, a first non-magnetic layer, a second ferromagnetic layer, a second non-magnetic layer, and a third ferromagnetic layer are stacked in this order, and the first ferromagnetic layer and the third ferromagnetic layer are thinner than the second ferromagnetic layer.

7. The spin-orbit torque magnetic random access memory (SOT-MRAM) element according to claim 3,
wherein the layer closest to the barrier layer side is an amorphous layer of Co—Fe—B, Fe—B, or Co—B, and
a non-magnetic layer in contact with the amorphous layer contains Ta, W, Mo, or an alloy containing at least one or more of such elements.

8. The spin-orbit torque magnetic random access memory (SOT-MRAM) element according to claim 3,
wherein the non-magnetic layer of the recording layer contains Ir, Rh, Ru, Os, Re, or an alloy containing at least one or more of such elements.

9. The spin-orbit torque magnetic random access memory (SOT-MRAM) element according to claim 6,
wherein a material of the first non-magnetic layer is different from a material of the second non-magnetic layer.

10. The spin-orbit torque magnetic random access memory (SOT-MRAM) element according to claim 1,
wherein an aspect ratio of the junction portion is 1.5 or less.

11. The spin-orbit torque magnetic random access memory (SOT-MRAM) element according to claim 1,
wherein the reference layer is a stacked film having a stacked ferri structure.

12. The spin-orbit torque magnetic random access memory (SOT-MRAM) element according to claim 11,
wherein the reference layer includes a non-magnetic layer containing Ir, Rh, Ru, Os, Re, or an alloy containing at least one or more of such elements.

13. The spin-orbit torque magnetic random access memory (SOT-MRAM) element according to claim 1,
wherein the junction portion includes an antiferromagnetic layer including an antiferromagnetic body, on the reference layer.

14. The spin-orbit torque magnetic random access memory (SOT-MRAM) element according to claim 13,
wherein the antiferromagnetic body is Ir—Mn, Pt—Mn, or Ni—Mn.

15. The spin-orbit torque magnetic random access memory (SOT-MRAM) element according to claim 1,
wherein the heavy metal layer is at least one type of W—Hf, W—Ta, Pt—Au, Pt—Ir, and Pd—Rh.

16. The spin-orbit torque magnetic random access memory (SOT-MRAM) element according to claim 1,
wherein in a case where the write current is applied to the heavy metal layer and a write auxiliary current is applied between the recording layer and the reference layer, the recording layer is subjected to magnetization reversal, and
in the junction portion, the write auxiliary current is applied between the recording layer and the reference layer even after the write current to be applied to the heavy metal layer is turned off.

17. The spin-orbit torque magnetic random access memory (SOT-MRAM) element according to claim 3,
wherein in the junction portion,
when a magnetization direction of the layer closest to the barrier layer side of the recording layer and a magnetization direction of the reference layer are parallel to each other, a write auxiliary current is applied from the reference layer to the layer closest to the barrier layer side of the recording layer, and
when the magnetization direction of the layer closest to the barrier layer side of the recording layer and the magnetization direction of the reference layer are anti-parallel to each other, the write auxiliary current is applied from the layer closest to the barrier layer side of the recording layer to the reference layer.

18. A magnetic memory device, comprising:
the spin-orbit torque magnetic random access memory (SOT-MRAM) element according to claim 1.

19. The magnetic memory device according to claim 18, further comprising:
a magnetoresistive element array including a plurality of magnetoresistive elements, in which the heavy metal layer of one magnetoresistive element is stretched in a first direction, the stretched heavy metal layer is shared by the plurality of other magnetoresistive elements, and the junction portion is arranged in the first direction, on the heavy metal layer; and
a difference amplifier outputting a voltage according to a resistance difference between two junction portions selected from the magnetoresistive element array.

20. The spin-orbit torque magnetic random access memory (SOT-MRAM) element according to claim 1,
wherein the MgO layer is formed on an amorphous metal layer containing a metal including B.

21. The spin-orbit torque magnetic random access memory (SOT-MRAM) element according to claim 20,
wherein the metal including B is Co—Fe—B, Fe—B, or Ta—B.

* * * * *